US010747127B2

(12) United States Patent
Van Der Meulen et al.

(10) Patent No.: US 10,747,127 B2
(45) Date of Patent: *Aug. 18, 2020

(54) LITHOGRAPHIC APPARATUS

(71) Applicant: ASML Netherlands B.V., Veldhoven (NL)

(72) Inventors: Frits Van Der Meulen, Eindhoven (NL); Erik Johan Arlemark, Waalre (NL); Hendrikus Herman Marie Cox, Eindhoven (NL); Martinus Agnes Willem Cuijpers, Veldhoven (NL); Joost De Hoogh, Eindhoven (NL); Gosse Charles De Vries, Veldhoven (NL); Paul Comé Henri De Wit, Eindhoven (NL); Sander Catharina Reinier Derks, Budel (NL); Ronald Cornelis Gerardus Gijzen, Liempde (NL); Dries Vaast Paul Hemschoote, Vosselaar (BE); Christiaan Alexander Hoogendam, Westerhoven (NL); Adrianus Hendrik Koevoets, Mierlo (NL); Raymond Wilhelmus Louis Lafarre, Helmond (NL); Alain Louis Claude Leroux, Eindhoven (NL); Patrick Willem Paul Limpens, Uden (NL); Jim Vincent Overkamp, Eindhoven (NL); Christiaan Louis Valentin, Eindhoven (NL); Koos Van Berkel, Waalre (NL); Stan Henricus Van Der Meulen, Helmond (NL); Jacobus Cornelis Gerardus Van Der Sanden, Geldrop (NL); Harmen Klaas Van Der Schoot, Haaren (NL); David Ferdinand Vles, Eindhoven (NL); Evert Auke Rinze Westerhuis, The Hague (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/326,948

(22) PCT Filed: Aug. 11, 2017

(86) PCT No.: PCT/EP2017/070394
§ 371 (c)(1),
(2) Date: Feb. 21, 2019

(87) PCT Pub. No.: WO2018/041599
PCT Pub. Date: Mar. 8, 2018

(65) Prior Publication Data
US 2019/0227445 A1    Jul. 25, 2019

(30) Foreign Application Priority Data

Sep. 2, 2016 (EP) .................................... 16186956
Oct. 5, 2016 (EP) .................................... 16192307
Mar. 8, 2017 (EP) .................................... 17159789

(51) Int. Cl.
G03F 7/20 (2006.01)

(52) U.S. Cl.
CPC ...... G03F 7/70875 (2013.01); G03F 7/70783 (2013.01)

(58) Field of Classification Search
CPC ............. G03F 7/70933; G03F 7/70891; G03F 7/70341; G03F 7/70875
(Continued)

(56) References Cited

U.S. PATENT DOCUMENTS 6,151,794 A    11/2000    Wu
7,319,505 B2    1/2008    Nampa
(Continued)

FOREIGN PATENT DOCUMENTS

| EP | 1326139 A2 | 7/2003 |
| JP | S57149731 A | 9/1982 |
| JP | S63187619 A | 8/1988 |

OTHER PUBLICATIONS

International Search Report and Written Opinion of the International Searching Authority directed to related International Patent Application No. PCT/EP2017/070394, dated Jan. 19, 2018; 20 pages.

(Continued)

*Primary Examiner* — Hung Nguyen

(74) *Attorney, Agent, or Firm* — Sterne, Kessler, Goldstein & Fox P.L.L.C.

(57) ABSTRACT

A lithographic apparatus comprising a projection system configured to project a patterned radiation beam to form an exposure area on a substrate held on a substrate table, the lithographic apparatus further comprising a cooling apparatus for cooling the substrate, wherein the cooling apparatus comprises a cooling element located above the substrate table and adjacent to the exposure area, the cooling element being configured to remove heat from the substrate.

26 Claims, 30 Drawing Sheets

(58) Field of Classification Search
USPC .................................................. 355/30, 53
See application file for complete search history.

(56) References Cited

U.S. PATENT DOCUMENTS

| | | | |
|---|---|---|---|
| 8,730,448 B2 * | 5/2014 | Nienhuys | G03F 7/70891 |
| | | | 355/30 |
| 8,810,770 B2 | 8/2014 | Maehara et al. | |
| 8,970,818 B2 | 3/2015 | Nienhuys et al. | |
| 9,625,835 B2 * | 4/2017 | Ranjan | G03F 7/70633 |
| 2003/0176079 A1 | 9/2003 | Sogard | |
| 2004/0200226 A1 | 10/2004 | Hara | |
| 2004/0248430 A1 | 12/2004 | Barber et al. | |
| 2005/0034850 A1 | 2/2005 | Yoshimura et al. | |
| 2009/0201473 A1 | 8/2009 | Burry et al. | |
| 2009/0207392 A1 | 8/2009 | Rijpma et al. | |
| 2010/0200777 A1 | 8/2010 | Hauf | |
| 2010/0270004 A1 | 10/2010 | Landess et al. | |
| 2011/0205516 A1 | 8/2011 | De Vries et al. | |
| 2011/0236011 A1 | 9/2011 | Kaneyama | |
| 2013/0105108 A1 | 5/2013 | Zywno et al. | |
| 2013/0152604 A1 | 6/2013 | Mimata et al. | |
| 2013/0175005 A1 | 7/2013 | Gowdaru et al. | |
| 2015/0015856 A1 | 1/2015 | Ranjan et al. | |
| 2018/0173116 A1 * | 6/2018 | Koevoets | G03F 7/70783 |

OTHER PUBLICATIONS

International Preliminary Report on Patentability of the International Searching Authority directed to related International Patent Application No. PCT/EP2017/070394, dated Mar. 5, 2019; 14 pages.

* cited by examiner

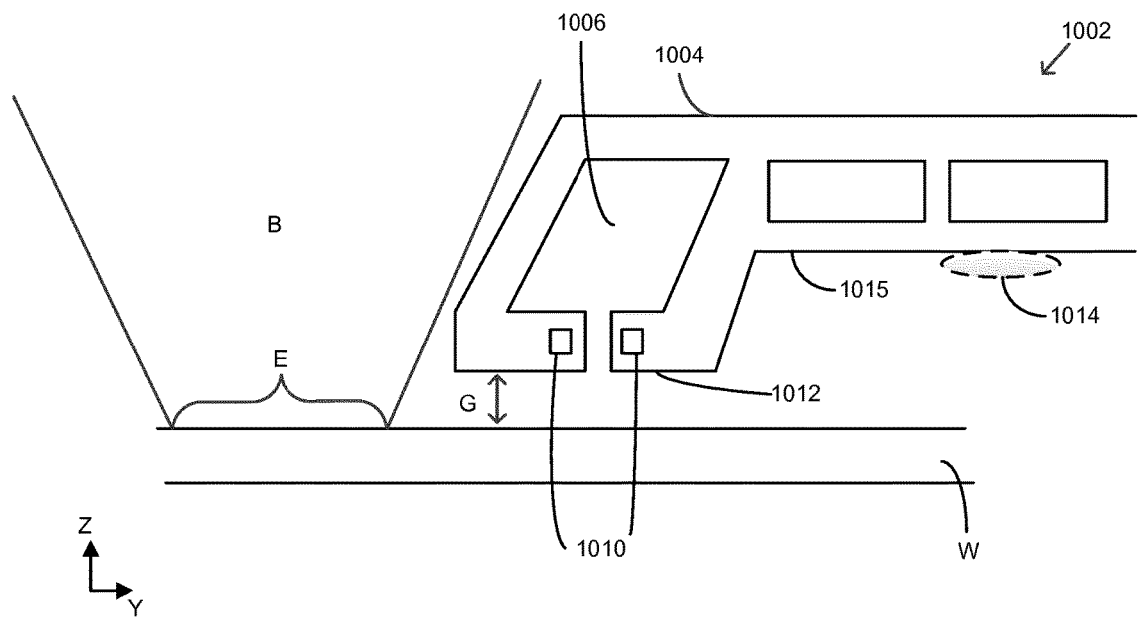
FIG. 24
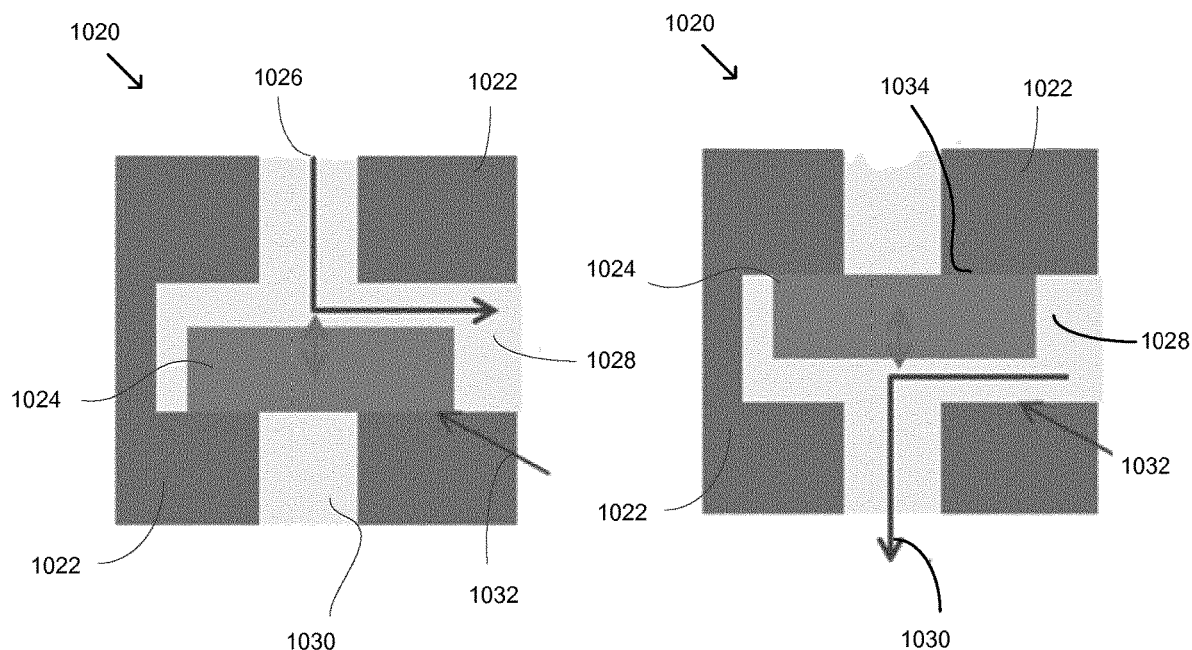
FIG. 25a  FIG. 25b

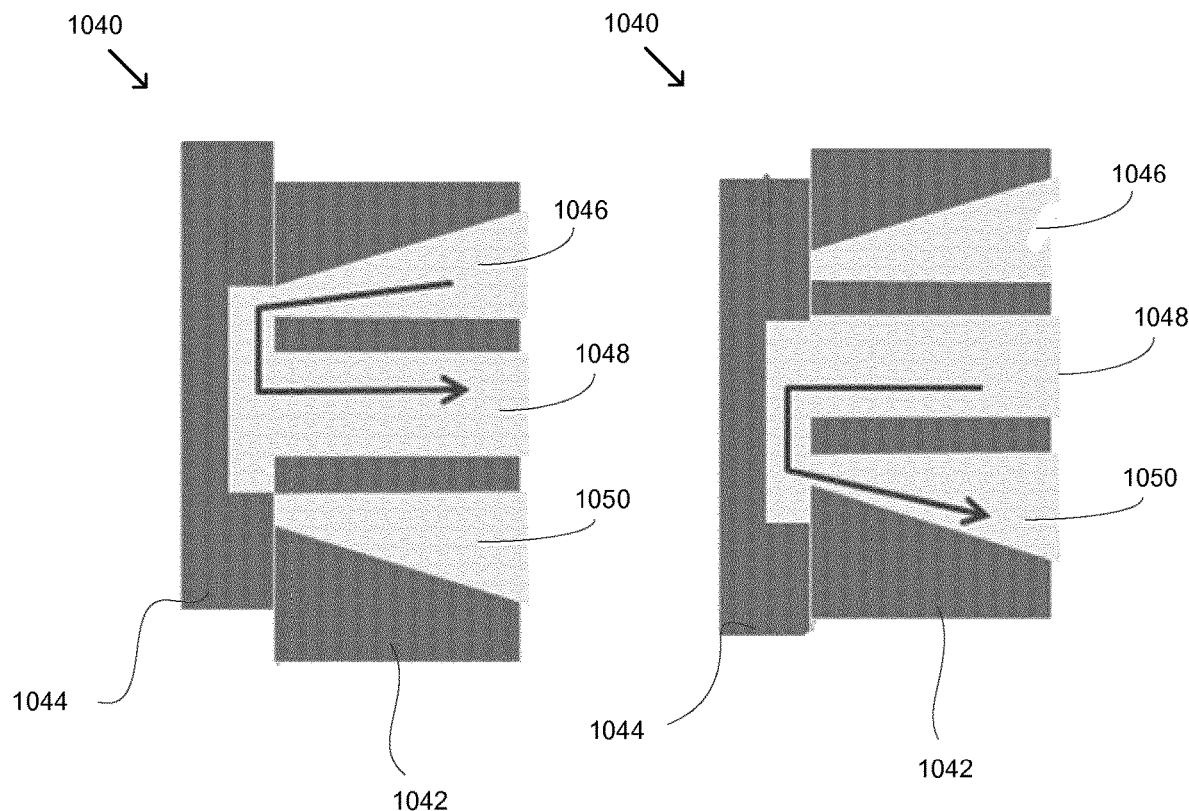
FIG. 26a  FIG. 26b
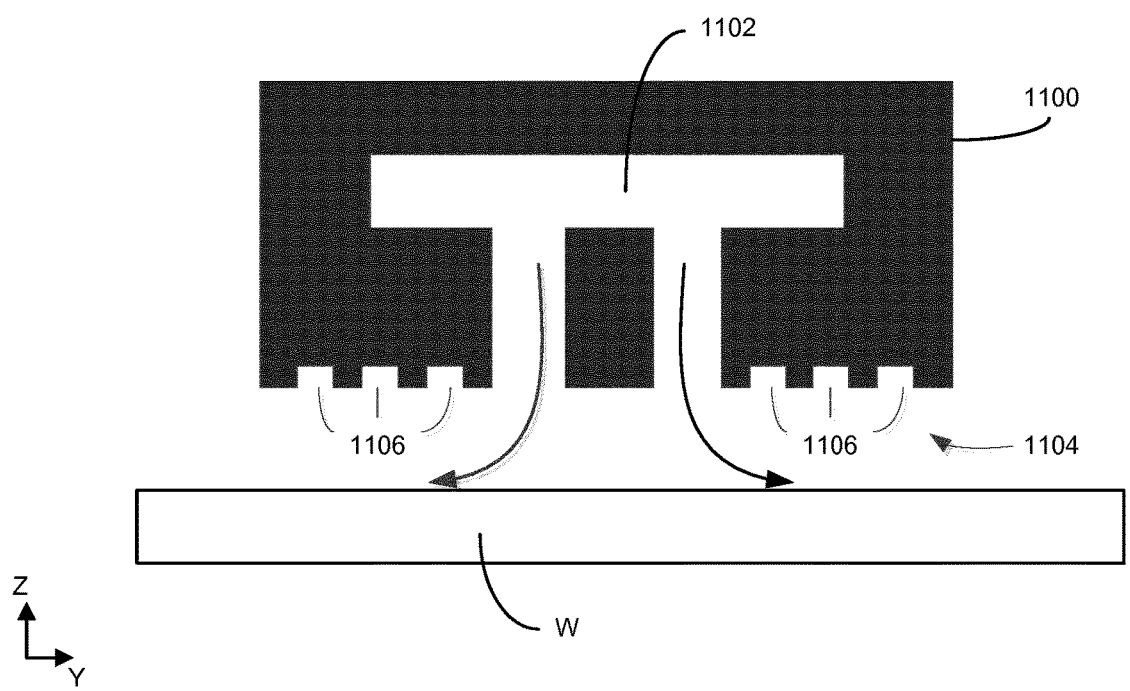
FIG. 27

LITHOGRAPHIC APPARATUS

CROSS-REFERENCE TO RELATED APPLICATIONS

This application claims priority of EP application 16186956.5 which was filed on Sep. 2, 2016, EP application 16192307.3 which was filed on Oct. 5, 2016 and, EP application 17159789.1 which was filed on Mar. 8, 2017 which are incorporated herein in its entirety by reference.

FIELD

The present invention relates to a lithographic apparatus and to a lithographic method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A radiation beam used to project a pattern onto a substrate will deliver a substantial amount of heat to that substrate, and will cause localised heating of the substrate. Localised expansion of the substrate caused by the heating will reduce the accuracy with which a projected pattern overlies patterns already present on the substrate.

SUMMARY

It may be desirable to provide a lithographic apparatus which addresses the problem identified above or some other problem associated with the prior art.

According to a first aspect of the invention there is provided a lithographic apparatus comprising a projection system configured to project a patterned radiation beam to form an exposure area on a substrate held on a substrate table, the lithographic apparatus further comprising a cooling apparatus for cooling the substrate, wherein the cooling apparatus comprises a cooling element located above the substrate table and adjacent to the exposure area, the cooling element being configured to remove heat from a substrate held on the substrate table.

The cooling element may be in thermal communication with the substrate held on the substrate table.

Cooling provided by the cooling element locally suppresses heating in a substrate area close to the exposure area. This is advantageous because heating in that area may be liable to cause substrate expansion which leads to slippage of the substrate over burls of a substrate table, which in turn will reduce the accuracy with which patterns are projected onto the substrate.

The cooling element may be configured to cool an area which lies within 3 cm or less from a line which bisects the exposure area.

The cooling element may be configured to cool an area which lies within 2 cm or less from an edge of the exposure area.

The cooling element may be separated from the exposure area in a direction which substantially corresponds with a scanning direction of the lithographic apparatus.

The cooling element may be one of a pair of cooling elements provided either side of the exposure area.

The cooling element may comprise a body, an open cavity being provided in a lowermost face of the body, and further comprises a gas delivery conduit configured to deliver gas to the cavity. The gas conduit allows controlling the pressure within the cavity of the cooling element.

The cavity may be configured to form, together with an upper surface of the substrate, a volume which receives gas delivered by the gas delivery conduit.

The extent of a cavity of the cooling element in a non-scanning direction of the lithographic apparatus may be equal to or greater than the maximum exposure area length of the lithographic apparatus in the non-scanning direction.

The cavity may have a roof which is less than 1 mm from the upper surface of the substrate in use.

The roof of the cavity may be substantially parallel to a plane of the substrate table.

The combination of the pressure of gas delivered to the cavity and the separation between the cavity roof and the substrate surface may be such that the accommodation coefficient of the substrate does not have a significant effect upon transfer of heat from the substrate to the cooling element body.

The roof of the cavity may be sloping, the roof being tilted about an axis which runs transverse to a scanning direction of the lithographic apparatus.

The cooling element may comprise a body containing a chamber connected to a gas delivery conduit, a floor of the chamber being provided with openings.

The openings in the floor of the chamber may comprise a row of holes or an array of holes.

The floor of the chamber may be formed from porous material, and the openings may be pores of the porous material.

The cooling element may further comprise at least one shutter which is moveable from a retracted position to a deployed position, and wherein moving the shutter from the retracted position to the deployed position closes some openings in the floor of the cooling element.

The at least one shutter may be configured such that no openings are closed by the shutter when the shutter is in the retracted position.

The at least one shutter may be moveable to an intermediate position which is between the retracted position and the deployed position.

The cooling element may comprise additional chambers provided either side of the chamber, the additional chambers being connected to a different gas delivery conduit or conduits.

The lithographic apparatus may further comprise a valve configured to control delivery of gas to the chamber, and one or more valves configured to separately control delivery of gas to the additional chambers.

The body of the cooling element may have a thickness of 3 mm or less.

The body of the cooling element may be located 3 mm or less from an edge of the exposure area.

The body of the cooling element may have a lowermost surface which measures less than 5 mm in a scanning direction of the lithographic apparatus.

The body of the cooling element may have a sloping inner surface which faces towards the radiation beam.

The cooling element may include a heat removal system configured to remove heat from the cooling element.

The heat removal system may be a fluid cooling system.

The heat removal system may include a Peltier cooler. The Peltier cooler may be located between the fluid cooling system and the cavity.

The fluid cooling system may comprise a cooler configured to cool gas, the cooler being located remotely from the cooling element, an inlet conduit configured to deliver the cooled gas to the cooling element in order to cool the cooling element, and an outlet conduit configured to remove the gas from the cooling element.

The inlet conduit and the outlet may both include a flexible portion which accommodates movement of the cooling element.

A temperature sensor may be provided on the inlet conduit and a temperature sensor may be provided on the outlet conduit.

The apparatus may further comprise a gas source configured to provide the gas at a rate of more than 10 l/min.

The apparatus may further comprise a gas source configured to provide the gas at a rate of less than 2 l/min.

The heat removal system may comprise a heat pipe connected to a cooler.

The heat pipe may have a cross-sectional shape which is larger in a horizontal direction than in the vertical direction.

The heat pipe may include a flexible portion which accommodates movement of the cooling element.

The heat pipe may be a micro heat pipe.

The fluid cooling system may be a two-phase cooling system which comprises a pump, a condenser and an accumulator.

The two-phase cooling system may further comprise a temperature sensor provided on the cooling element.

The fluid cooling system may include a constriction provided in a heat exchanger, the constriction being configured to cool gas which is used to cool the cooling element.

The cooling element may be provided with a heater.

A Peltier cooler may be located between the fluid cooling system and the cavity.

The lithographic apparatus may further comprise a gas supply configured to deliver gas at a pressure of 200 Pascals or more. The gas supply may be configured to deliver gas at a pressure of 100 kPa or more. The gas supply may be configured to deliver gas at a pressure of around 500 kPa or more. Although any pressure may be suitable for heat removal, by increasing the gas pressure the gas density will be increased accordingly and at higher gas density the heat can be removed more efficiently.

The cooling element may be configured to have a separation of 20 microns or more from the substrate during use.

The cooling element may be configured to have a separation of 200 microns or less from the substrate during use.

The cooling element may be configured to provide an outward flow of gas from underneath the cooling element that acts as a cushion which prevents or inhibits contact occurring between the cooling element and the substrate.

The cooling element may be provided on a support which includes a retraction mechanism which is configured to pull the cooling element away from the substrate if unexpected movements are detected.

The cooling element may comprise an array of nozzles arranged to direct droplets of liquid onto the substrate.

The cooling element may be configured to have a separation of 50 microns or more from the substrate during use.

The cooling element may be configured to have a separation of 1 millimeter or more from the substrate during use.

The extent of the array of nozzles of the cooling element in a non-scanning direction of the lithographic apparatus may be equal to or greater than the maximum exposure area length of the lithographic apparatus in the non-scanning direction.

The array of nozzles may be a two dimensional array in which the nozzles are evenly distributed across a bottom surface of the cooling element.

The nozzles may be configured to provide liquid droplets with a diameter of the order of tens of microns or less.

The cooling element may comprise a first part arranged to be cooled to a first temperature selected to remove heat from the substrate and a second part arranged to operate at a higher temperature than the first part.

By providing a "warm" (or non-cooled) actuation body, the area of the substrate which is exposed to cooling temperatures may be more easily localized to an exposure area.

The second part may be arranged to operate at an ambient temperature.

The second part may be provided with actuators to increase and decrease a distance of the first part from the substrate so as to adjust a heat transfer coefficient of the cooling element.

The first part may be constructed from a ceramics material.

The first part may be formed from a plurality of layers.

The first part may comprise a plate having a slit through which the radiation beam passes.

The lithographic apparatus may further comprise a thermal shield located between a first portion of the cooling element and the substrate, so as to reduce an amount of heat that is removed from the substrate by the first portion.

The cooling element may define a cooling slit for receiving the radiation beam and the first portion surrounds the cooling slit.

The thermal shield may comprise a temperature control mechanism.

The temperature control mechanism may comprise at least one of a fluid cooling and/or heating system, heating elements and temperature sensors.

The lithographic apparatus may further comprise a second thermal shield located such that the cooling element is between the second thermal shield and the substrate.

By providing a second thermal shield above the cooling element, the cooling element is more effectively isolated from the surrounding environment. The second thermal shield may be constructed in the same way as the first thermal shield.

The floor may comprise one or more temperature sensors arranged to determine a temperature of the floor.

The one or more temperature sensors may comprise a resistance thermometer.

The temperature sensors may be Platinum Resistance (PT) thermometers, such as PT100 sensors or PT1000 sensors.

The lithographic apparatus may further comprise a gas delivery conduit to deliver a gas to the cooling element for delivery from the cooling element to the substrate, a valve for selectively restricting gas flow within the gas delivery conduit, the valve comprising a housing portion and a sliding member, the valve defining a conduit between a fluid ingress connected to the gas delivery conduit and a fluid egress. The sliding member may be slidable between a first position in which the conduit is unrestricted and a second position in which the conduit is partially restricted. The sliding member may not physically contact the housing.

The sliding member may slide along an axis that is perpendicular to a normal of a surface of the housing that cooperates with the sliding member to form the valve. This configuration may result in reduced friction between the housing and sliding member due to little or no abutting between the housing and the sliding member, thus fewer particles are generated by the valve. Gas leakage through the valve may be estimated or modelled.

A cooling surface of the cooling element may comprise a non-flat, three dimensional structure.

The three-dimensional structure may increase a thermal accommodation coefficient of the cooling surface. In tests, providing such a structure on the cooling surface of a cooling element may increase the effective thermal accommodation coefficient by approximately 10% to 15%. The three-dimensional structure may cause the heat transfer coefficient to be less sensitive to changes (e.g. particle contamination) influencing the thermal accommodation coefficient of the cooling surface.

A cooling body may be bendable so as to control cooling provided by a gas present between the cooling element and the substrate.

The cooling body may comprise one or more piezo-actuators arranged to bend the cooling body. The cooling body may, for example, be arranged to be bent such that more cooling is provided at edges of an exposure area than at a centre of the exposure area. In one embodiment, more cooling is provided at the edges than at a center by bending the cooling body so as to have a parabolic profile.

The lithographic apparatus may further comprise an optical sensor apparatus. The optical sensor apparatus may comprise an optical sensor and a heater arranged to heat the optical sensor apparatus. In this way, cooling of the optical sensor is can be controlled. For example, if no cooling of the optical sensor or if less cooling of the optical sensor than is provided by the cooling body is desired, the heater may be used to mitigate the cooling effects of the cooling body on the optical sensor.

The optical sensor apparatus may further comprise a temperature sensor arranged to determine a temperature of the optical sensor.

The optical sensor apparatus may be provided on the substrate table. The optical sensor apparatus may form part of an alignment sensor of the lithographic apparatus.

According to a second aspect of the invention there is provided a lithographic method comprising projecting a patterned radiation beam to form an exposure area on a substrate held on a substrate table, and using a cooling apparatus to cool the substrate, the cooling apparatus comprising a cooling element located above the substrate table and adjacent to the exposure area, the cooling element acting to remove heat from the substrate.

The cooling element may be in thermal communication with the substrate held on the substrate table.

The cooling element may be configured to cool an area which lies within 3 cm or less from a line which bisects the exposure area.

The cooling element may be configured to cool an area which lies within 2 cm or less from an edge of the exposure area.

The cooling element may comprise a body, an open cavity provided in a lowermost face of the body, the open cavity and the upper surface of the substrate forming a volume, and a gas delivery conduit configured to deliver gas to the volume.

The cavity may have a roof which is less than 1 mm from the upper surface of the substrate.

The cooling element may comprise a body containing a chamber connected to a gas delivery conduit, a floor of the chamber being provided with openings.

The gas may be delivered to the volume at a pressure of 200 Pascals or more. The gas may be delivered to the volume at a pressure of 100 kPa or more. The gas may be delivered to the volume at a pressure of around 500 kPa or more.

The cooling element may be separated from the substrate by 20 microns or more.

The cooling element may be separated from the substrate by 200 microns or less.

The cooling element may comprise an array of nozzles which direct droplets of liquid onto the substrate.

The cooling element may be separated from the substrate by of 50 microns or more.

The cooling element may be separated from the substrate by 1 mm or more.

The extent of the array of nozzles of the cooling element in a non-scanning direction of the lithographic apparatus may be equal to or greater than the maximum exposure area length of the lithographic apparatus in the non-scanning direction.

The array of nozzles may be arranged to provide an even distribution of liquid droplets on the substrate.

The liquid may be water.

An optical sensor provided on the substrate table may be heated so as to counteract an effect of the cooling apparatus on the optical sensor.

According to a third aspect of the invention there is provided a lithographic apparatus comprising a projection system configured to project a patterned radiation beam onto a substrate held on a substrate table, the lithographic apparatus further comprising a substrate temperature adjustment unit configured to adjust the temperature of the substrate to a temperature above the temperature of the substrate table before the substrate is placed on the substrate table.

This is advantageous because the substrate then cools to the temperature of the substrate table when it is placed upon the substrate table, thereby introducing a stress into the substrate. The stress which is introduced into the substrate tends to draw an outer edge of the substrate inwards towards the centre of the substrate. When the substrate is patterned using a radiation beam this heats the substrate and introduces stress which tends to push an outer edge of the substrate outwards away from the centre of the substrate. The stress already introduced during cooling of substrate will at least partially counteract the stress caused by heating of the substrate, thereby reducing the cumulative stress experienced by the substrate.

The substrate temperature adjustment unit may be configured to adjust the temperature of the substrate to a temperature which is up to around 0.5° C. above the temperature of the substrate table.

According to a fourth aspect of the invention there is provided a method of conditioning a substrate prior to exposure of that substrate in a lithographic apparatus, the method comprising using a temperature adjustment unit to adjust the temperature of the substrate to a temperature which is above the temperature of a substrate table of the lithographic apparatus, transferring the substrate to the substrate table and activating a clamp which clamps the substrate to the substrate table, cooling the substrate to the temperature of the substrate table and thereby inducing a stress into the substrate.

According to fifth aspect of the invention there is provided a scanning lithographic apparatus comprising a projection system configured to project a patterned radiation beam to form an exposure area on a substrate held on a substrate table, the lithographic apparatus further comprising a heating apparatus for heating the substrate, wherein the heating apparatus comprises first and second heating elements configured to heat substrate areas located at opposite ends of the exposure area in a non-scanning direction of the lithographic apparatus.

The heating apparatus is advantageous because it prevents or reduces distortion of the substrate at the ends of the exposure area in the non-scanning direction. This allows the overlay performance of the lithographic apparatus to be improved.

The first and second heating elements may be located above the substrate table and located at opposite ends of the exposure area in a non-scanning direction of the lithographic apparatus.

The first and second heating elements may be adjacent to the exposure area in the non-scanning direction.

The first and second heating elements may be configured to heat areas which overlap in the non-scanning direction with the exposure area.

The first and second heating elements may be configured to emit heat with some outward divergence such that areas which receive heat extend beyond the footprints of the heating elements.

The first and second heating elements may be configured to heat areas which have a size in the scanning direction that generally corresponds with the size in the scanning direction of the exposure area.

The first and second heating elements may each be configured to heat areas which have a size in the non-scanning direction that is less than the size in non-scanning direction of the exposure area.

The first and second heating elements may be configured to heat areas which have a size in the non-scanning direction that is less than half the size in non-scanning direction of the exposure area.

The heating area may also have a size in the scanning direction that is larger than that of the exposure area. The heating in the heating area does not need to be uniform.

The heating elements may each comprise an array of LEDs.

The LEDs may be configured to emit infrared radiation.

At least some of the LEDs may be configured to emit radiation beams which diverge such that they overlap with the patterned radiation beam before they are incident upon the substrate.

The first and second heating elements may comprise one or more lasers configured to provide laser beams which heat the substrate areas located at opposite ends of the exposure area in the non-scanning direction of the lithographic apparatus.

The one or more lasers and associated optics may be configured such that the laser beams pass out of an opening located in a floor of a projection system housing of the lithographic apparatus before being incident upon the substrate.

The one or more lasers may be located outside of a projection system housing of the lithographic apparatus.

The projection system housing may be provided with a window which allows the laser beams to pass into the projection system housing.

The scanning lithographic apparatus may further comprise mirrors mounted on actuators within the projection system housing, the mirrors being operable to change the directions of the laser beams and thereby move the substrate areas which are heated by the laser beams to different positions.

The scanning lithographic apparatus may further comprise a cooling element located above the substrate table and located at one side of the exposure area in a scanning direction of the lithographic apparatus.

The scanning lithographic apparatus may further comprise an additional cooling element located above the substrate table and located at an opposite side of the exposure area in a scanning direction of the lithographic apparatus.

According to a sixth aspect of the invention there is provided a method of exposing a substrate using a scanning lithographic apparatus, the method comprising projecting a patterned radiation beam to form an exposure area on a substrate held on a substrate table, using a heating apparatus to heat areas on the substrate which are located at opposite ends of the exposure area in a non-scanning direction of the lithographic apparatus, and moving the substrate relative to the exposure area and heated areas in a scanning movement in order to expose a target portion of the substrate using the patterned radiation beam. The consecutive portion to be exposed may also be adjacent to the exposed portion in the scanning direction.

The next target portion which is exposed may be not adjacent to the exposed target portion in the non-scanning direction, but instead separated from the exposed target portion in the non-scanning direction by at least one interposed target portion.

The method may further comprise using a cooling apparatus to cool an area on the substrate which is located adjacent to at least one side of the exposure area in a scanning direction of the lithographic apparatus.

The lithographic apparatus of the first aspect of the invention may further comprise a remote temperature sensing system, the remote temperature sensing system comprising a photodetector configured to detect thermal radiation emitted from a target area of the substrate.

The remote temperature sensing system may further comprise shielding, the shielding being arranged with respect to the photodetector and the target area such that substantially all radiation that enters the photodetector has travelled from the target area.

The remote temperature sensing system may further comprise a control surface, the control surface having a known temperature and being arranged with respect to the target area such that substantially all radiation reflecting from the target area toward the photodetector originates from the control surface.

The photodetector may be an upconversion photodetector.

The photodetector may be configured to detect radiation having a wavelength in the range of about 2 µm to about 5 µm.

The photodetector may be located on the projection system.

The photodetector may be located on the cooling apparatus.

The photodetector may comprise multiple pixels, different pixels being configured to detect radiation emitted from different parts of the target area.

The photodetector may be arranged with respect to the target area such that a first group of pixels receives radiation emitted by a heated area of the substrate, a second group of pixels receives radiation emitted by a cooled area of the substrate and a third group of pixels receives radiation emitted by an ambient area of the substrate.

The remote temperature sensing system may comprise two or more photodetectors.

A sample-rate of the photodetector may be in the range of about 1 Hz to about 10 Hz.

The shielding may comprise an elongate hollow tube.

The shielding may comprise a plate having an aperture.

The control surface may comprise a cooling system configured to cool the control surface.

The control surface may have an emissivity of less than about 0.2.

The remote temperature sensing system may form part of a control loop configured to control the cooling apparatus.

The method of the second aspect of the invention may further comprise remotely measuring a temperature of a target area of the substrate and using the temperature measurement to control a cooling of the substrate provided by the cooling apparatus.

The remote measuring may comprise detecting thermal radiation emitted by the target area.

The detecting may comprises upconverting the thermal radiation to radiation having a shorter wavelength than the thermal radiation and detecting the upconverted radiation.

The method may further comprise measuring the temperature of different target areas of the substrate and comparing the measurements to determine the relative temperatures of the target areas of the substrate.

The different target areas may cover corresponding areas within different target portions of the substrate.

The method may further comprise determining emission properties of the target area.

The emission properties may be determined using Fourier Transform Infrared Spectroscopy.

The method may further comprise using the determined emission properties of the target area and the measured thermal radiation emitted by the target area to determine an absolute temperature of the target area.

The temperature of the target area may be measured during projection of the patterned radiation beam.

The method may further comprise measuring the temperature of the target area before projecting the patterned radiation beam and measuring the temperature of the target area after projecting the patterned radiation beam and comparing the results of the temperature measurements to control a cooling provided to the substrate.

According to a seventh aspect of the invention there is provided a substrate table for a lithographic apparatus, the substrate table being provided with a thermal sensor comprising a semiconductor plate having an unsupported central portion, a temperature sensor being located on a lowermost surface of the semiconductor plate.

The thermal sensor advantageously allows measurement of the amount of cooling provided by a cooling apparatus compared with the amount of heating provided by a radiation beam of the lithographic apparatus.

The substrate table may form part of a lithographic apparatus.

The semiconductor plate may be held around its periphery by a support.

The semiconductor plate may have a thickness of 300 microns or less.

The semiconductor plate may be a silicon plate.

The temperature sensor may be one of an array of temperature sensors located on the lowermost surface of the semiconductor plate.

The array of temperature sensors may be a line of temperature sensors.

According to an eighth aspect of the invention there is provided a substrate table comprising a substrate clamp provided with a hole, and a temperature sensor mounted on an arm which extends through the hole, wherein the substrate table further comprises an actuator configured to lengthen and shorten the arm such that in use the temperature sensor may be moved towards and away from a substrate held on the substrate table.

Because the temperature sensor may be moved away from a substrate held on the substrate table, this avoids the temperature sensor causing distortion of the substrate during exposure of by a lithographic apparatus.

The substrate table may form part of a lithographic apparatus.

The arm may be formed from a thermally insulating material.

According to a ninth aspect of the invention there is provided a method of measuring a temperature offset using a substrate table comprising a substrate clamp provided with a hole, and a temperature sensor mounted on an arm which extends through the hole, the substrate table further comprises an actuator configured to lengthen and shorten the arm, wherein the method comprises receiving an output from the temperature sensor when no substrate is present on the substrate table, loading a substrate onto the substrate table, lengthening the arm to bring the temperature sensor into contact with the substrate, then receiving an output from the temperature sensor, and determining whether the output from the temperature sensor has changed.

The method provides a simple and convenient way of determining whether the substrate has a different temperature than the substrate table when it is loaded onto the substrate table.

The method may further comprise using the change of output from the temperature sensor to determine a temperature offset between the temperature of the substrate table and the temperature of the substrate.

The lithographic apparatus of the first aspect of the invention may be a scanning lithographic apparatus and may be configured to form a curved exposure area. Cooling elements of the cooling apparatus may be curved, a first cooling element having a concave leading edge, the first cooling element comprising an inner chamber configured to deliver cooling gas and outer chambers configured to deliver cooling gas, the outer chambers being positioned either side of the inner chamber.

The above arrangement advantageously provides a reduction of third order distortion of a substrate caused by the curved exposure area.

The lithographic apparatus may further comprise valves configured to independently control delivery of cooling gas to the inner chamber and delivery of cooling gas to the outer chambers.

The second cooling element may have a convex leading edge.

The second cooling chamber may comprise a single chamber configured to deliver cooling gas.

According to a ninth aspect of the invention there is provided a method of exposing a substrate using a scanning lithographic apparatus, the method comprising projecting a patterned radiation beam to form a curved exposure area on a substrate held on a substrate table, and using a cooling apparatus comprising first and second cooling elements to cool curved areas on the substrate which are located either side of the exposure area, wherein the first cooling element has a concave leading edge and comprises an inner chamber configured to deliver cooling gas and outer chambers configured to deliver cooling gas, the outer chambers being positioned either side of the inner chamber, and wherein the method further comprises providing cooling gas to the outer chambers before cooling gas is provided to the inner chamber and/or providing stronger cooling from the outer chambers than is provided from the inner chamber.

The method advantageously reduces third order distortion of a substrate caused by the curved exposure area.

The cooling elements of the lithographic apparatus of the first aspect of the invention may be curved and the lithographic apparatus may be a scanning lithographic apparatus configured to form a curved exposure area. A cooling element of the cooling apparatus may have a curve which is generally a reflection of the curved exposure area about an axis which extends transverse to the scanning direction.

The above arrangement advantageously provides a reduction of third order distortion of a substrate caused by the curved exposure area.

Another cooling element of the cooling apparatus may have a curve which generally corresponds with the curved exposure area.

According to a tenth aspect of the invention there is provided a method of exposing a substrate using a scanning lithographic apparatus, the method comprising projecting a patterned radiation beam to form a curved exposure area on a substrate held on a substrate table, and using a cooling apparatus comprising cooling elements to cool curved areas on the substrate which are located either side of the exposure area, wherein a cooling element of the cooling apparatus has a curve which is generally a reflection of the curved exposure area about an axis which extends transverse to the scanning direction, and wherein the method further comprises, when that cooling element is leading the exposure area, postponing delivery of cooling gas to the cooling element until after a central point of a leading edge of the cooling element has passed over a start of a target area of the substrate.

The method advantageously reduces third order distortion of a substrate caused by the curved exposure area.

The lithographic apparatus of the first aspect of the invention may be a scanning lithographic apparatus and may be configured to form a curved exposure area. A cooling element of the cooling apparatus may have a floor member which is curved transverse to the scanning direction such that in use outer ends of the floor member are closer to the substrate W than a central portion of the floor member.

The above arrangement advantageously provides a reduction of third order distortion of a substrate caused by the curved exposure area.

Piezo-actuators may be provided at ends of the floor member.

The lithographic apparatus may be a scanning lithographic apparatus and may be configured to form a curved exposure area, and wherein a cooling element of the cooling apparatus may have a floor which is provided with a density of openings which varies along a direction transverse to the scanning direction, a higher density of openings being provided at outer ends of the floor than in a central portion of the floor.

The above arrangement advantageously provides a reduction of third order distortion of a substrate caused by the curved exposure area.

Features of different aspects of the invention may be combined together.

BRIEF DESCRIPTION OF THE DRAWINGS

Embodiments of the invention will now be described, by way of example only, with reference to the accompanying schematic drawings, in which:

FIG. 17b schematically depicts viewed from below a cooling plate of the cooling apparatus of FIG. 17a;

FIG. 24 schematically depicts a cooling apparatus according to an embodiment described herein;

FIGS. 25a and 25b schematically depict a valve that may be used in combination with embodiments described herein;

FIGS. 26a and 26b schematically depict an alternative valve that may be used in combination with embodiments described herein;

FIG. 27 schematically depicts a cooling element in accordance with an embodiment described herein;

DETAILED DESCRIPTION

Figure 1:
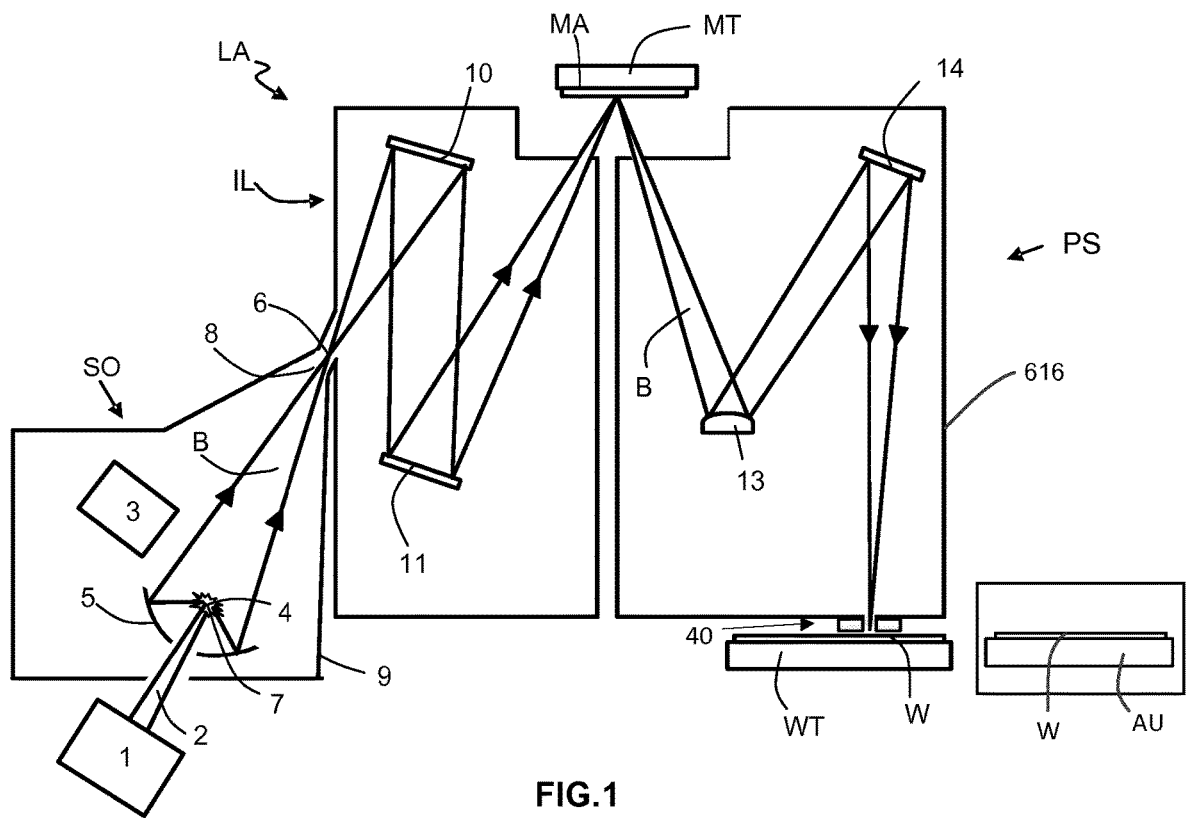
FIG. 1 schematically depicts a lithographic system comprising a lithographic apparatus and a radiation source according to an embodiment of the invention.

FIG. 1 shows a lithographic system including a cooling apparatus according to an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

A cooling apparatus 40 is located above the substrate W. The cooling apparatus 40 provides localised cooling of the substrate in the vicinity of the radiation beam B. The cooling apparatus 40 is described in detail further below. A substrate temperature adjustment unit AU configured to heat a substrate W is also depicted in FIG. 1. The temperature adjustment unit AU is described in detail further below. The lithographic apparatus LA may further comprise a heating apparatus (not depicted) which is described further below.

Figure 2:
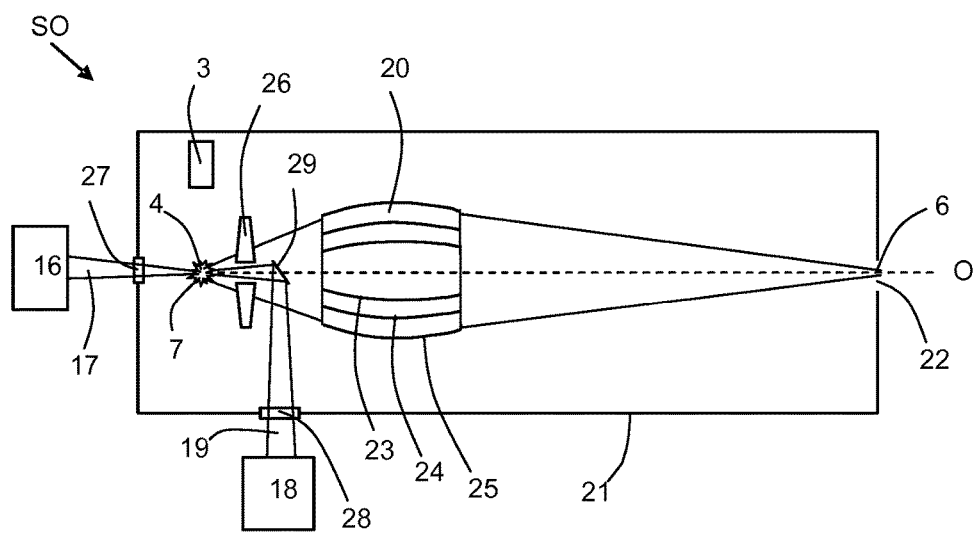
FIG. 2 schematically depicts a radiation source of the lithographic apparatus.

FIG. 2 shows a laser produced plasma (LPP) radiation source SO which has an alternative configuration to the radiation source shown in FIG. 1. The radiation source SO includes a fuel emitter 3 which is configured to deliver fuel to a plasma formation region 4. The fuel may for example be tin, although any suitable fuel may be used. A pre-pulse laser 16 emits a pre-pulse laser beam 17 which is incident upon the fuel. The pre-pulse laser beam 17 acts to preheat the fuel, thereby changing a property of the fuel such as its size and/or shape. A main laser 18 emits a main laser beam 19 which is incident upon the fuel after the pre-pulse laser beam 17. The main laser beam delivers energy to the fuel and thereby coverts the fuel into an EUV radiation emitting plasma 7.

A radiation collector 20, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to an illumination system of a lithographic apparatus (e.g. of the form shown schematically in FIG. 1).

The radiation collector 20 may be a nested collector, with a plurality of grazing incidence reflectors 23, 24 and 25 (e.g. as schematically depicted). The grazing incidence reflectors 23, 24 and 25 may be disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may for example be a rotating foil trap, or may be any other suitable form of contamination trap. In some embodiments the contamination trap 26 may be omitted.

An enclosure 21 of the radiation source SO includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 26 to the plasma formation region 4.

The radiation sources SO shown in FIGS. 1 and 2 may include components which are not illustrated. For example, a spectral filter may be provided in the radiation source. The spectral filter may be substantially transmissive for EUV radiation but substantially blocking for other wavelengths of radiation such as infrared radiation.

Figure 3A:
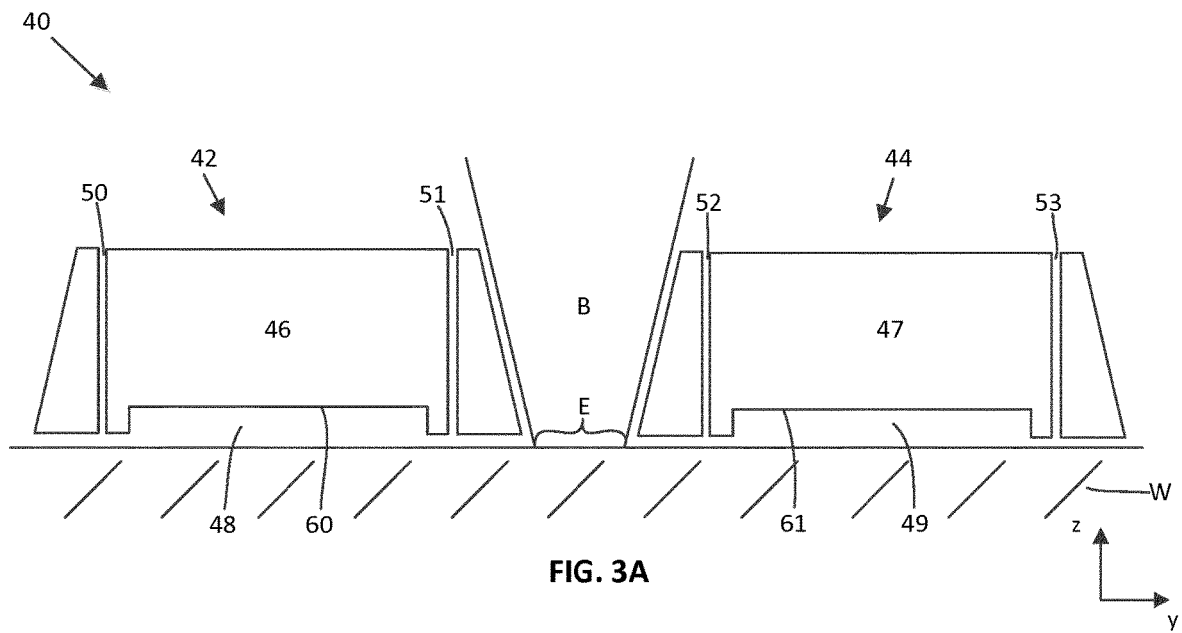
FIG. 3A-3B schematically depict a cooling apparatus of the lithographic apparatus in cross section viewed from one side and viewed from below.
Figure 3B:
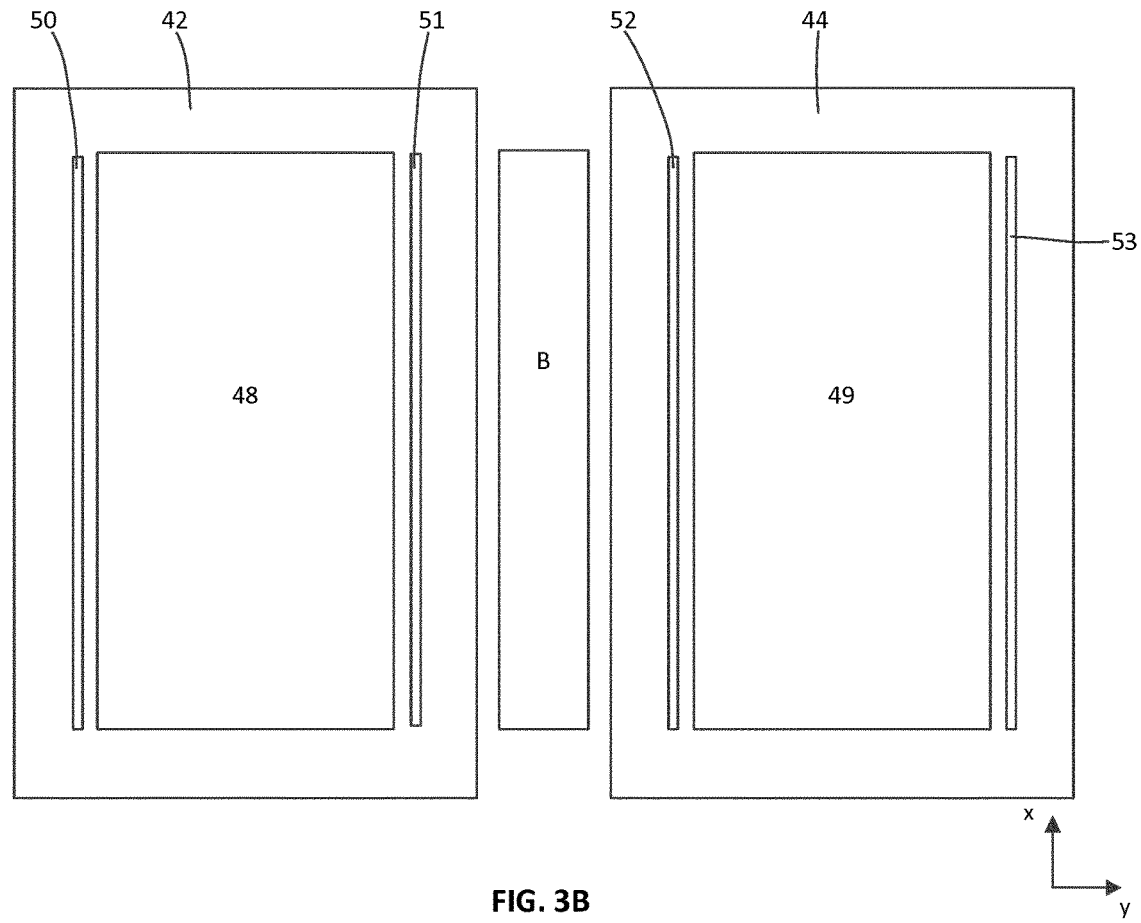

FIG. 3 schematically depicts a cooling apparatus 40 according to an embodiment of the invention. FIG. 3a is a schematic view of the cooling apparatus 40 viewed from below, and FIG. 3b is a schematic view of the cooling apparatus in cross-section viewed from one side. The radiation beam B projected by the lithographic apparatus is shown in FIGS. 3a and 3b. The radiation beam illuminates an exposure area E on a substrate W which is being exposed by the radiation beam (as depicted in FIG. 3b). Cartesian coordinates are shown in FIG. 3, and use the notation which is conventionally used for lithographic apparatus, i.e. the Y-direction is the direction of scanning movement of the substrate W during exposure, the X-direction is transverse to the Y-direction and lies in the plane of the substrate, and the Z-direction generally corresponds with the optical axis of the radiation beam B.

The cooling apparatus 40 comprises a first cooling element 42 and a second cooling element 44. As depicted in FIG. 3 the first and second cooling elements may have the same overall construction. The cooling elements 42, 44 are located either side of the radiation beam B in the scanning-direction (i.e. in the Y-direction). The cooling elements 42, 44 are adjacent to an exposure area E (i.e. an area upon which the radiation beam B is incident). In this context the term "adjacent" may be interpreted as meaning less than 1 cm from an edge of the exposure area E. The cooling elements 42, 44 may be less than 0.5 cm from an edge of the exposure area E, and may be around 0.1 cm from an edge of the exposure area. Each cooling element 42, 44 may be configured to cool an area which lies within 3 cm or less from a line which bisects the exposure area E. Each cooling element 42, 44 may be configured to cool an area which lies within 2 cm or less from an edge of the exposure area.

The cooling elements 42, 44 provide localised cooling of the substrate W in areas which lie beneath the cooling elements. Thus, during a scanning exposure of the substrate in which the substrate is moving in the positive Y-direction (from left to right in FIG. 3) the first cooling element 42 cools part of the substrate that is about to be exposed by the radiation beam B and the second cooling element 44 cools part of the substrate that has just been exposed by the radiation beam B. If the scanning exposure moves the substrate in the negative Y-direction (from right to left in FIG. 3) then the second cooling element 44 provides cooling of part of the substrate that is about to be exposed by the radiation beam B and the first cooling element 42 provides cooling of part of the substrate that has just been exposed by the radiation beam.

Each cooling element 42, 44 is configured to receive heat from the substrate W and to transfer that heat to some other location, for example using a cooling fluid (e.g. water). In this context the term "cooling fluid" is not intended to imply that the fluid must have a particular temperature but instead indicates that the fluid transports heat away from the cooling element 42, 44. Each cooling element 42, 44 comprises a body 46, 47 in which a cavity 48, 49 is formed with a roof 60, 61. The cavity 48, 49 is formed in a lowermost surface of the cooling element body 46, 47 and is located above the substrate W in use. Each cooling element 42, 44 further comprises gas delivery conduits 50-53 which are configured to deliver gas to the lowermost surface of the cooling element bodies 46, 47. The lowermost surface of a cooling element may be referred to as a bottom surface and vice versa. The lowermost surface of a cooling element body may be referred to as a cooling surface and vice versa. Gas which exits the gas delivery conduits 50-53 passes into the cavities 48, 49 and fills the cavities. Gas also travels outwardly and exits from beneath the cooling element bodies 46, 47 to the surrounding environment.

The gas is delivered at a pressure which is sufficiently high to transport a significant amount of heat from the substrate W to the cooling element bodies 46, 47. The pressure of the gas may be kept sufficiently low that the gas does not cause damage to the substrate W. Furthermore, the pressure of the gas may be kept sufficiently low that it does not generate tangential forces sufficiently strong to cause the substrate W to slip over burls on the substrate table WT (e.g. does not generate tangential forces greater than around 10 mN). The pressure of the gas may be kept sufficiently low that significant deformation of the substrate W does not occur at locations where the substrate is supported by burls of the substrate table WT. The substrate may have an outer edge of for example 1-3 mm which is not supported by burls of the substrate table WT. The pressure of the gas may be sufficiently low that downward deformation of the substrate at the outer edge is limited to an amount which can be compensated for by the lithographic apparatus (e.g. deformation of less than 10 nm). The pressure of the gas in the cavities 48, 49 may for example be greater than 100 Pascals. The pressure of the gas in the cavities 48, 49 may for example be greater than 200 Pascals. The pressure of gas in the cavities may for example be up to around 1000 Pascals, may be up to around 2000 Pascals, and may be up to around 5000 Pascals. The pressure of gas in the cavities may for example be 100 kPa or more. The pressure of gas in the cavities may for example be around 500 kPa or more. The pressure of the gas in the cavities 48, 49 will be affected by the gap between the lowermost surface of the body 46, 47 and the substrate W (increasing the gap will make it more difficult to maintain a high pressure). As explained elsewhere in this document, the separation may for example be around 20 microns or more, and may be around 50 microns or more. The separation may be around 200 microns or less.

In addition to facilitating transport of heat from the substrate W to the cooling element bodies 46, 47 the gas may also act as a cushion which prevents or inhibits contact occurring the between the cooling element bodies and the substrate W. In an embodiment, a separation between a lowermost surface of the cooling element bodies 46, 47 and the substrate W may be greater than 20 microns, and may for example be 50 microns or more. If the separation is too small then there will be a significant risk of a cooling element body 46, 47 coming into contact with a substrate W. This is undesirable because it may cause damage to the lithographic apparatus. A separation of 20 microns may be sufficient to reduce the risk of contact to a reasonable level. A separation of 50 microns may be sufficient to substantially eliminate the risk of contact. The separation may for example be up to 100 microns, and may for example be up to 200 microns. A separation greater than 200 microns may be undesirable because it may allow a too much gas to leak out from underneath the cooling element bodies 46, 47.

Figure 4:
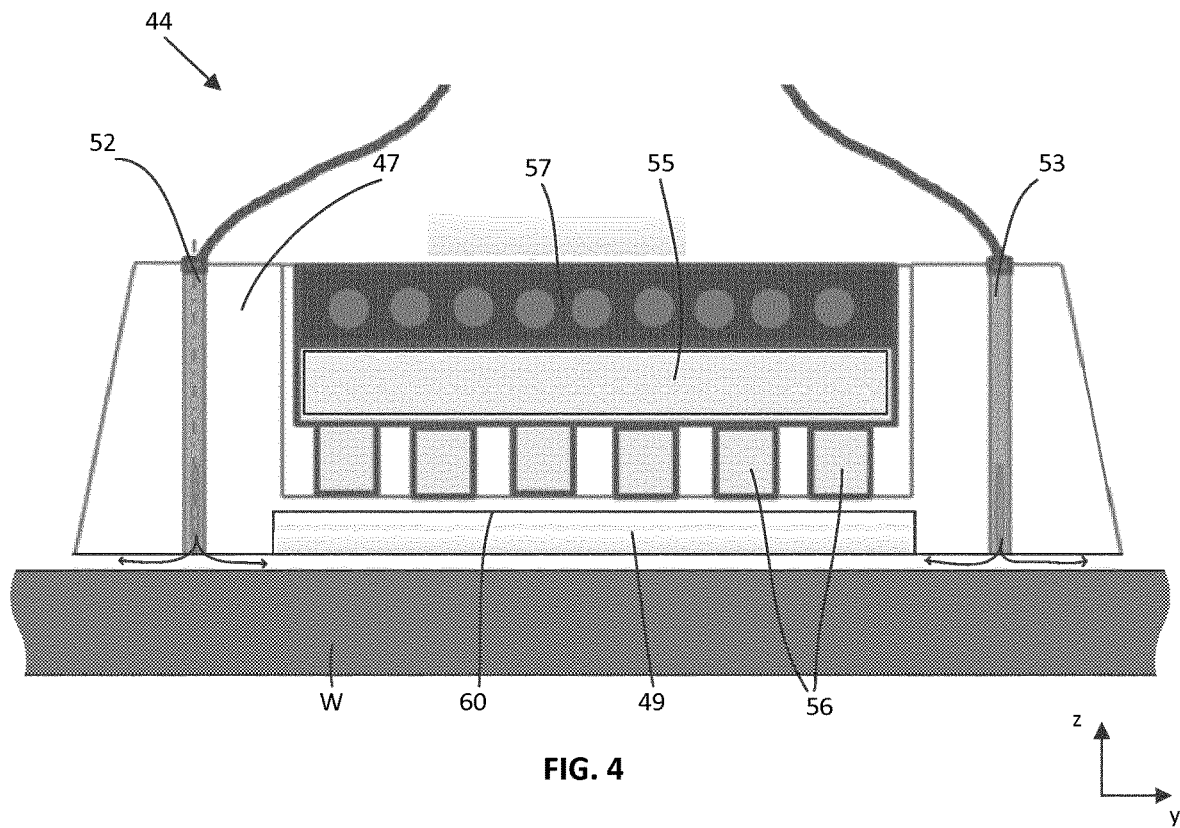
FIG. 4 schematically depicts the cooling apparatus in more detail.

FIG. 4 depicts the second cooling element 44 in more detail. The cavity 49 in the cooling element body 47 can be seen, as can the gas delivery conduits 52, 53. As depicted by arrows in FIG. 4, gas delivered by the gas delivery conduits 52, 53 flows into the cavity 49 and also flows out from underneath the cooling element body 47. Gas is provided from gas supplies which are schematically depicted by curved lines. The gas may for example be hydrogen. Alternatively, any other suitable gas may be used (e.g. another inert gas such as helium or nitrogen).

The second cooling element 44 includes a heat transfer system which is provided in two parts. The first part is a Peltier cooler 55 which is in thermal contact with a portion of the cooling element body 47 located above the cavity 49. Thermal contact between the Peltier cooler 55 and the second cooling element body 47 is provided by an array of thermoelectric elements 56. The thermoelectric elements 56 may be connected electrically in series in a known manner. The second part of the heat transfer system is a cooling fluid system 57 which is in thermal contact with the Peltier cooler 55. The cooling fluid system 57 is an example of a heat removal system. The cooling fluid system 57 comprises a conduit (or conduits) through which cooling fluid is pumped. The cooling fluid may for example be water (or some other suitable fluid). The cooling fluid receives heat from the body of the system 57 and carries that heat away from the second cooling element 44. A cold side of the Peltier cooler (i.e. at distal ends of the thermoelectric elements 56) may for example have a temperature of between around −18° C. and 2° C. The cold side of the Peltier cooler may for example have a temperature of −50° C. or as low as −100° C.

The temperature of the gas as it is introduced from the gas delivery conduits 50-53 may be adapted to the temperature of walls of the gas delivery conduits, for example around 22° C. When the gas is in the cavities it will adapt to the temperatures of the substrate and the Peltier cooler 55. Thus, the gas may for example have a temperature of between around 22° C. (the temperature of the substrate W) and around −50° C. In general, the gas may have a temperature down to for example around −100° C. In general, the gas may have a temperature up to for example around 100° C.

In an embodiment, the X-direction extent of the cavity 49 of the cooling element body 47 may correspond with the maximum X-direction extent of an exposure area E formed by the radiation beam B of the lithographic apparatus. This may for example be 26 mm. Thus, the cavity 49 may have an X-direction extent of around 26 mm. By providing the cavity 49 with an X-direction extent which is equal to the X-direction extent of the exposure area E, the cavity 49 is able to provide cooling across the substrate area which is about to be exposed by the radiation beam or which has just been exposed by the radiation beam (depending on the scanning direction of travel of the substrate W). The consecutive portion to be exposed may also be adjacent to the exposed portion in the scanning direction.

The X-direction extent of the cavity 49 may be greater than the maximum X-direction extent of an exposure area E formed by the radiation beam B. Thus, the cavity 49 may have an X-direction extent of around 26 mm or more.

However, where the X-direction extent of the cavity 49 extends significantly beyond the exposure area E, the cavity will cool part of an adjacent target portion on the substrate W in addition to cooling a target portion which is being exposed. This may cause distortion of the partially cooled adjacent target portion. A potential reduction of overlay accuracy which may be caused by this distortion may be avoided by exposing a substrate using a meander scan in which the next target portion which is exposed is not adjacent to the exposed target portion in the non-scanning direction, but instead is separated from the exposed target portion in the non-scanning direction by at least one interposed target portion (e.g. as described further below with reference to FIG. 35).

In an embodiment, the second cooling element body 47 may for example have a width in the Y-direction of between around 1 cm and around 3 cm (e.g. around 2 cm). The second cooling element body 47 may for example have a height (Z-direction dimension) of between around 2 mm and around 7 mm.

The second cooling element may be configured to cool an area which lies within 3 cm or less from a line which bisects the exposure area E (e.g. from the center of the exposure area). The second cooling element may be configured to cool an area which lies within 2 cm or less from an edge of the exposure area E. Heating of the substrate by radiation delivered to the exposure area drops off as a function of distance from the edge of the exposure area. Beyond around 2 cm from the edge of the exposure area heating of the substrate may be negligible. Thus, cooling an area which lies within around 2 cm from the edge of the exposure area will provide a reduction of the substrate temperature (thereby reducing distortion of the substrate). Cooling an area which extends significantly beyond this will provide a negligible benefit (and would be more difficult to achieve because a larger volume of gas would be needed).

Embodiments of the invention provide localised cooling of the substrate W in a manner not contemplated by the prior art. Embodiments of the invention may prevent localised heating of the substrate occurring to such an extent that significant slippage of the substrate over burls of the substrate table occurs. Improved removal of heat from the substrate W (and thus avoiding burl-slip) may be particularly important when the dose of energy delivered to the substrate is increased relative to a conventionally delivered dose. For example, improving the resolution (e.g. half pitch) of a projected pattern to, for example, 7 nanometres may require an increase of the radiation dose delivered to the substrate (compared with the radiation dose used for a resolution of 15 nanometres).

The separation between the roof 60, 61 of each cavity 48, 49 and the substrate surface, in combination with the pressure of the gas in the cavity, may be selected such that the transfer of heat from the substrate W to the cooling element body 46, 47 is not significantly affected by the accommodation coefficient of the surface of the substrate (which in practice will be the surface of resist provided on the substrate). If the height of the cavity roof 60, 61 and the gas pressure in combination were such that the accommodation coefficient had a significant influence on the heat transfer, then the cooling provided by the cooling elements 42, 44 would vary depending upon properties of the resist on the substrate W which may be unknown. This is undesirable because the cooling which is provided by the cooling elements 42, 44 would then be unknown. As a result it might not be possible to control the temperature of the substrate W with a desired accuracy, or to control the thermal load applied to the substrate with a desired accuracy.

The extent to which the accommodation coefficient of a material has an effect upon the transfer of heat from the surface of that material to another body depends upon the separation between the material surface and the body and the pressure of the gas via which the heat exchange may take place. If the separation is sufficiently small and the gas pressure is sufficiently low then the accommodation coefficient will have a significant effect upon the heat transfer. This is because a given gas molecule will not immediately adapt to the temperature of a material when it is incident upon and reflected from the surface of that material. Typically, around 30% of gas molecules will adapt to the temperature of material. However, this will vary for different materials according to the accommodation coefficient. If the body is sufficiently close to the surface of the material, and the gas pressure is sufficiently low, then there is a significant chance that a gas molecule will be incident upon the surface of the material and then incident upon the body without any further interactions (i.e. without being incident upon the material surface again and without colliding with other gas molecules). In such a circumstance, the heat transfer which occurs will depend upon the accommodation coefficient of the material surface. Increasing the pressure of the gas will cause more interactions between gas molecules to take place before a gas molecule is incident upon the body, and as a result of this gas molecules in the vicinity of the material surface are more likely to adapt to the temperature of the material surface. Similarly, moving the body further away from the material surface will also increase the number of molecule-molecule interactions which take place before gas molecules are incident upon the body. Again, this helps to ensure that the molecules adapt to the temperature of the material surface before they are incident upon the body. Thus, the influence of the accommodation coefficient reduces as the gas pressure is increased and as the separation between the material surface and the body is increased. If the pressure and separation are sufficiently large (in combination) then the accommodation coefficient will not have a significant effect upon the heat transfer. This may be referred to as the normal-pressure regime (as explained further below in connection with FIG. 6).

In the present case the separation between the substrate surface and the roof 60, 61 of the cavity 48, 49 in combination with the pressure of the gas in the cavity may be such that the accommodation coefficient does not have a significant effect upon the heat transfer. That is, the cooling element 42, 44 operates in the normal-pressure regime. Providing gas at a pressure of around 1,000 Pascals and a separation between the substrate W (i.e. resist upper surface) and the cavity roof 60 of 0.5 mm will ensure that the accommodation coefficient of the resist does not have a significant effect upon the transfer of heat from the resist to the cooling element 42. In another example, providing a separation between the substrate W and the cavity roof 60 of 1 mm and gas at a pressure of 500 Pascals will also ensure that the accommodation coefficient of the resist does not have a significant effect upon the transfer of heat from the resist to the cooling element 42. In another example, providing a separation between the substrate W and the cavity roof 60 of 2 mm and gas at a pressure of 250 Pascals will also ensure that the accommodation coefficient of the resist does not have a significant effect upon the transfer of heat from the resist to the cooling element 42.

Figure 6:
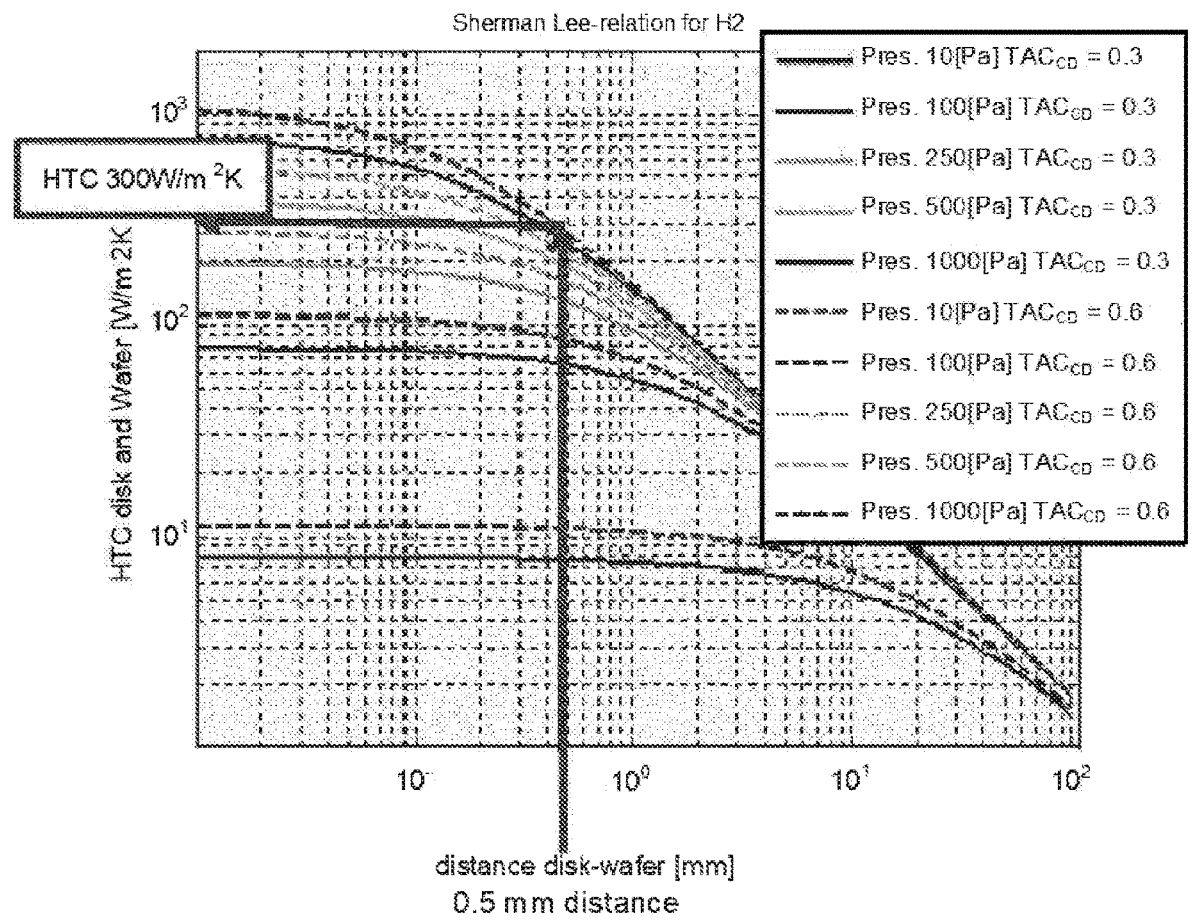
FIG. 6 is a graph which illustrates the effect of an accommodation coefficient upon embodiments of the invention.

FIG. 6 is a graph which illustrates how the coefficient of heat transfer by gas between two surfaces varies as a function of distance between those surfaces at different gas pressures. Two sets of curves are shown, a set having solid lines and a set having dashed lines. The solid lines indicate the coefficient of heat transfer when one of the surfaces has an accommodation coefficient of 0.3. The dashed lines indicate the coefficient of heat transfer when one of the surfaces has an accommodation coefficient of 0.6. The lowermost curves represent gas pressure of 10 Pascals, and the uppermost curves represent gas pressure of 1000 Pascals, with the gas pressures increasing between those two pressure values. An arrow indicates a separation between surfaces of 0.5 mm and the heat transfer coefficient (around 300 W/m$^2$K) that will occur at a gas pressure of 1000 Pascals. As may be seen, at this separation and pressure switching between an accommodation coefficient of 0.3 (solid line) and an accommodation coefficient of 0.6 (dashed line) does not have a significant effect upon the heat transfer coefficient (e.g. changes the heat transfer coefficient by less than 10%, e.g. less than 5%). As the separation between the surfaces decreases (e.g. to 0.1 mm) the accommodation coefficient can be seen to have a significant effect upon the heat transfer coefficient. As may be seen from the graph, for a lower pressure of gas (e.g. 500 Pascals) a larger separation (e.g. 1 mm) may similarly provide a heat transfer coefficient which is not significantly affected by the accommodation coefficient.

In an embodiment in which hydrogen gas is provided at a pressure of around 1,000 Pascals and the separation between the resist surface and the cavity roof 60 is around 0.5 mm, the heat transfer accommodation coefficient between the resist surface and cavity roof 60 is around 300 W/m$^2$K.

In an embodiment, actuators (not shown) may be provided to vary the separation between the resist surface and the cavity roof 60. For example, actuators may be provided on the cooling apparatus 40 so as to raise and lower the cooling apparatus with respect to the substrate W. In this way, the heat transfer coefficient between the resist surface and the cavity roof 60 may be adjusted. It may, for example, be desirable to adjust an amount of cooling that is provided to the substrate W during scanning between exposure areas, or to address fluctuations in temperature. In some embodiments, sensors (not shown) are provided to determine a distance between the cavity roof 60 and the substrate W.

The amount of heat which is transferred from the substrate W to the cooling element 44 depends upon the accommodation coefficient and also upon the difference in temperature between the substrate and the cooling element. The substrate W and substrate table WT may generally have a temperature of around 22° C. The cooling element 44 may be held at a temperature which is for example between around 20° C. and 40° C. below the temperature of the substrate W and substrate table WT. For example, the cooling element 44 may for example be held at a temperature of between −18° C. and 2° C. This provides cooling of around 6000-12000 W/m$^2$K. The cooled area provided by the cooling element 44 may measure 26 mm by 10 mm in an embodiment. In such a case the second cooling element 44 will remove around 1.5-3 W from the substrate. The first and second cooling elements together will remove around 3-6 W from a substrate.

The Peltier cooler 55 transfers heat from the bottom of the cooling element body 47 to the liquid cooling system. The liquid cooling system 57 carries the heat away from the cooling element to a remote heat transfer system.

Figure 5:
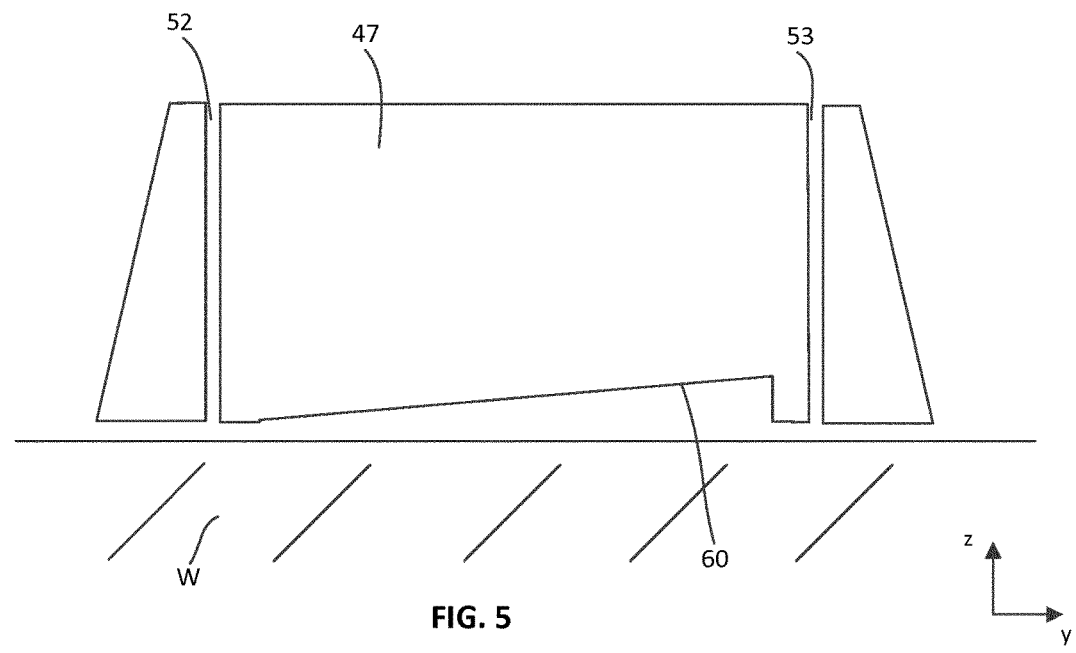
FIG. 5 schematically depicts an alternative embodiment of the cooling apparatus.

Although the cavity 48, 49 is illustrated as having a roof which lies in the XY plane, in an embodiment the roof may be tilted about the X-direction. An example of such an embodiment is shown in FIG. 5. Details of the embodiment which correspond with the embodiment of FIG. 4 (e.g. the Peltier cooler) are omitted for simplicity. In the FIG. 5 embodiment the cavity roof 60 has a height of around 0.5 mm at one end and slopes down to a zero height (or a close to zero height) at the opposite end. In an embodiment with a sloping cavity roof 60 the accommodation coefficient will become more significant as the roof height decreases. The accommodation coefficient will thus have a significant effect upon the heat transfer provided by the embodiment depicted in FIG. 5. Although the disadvantage explained above will arise, an advantage of the sloping cavity roof 60 is that the reduced gap between the roof and the substrate surface allows more efficient transfer of heat to take place. A cavity with a slopping roof may for example by used if anticipated variations of the accommodation coefficient between substrates W are sufficiently small that cooling can be controlled sufficiently accurately. Conversely, if significant variation of the accommodation coefficient of different substrates W is expected then the embodiment shown in FIG. 4 in which the cavity roof 60 is not sloping may be preferred.

Contamination molecules will leave the surface of the resist on the substrate W regularly and are a significant source of potential contamination of optics in the projection system PS (see FIG. 1). In order to prevent or reduce entry of contamination into the projection system PS a flow of gas may be provided from the projection system towards the substrate W. The cooling elements 42, 44 may be configured such that they do not generate a jet of gas which is likely to push contaminates up into the projection system. In other words, the cooling elements 42, 44 may be configured such that they do not generate a jet of gas travelling upwards in the Z-direction which is sufficiently strong to overcome the flow of gas travelling downwards in the Z-direction and out of the projection system PS. The narrow gap between the lowermost surface of the cooling elements 42, 44 and the substrate W (e.g. between 20 microns and 200 microns) may prevent a jet of gas been generated which could carry contamination into the projection system PS.

It may be desirable to maintain a gap between the cooling elements 42, 44 and the substrate, and in particular to prevent contact occurring between the cooling elements and the substrate. Also, outgassing of resist during exposure may produce chemical species (typically hydrocarbons or other molecules) which stick and alter the thermal accommodation of the lowermost surface of the cooling elements, impacting the total power transferred from the substrate to the cooling element. Experiments have shown that metal coatings can have significantly different thermal accommodation coefficient than resist (outgassing). In an embodiment, the lowermost surface of the cooling elements is coated with a layer of (or alternatively is completely made from) a coating material having resist-like properties.

For example the coating material is a non-metallic material, such as a polymeric material. The coating material may comprise the same chemical elements that are present in resist outgassing, for example carbon and hydrogen. An example of such material is parylene.

The coating material may also be a non-conducting material with low polarizability, such that it has a low van der Waals attraction well (like for resist outgassing). The coating material may also have a similar relative low accommodation coefficient as the resist, for example by combining a metal or semiconductor (with a high van der Waals attraction well), but with a mass ratio that is large (i.e. a material made of high mass-number chemical element) in order to reduce the effective heat transfer despite the high van der Waals attraction.

Combinations of materials mentioned above are also possible as long as that ensures that the thermal accommodation coefficient of the lowermost surface of the cooling element does not change in time (or only insignificantly).

In another embodiment for preventing contact occurring between the cooling elements and the substrate, an outward flow of gas from underneath the cooling element bodies 46, 47 may provide a cushion which prevents or inhibits contact occurring between the cooling elements and the substrate. This cushion of gas may be referred to as a gas bearing foot.

In an alternative arrangement the cooling elements 42, 44 may be mounted to the projection system PS of the lithographic apparatus LA. The cooling elements may be held by a support which includes a mechanism that moves the cooling elements to a desired height above the substrate table WT. The support may include a retraction mechanism which is configured to pull the cooling elements away from the substrate if unexpected movements are detected. This mechanism may form part of a more general safety mechanism which is triggered if unexpected movements occur within the lithographic apparatus (e.g. in the event of an earth tremor). The retraction mechanism may also be used to lift the cooling elements before they pass over sensors provided in the substrate table WT.

The surface of the substrate (in practice the surface of the resist provided on the substrate) is such that variations in height are less than 1 micron. The gap between the cooling elements 42, 44 and the substrate may be 20 microns or more, e.g. 50 microns or more. As a result, a mechanism which moves the cooling elements 42, 44 up and down to accommodate for the topology of the substrate W is not required.

During scanning exposure of a substrate a significant period of time elapses between exposure of a given target portion (e.g. a die) on the substrate W and exposure of the next target portion (e.g. a die). During this time the radiation beam B is not incident upon the substrate W and heating of the substrate by the radiation beam therefore does not take place. Although heating is not taking place during this time the Peltier cooler 55 and fluid cooling system 57 continue to operate. Attempting to switch off the Peltier cooler 55 between exposures is not desirable because the speed of response of the Peltier cooler 55 may not be sufficiently fast. Furthermore, switching the Peltier cooler on and off is liable to reduce the life time of the Peltier cooler. A valve may be used to switch off the supply of gas to the cavities 48, 49 when moving between target portions and switch the supply of gas on when a target portion is to be exposed. The valve may operate with a time constant of less than around 5 ms and may operate with a time constant of approximately 3 ms.

Although the cooling elements 42, 44 each comprise a Peltier cooler 55 and a fluid cooling system 57, any suitable heat removal system may be used to remove heat from the cooling elements. For example, a fluid cooling system which uses fluid at a lower temperature may be used without a Peltier cooler. For example, instead of water a fluid such as glycol which remains liquid below 0° C. may be used.

Figure 7:
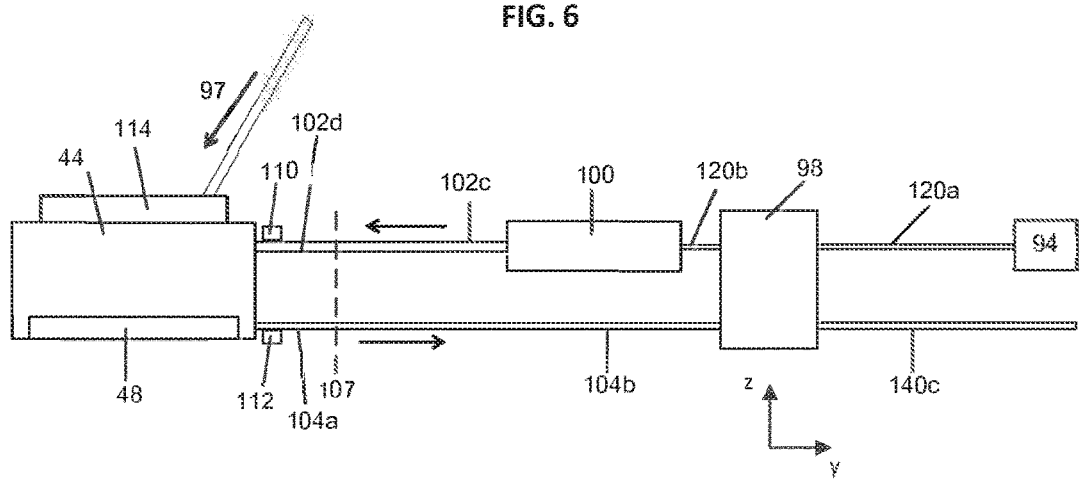
FIG. 7 schematically depicts an embodiment of the invention provided with alternative heat removal system.

An alternative heat removal system is schematically depicted in FIG. 7. In FIG. 7 a cooling element 44 with a cavity 48 is shown. Gas is delivered to the cavity by a gas delivery conduit 97. The pressure of gas in the cavity 48 may be controlled by controlling the pressure of gas delivered via the gas delivery conduit 97 (as is also the case for other embodiments). The cooling element 44 may for example have the same configuration as cooling elements described above, except that it does not comprise a Peltier cooler and fluid cooling system. Instead, heat removal from the cooling element 44 is performed by pumping nitrogen gas (or some other suitable gas) into and out of the cooling element. The gas may be cold when it is delivered to the cooling element 44 (i.e. colder than the cooling element) and therefore receives heat from the cooling element.

The gas is delivered from a gas source 94 via a first inlet conduit portion 102a to a heat exchanger 98. The gas is pre-cooled by the heat exchanger 98 and then passes via a second inlet conduit portion 102b to a Peltier cooler 100. The gas is cooled by the Peltier cooler 100 and then travels via a third inlet conduit portion 102c and a fourth inlet conduit portion 102d to the cooling element 44.

The gas receives heat from the cooling element 44 and then the heated gas passes out of the cooling element and along a first outlet conduit portion 104a. The heated gas travels through a second outlet conduit portion 104b to the heat exchanger 98. The gas then travels from the heat exchanger along a third outlet conduit portion 104c to an external location. In this way heat is removed from the cooling element 44 and is carried away from the cooling element.

The gas may for example be provided by the gas source 94 at a rate of more than 10 l/min. the gas may for example be provided at a rate of 20 l/min or more (e.g. up to 50 l/min). The gas may be cooled to a temperature of for example −30° C. by the Peltier cooler 100 before it enters the cooling element 44. The gas is heated by a few degrees in the cooling element 44 (e.g. heated by less than 5° C.), and may for example have a temperature of −26° C. when it leaves the cooling element. This increase in temperature of the gas corresponds with removal of heat from the cooling element 44. The gas travels along the outlet conduit 104 to the heat exchanger where it exchanges heat with gas from the gas source 94. The gas from the gas source 94 may have a temperature which is considerably higher than −26° C. and thus is cooled by the outlet gas. The outlet gas is correspondingly warmed by the gas from the gas source 94.

The high flow of gas (i.e. more than 10 l/min) advantageously limits the thermal gradient in the cooling element 44. The thermal gradient in the cooling element may for example be limited to less than 1° C.

The Peltier cooler 100 and heat exchanger 98 are located remotely and are not located beneath the projection system PS of the lithographic apparatus LA (see FIG. 1). The Peltier cooler 100 and heat exchanger 98 may have fixed positions within the lithographic apparatus LA. The Peltier cooler 100 may be located within a vacuum area of the lithographic apparatus or may be located within a non-vacuum area of the lithographic apparatus. Similarly, the heat exchanger 98 may be located in a vacuum area of the lithographic apparatus or may be located in a non-vacuum area of the lithographic apparatus.

The Peltier cooler may for example be located 0.5 mm or more away from the cooling element 44. An advantage of providing the Peltier cooler 100 away from the cooling element 44 is that more space is available to accommodate the Peltier cooler (the space beneath the projection system PS within which the cooling element 44 can be accommodated is very limited). Thus, a larger Peltier cooler 100 may be used. The Peltier cooler 100 may for example be a two-stage or three-stage (or more) Peltier cooler. This allows a larger reduction of temperature to be achieved than is possible using a smaller Peltier cooler located in the cooling element 44 (e.g. as depicted in FIG. 4).

The cooling element 44 may be moveable in the z-direction (as explained elsewhere in this document). The Peltier cooler 100 and heat exchanger 98 may be fixed (i.e. not moveable). The fourth inlet conduit portion 102*d* is flexible in order to allow movement of the cooling element 44 relative to the Peltier cooler 100. A dashed line 107 schematically depicts a point at which a non-flexible portion 102*c* of the inlet conduit connects to a flexible portion 102*d* of the inlet conduit. For the same reason, the first outlet conduit portion 104*a* is also flexible. The dashed line 107 schematically depicts a point at which the flexible portion 104*a* of the outlet conduit connects to a non-flexible portion 104*b* of the outlet conduit.

A temperature sensor 110 is provided on the inlet conduit 120*d*, for example in the vicinity of the cooling element 44. A temperature sensor 112 is provided on the outlet conduit 104, for example in the vicinity of the cooling element 44. These temperature sensors 110, 112 may be used to monitor the temperature of the gas entering the cooling element 44 and leaving the cooling element. This in turn allows a calculation of the amount of heat being removed from the substrate W by the cooling element 44, and thus may provide an indication of the temperature of the substrate. Feedback and/or feedforward correction may be used to adjust the temperature of the gas delivered to the cooling element 44 and/or to adjust the flow rate of the gas in order to adjust the amount of cooling applied to the substrate W.

Although the illustrated embodiment uses a Peltier cooler 100 any suitable cooler may be used. For example, a Joule Thompson cooler may be used or liquid nitrogen cooling may be used.

Because a remotely located cooler 100 (e.g. Peltier cooler) is used this allows the gas delivered by the inlet conduit 102 to be cooled to a lower temperature than would be possible if the Peltier cooler was located in the cooling element 44. This in turn allows a bigger difference to be achieved between the temperature of the cooling element 44 and the temperature of the substrate WT. This in turn provides more design freedom for the cooling element 44, for example allowing the cooling element to have a smaller footprint. Providing the cooling element with a smaller footprint allows a higher pressure of gas in the cavity 48 to be used without increasing the force applied to the substrate by the gas in the cavity 48. This in turn allows operation in the normal-pressure regime or close to the normal-pressure regime (pressure regimes are described above in connection with FIG. 6). This makes the cooling provided by the cooling element 44 less dependent upon the accommodation coefficient of the resist on the substrate W, leading to the cooling element provide a more consistent performance for substrates with different resists.

Additional advantages of the embodiment depicted in FIG. 7 over the embodiment of FIG. 4 are that no water is provided to a component above the substrate, thereby avoiding the possibility of water leaking onto the substrate and also avoiding vibrations which may be caused by pumping water.

A further advantage is that the substantial amount of heat dissipation needed due to the presence of the hot side of the Peltier in the embodiment of FIG. 4 is avoided. The cold load to the environment of the embodiment depicted in FIG. 7 may be very limited (e.g. less than 50 mW). This also makes it possible to easily measure the heat being removed from the substrate by measuring the temperature of the gas delivered to the cooling element 44, the temperature of the gas on leaving the cooling element, and measuring the flow of the gas.

In addition, less components are required in the cooling element 44, thereby simplifying the design of the cooling element and reducing the number of elements which may fail during operation of the lithographic apparatus LA.

In the embodiment of FIG. 7, or other embodiments of the invention, the cooling element 44 may include a heater 114 which may be used to effectively nullify the cooling provided by the cooling element 44 for a desired period of time. The heater 114 may be used for example when it is not desired to provide cooling using the cooling element 44 (e.g. if the cooling element is passing over a sensor of the lithographic apparatus). Using a heater to nullify the effect of the cooling element 44, instead of interrupting operation of the cooling element, avoids problems which may be caused by interrupting operation of the cooling element 44. For example, stopping flow of the gas to and from the cooling element 44 in the embodiment depicted in FIG. 7 will change the temperature of the gas in the inlet conduit 102 and the outlet conduit 104. A consequence of these changes of the gas temperature is that when the cooling element 44 resumes operation it will cool the substrate to a different temperature than was previously the case, until the temperature of the gas has stabilised. It will be appreciated that in other embodiments, the heater 114 (or alternative or additional heaters) may be provided at other locations within the system. For example, a heater may be provided on or within the inlet conduit (e.g., the inlet conduit 102*d*) to provide for more rapid heating of the coolant fluid that is provided to the cooling element 44.

A further alternative embodiment of the cooling system for the cooling element 44 has a configuration which corresponds with that depicted in FIG. 7 but uses a significantly smaller flow of gas from the gas source 94. For example the flow of gas may be less than 5 l/min, and may be around 2 l/min or less. Because the gas is supplied to the cooling element 44 and removed from the cooling element 44 at a slower rate, the temperature of the gas when it leaves the cooling element is higher (compared with the temperature of the gas when the gas is supplied at a higher flow rate in the manner described above). For example, instead of experiencing a temperature increase of around 4° C. the gas may experience a temperature increase of around 50° C. The temperature of the gas on entering the cooling element 44 may be around −30° C. and the temperature on leaving the cooling element may for example be around 22° C. The temperature of the gas on leaving the cooling element may correspond with the desired temperature of the substrate which is being cooled. Providing a smaller flow of gas to the cooling element 44 in this manner is advantageous because it supplies a cold load which is equal to the amount of heat that is needed to be removed from the substrate.

Figure 8:
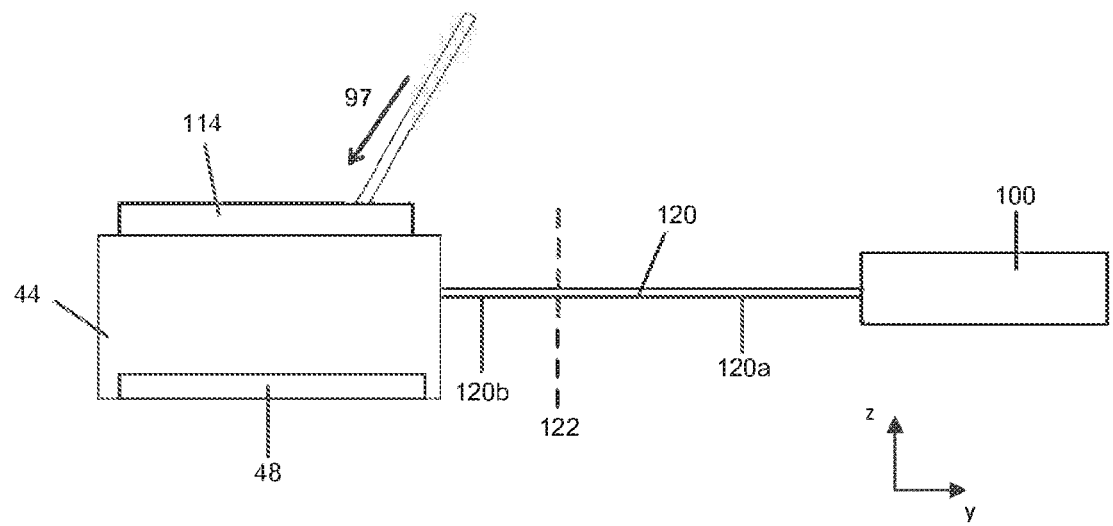
FIG. 8 schematically depicts an embodiment of the invention provided with a further alternative heat removal system.

A further alternative cooling system is schematically depicted in FIG. 8. In common with the embodiment depicted in FIG. 7, the cooling element 44 includes a cavity 48 and a gas delivery conduit 97 configured to deliver gas to the cavity. In this cooling system a heat pipe 120 is connected to the cooling element 44 at one end and is connected to a Peltier cooler 100 or other cooler at the opposite end. The heat pipe may comprise a rigid portion 120*a* and a flexible portion 120*b*. The location at which the flexible portion 120*b* is connected to the rigid portion 120*a* is schematically indicated by a dashed line 122. The flexible portion 120*b* of the heat pipe allows for some movement of the cooling element 44 relative to the Peltier cooler 100.

The heat pipe may for example have a cross-sectional shape which is larger in a horizontal direction (e.g. in the x-y plane) than in the vertical direction (i.e. z-direction). An advantage of the heat pipe 120 being bigger in a horizontal direction than in a vertical direction is that this allows the heat pipe to more easily be accommodated beneath the projection system PS (space between the projection system PS and the substrate W may be very limited). In an embodiment, the rigid portion 120*a* of the heat pipe may be larger in the vertical direction than the flexible portion 120*b* of the heat pipe.

The heat pipe may for example be a micro heat pipe, i.e. configured with sharp edges which act to transfer fluid via capillary action such that no wick is necessary.

In common with the embodiment described above in connection with FIG. 7 the Peltier cooler 100 is merely an example of a cooler, and any other form of cooler may be used. The cooler may be located remotely from the projection system PS of the lithographic apparatus LA (see FIG. 1), for example 0.5 meters or more away from the projection system.

Other advantages of the embodiment of FIG. 8 generally correspond with those explained further above in connection with FIG. 7. The remotely located Peltier cooler 100 allows the cooling element 44 to be cooled to a lower temperature. This allows the cooling element to have a smaller footprint, which allows a higher pressure of gas in the cavity 48. No water is provided to a component above the substrate. The hot side of the Peltier cooler is not located in the vicinity of the substrate which is being cooled. Less components are required in the cooling element 44, thereby simplifying the design of the cooling element.

Figure 9:
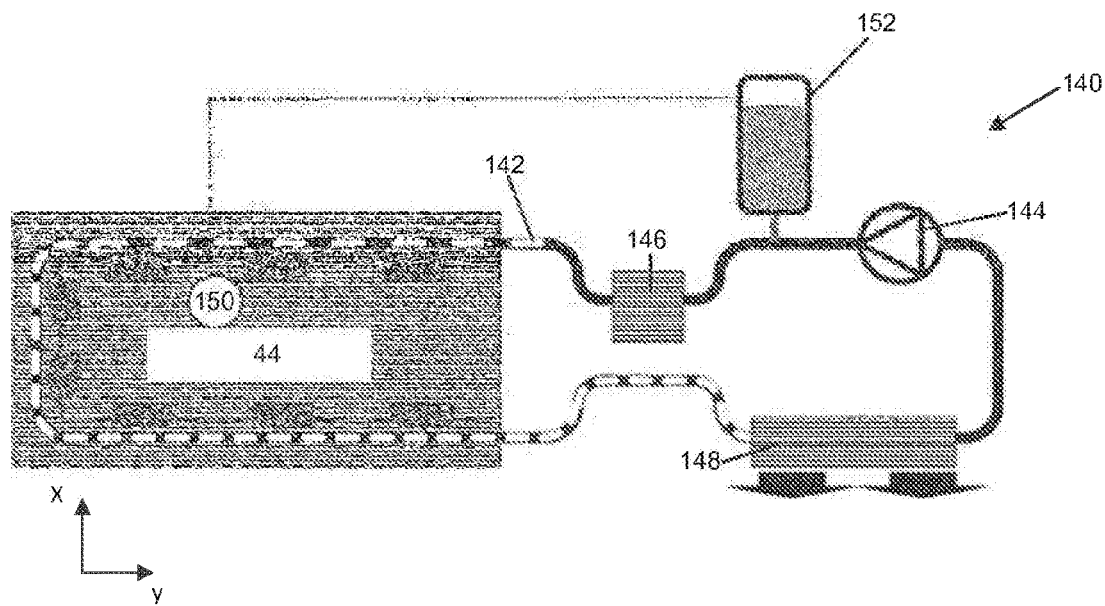
FIG. 9 schematically depicts an embodiment of the invention provided with a further alternative heat removal system.

A further alternative embodiment of the cooling system is schematically depicted in FIG. 9. This comprises a two-phase cooling system 140 in which a coolant is pumped around a coolant loop 142. The coolant removes heat from the cooling element 44 via evaporation from a liquid form to a vapour form. The two-phase cooling system comprises a pump 144, a pre-heater 146, and a condenser 148. The cooling system in addition comprises a temperature sensor 150 and an accumulator 152 which stores pressurized cooling fluid and which adjusts the pressure of the coolant delivered to the loop 142.

In operation, the coolant, which is in liquid form, is pumped by the pump 144 through the pre-heater 146. This sets the temperature of the coolant to a desired temperature. The coolant then enters the cooling element 44 and travels around the cooling element. The coolant receives heat from the cooling element 44 and evaporates to vapour form. This removes heat from the cooling element 44. The coolant fluid passes to the condenser 148 which removes heat from the coolant (e.g. using a heat exchanger which uses water or some other coolant). The coolant condenses to liquid form whilst travelling through the condenser 148. The condensed coolant, which is now in liquid form, then passes to the pump 144 from where it is once again pumped around the loop 142.

The states of the coolant in the loop 142 are schematically indicated by the form of the line of the loop. A solid line indicates that the coolant is in liquid form. A dashed line indicates that the coolant is at least partially in vapour form.

The temperature of the cooling element 44 is measured by the temperature sensor 150. The accumulator 152 is controlled to adjust the pressure of the coolant in the loop 142 in response to the temperature measured by the temperature sensor 150. Thus, if the measured temperature is too high the pressure of coolant in the loop 142 is increased in order that the coolant will remove more heat from the cooling element 44. Similarly, if the temperature measured by the temperature sensor 150 is too low then the accumulator 152 is used to reduce the pressure of the coolant in order to reduce the amount of heat which is removed from the cooling element 44 by the coolant.

Any suitable coolant that will provide two-phase cooling may be used. For example, the coolant may be $CO_2$, R134a or R1234ze.

An advantage of the embodiment depicted in FIG. 9 is that it does not require an additional heater in order to apply rapid adjustments to the amount of cooling provided to the cooling element 44 (the adjustment is obtained via the accumulator 152).

Other advantages of the embodiment of FIG. 9 generally correspond with those described further above in connection with the embodiments of FIGS. 7 and 8. The two-phase cooling system 140 allows the cooling element 44 to be cooled to a lower temperature. This allows the cooling element to have a smaller footprint, which allows a higher pressure of gas in the cavity 48. Having a hot side of a Peltier cooler in the vicinity of the substrate is avoided. Fewer components are required in the cooling element 44, thereby simplifying the design of the cooling element.

Figure 10:
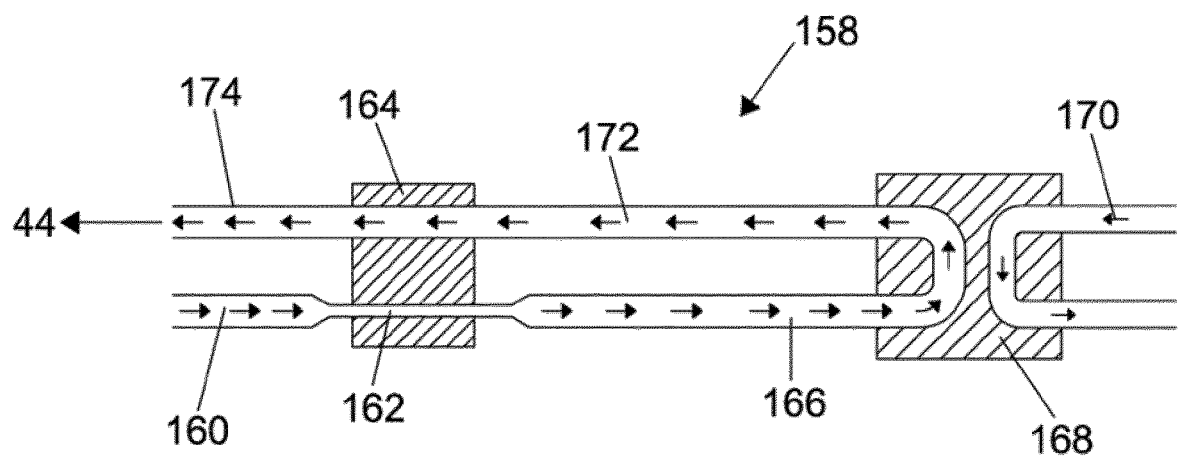
FIG. 10 schematically depicts a further alternative heat removal system which may form part of an embodiment of the invention.

FIG. 10 schematically depicts a cooler 158 which may be used to deliver cooled gas to the cooling element 44 instead of the Peltier cooler 100 depicted in FIGS. 7 and 8. The cooler 158 includes a constriction 162 which increases the rate of flow of the gas. The constriction expands the gas, as a result of which the mass flow of the gas stays the same but the volume flow increases, thereby lowering the temperature of the gas.

Gas traveling through an inlet conduit 160 of the cooler 158 may be at around room temperature (e.g. 22° C.). The gas passes through a constriction 162 which acts to increase the rate of flow of gas and thereby lower the temperature of the gas. Because the gas velocity inside the constriction 162 is significantly higher than before the gas entered the constriction, the gas temperature is significantly lower and may for example be around 2° C. The constriction is located inside a first heat exchanger 164. Because the temperature of the gas inside the constriction 162 is low, the gas absorbs heat from the first heat exchanger 164. The temperature of the heat exchanger may for example be around 12° C.

Upon leaving the constriction 162, the gas enters a second gas conduit 166 which has a larger diameter than the constriction (e.g. the same diameter as the first gas conduit 160). The gas thus decelerates to a lower gas velocity. Because the gas has received heat from the heat exchanger 164 the gas now has a higher temperature than its initial temperature. The gas may for example have a temperature of around 32° C.

The gas travels along the second gas conduit 166 to a second heat exchanger 168 where heat is removed from the gas and transferred to water (or some other fluid delivered by a conduit 170). This may cool the gas to for example a temperature of around 22° C. The gas then travels along a third gas conduit 172 and back through the heat exchanger 164. This cools the gas by a significant amount, for example several ° C. The cooled gas, which may for example have a temperature of around 12° C., is then delivered via a fourth gas conduit 174. The fourth gas conduit 174 may be connected to the cooling element 44.

In an alternative configuration the first heat exchanger 164 may be the cooling element.

The diameter of the constriction 162 may be tuned to provide high flow velocities. A temperature drop of around 9° C. may be achievable when the velocity is the speed of sound. A flat tube with length 10 cm and cross-section 5×0.5 mm, and an upstream pressure of 180 mbar and a downstream pressure of 20 mbar will achieve about 1000 m/s gas velocity in the last centimetre and roughly 300 m/s in the first nine centimetres, at a hydrogen flow rate of 100 mbar l/s.

Advantages of the embodiment depicted in FIG. 10 generally correspond with advantages described above in connection with FIGS. 7-9. The embodiment allows the cooling element 44 to be cooled to a lower temperature. This allows the cooling element to have a smaller footprint, which allows a higher pressure of gas in the cavity 48. Having a hot side of a Peltier cooler in the vicinity of the substrate is avoided. Less components are required in the cooling element 44, thereby simplifying the design of the cooling element.

Generally, FIGS. 7 to 10 have depicted exemplary embodiments in which coolers and heaters are provided in different arrangements. It will be appreciated that in each of the depicted exemplary embodiments, other heaters and/or coolers may be provided at different locations of the cooling system.

A cooling element 202 according to an embodiment of the invention is schematically depicted in cross-section in FIG. 11. The cooling element 202 may form part of a cooling apparatus 40 of the lithographic apparatus (see FIG. 1). As indicated by the Cartesian coordinates in FIG. 11, the cross-section is along the X-direction (in contrast to preceding figures which have shown a cross-section in the Y-direction). The cooling element 202 may include features which have been described above in connection with other embodiments. For brevity these are not included in the description of this embodiment. Thus, for example, the embodiment may include a heat removal system such as a Peltier cooler and a fluid cooling system. Similarly, for example, the embodiment may include a retraction mechanism. Considerations explained further above relating to the pressure of gas and the separation between the cooling element 202 and the substrate may apply in connection with this embodiment (and in connection with other embodiments).

The cooling element 202 comprises a body 204 connected to a gas delivery conduit 206 which receives gas via a valve 208. A chamber 210 within the body 204 receives gas from the gas delivery conduit 206. The body 204 has a floor 212 which forms a lowermost surface of the chamber 210. The floor 212 is provided with holes 214 through which gas can flow from the chamber 210. The cooling element 202 is located above a substrate W, and the gas which passes out of the holes 214 fills a space between the cooling element 202 and the substrate W until it flows out from beneath the cooling element (as schematically depicted by arrows). The gas has a lower temperature than the substrate W. The gas facilitates transfer of heat from the substrate W to the cooling element 202 (which has a lower temperature than the substrate). The gas thus acts to cool the substrate. The gas, which may be referred to as cooling gas (or as a bearing gas), may for example be Hydrogen (or an inert gas such as Nitrogen). Appropriate temperatures which may be used for the cooling gas (and the cooling element 202) are discussed elsewhere in this document in connection with other embodiments.

Figure 11A:
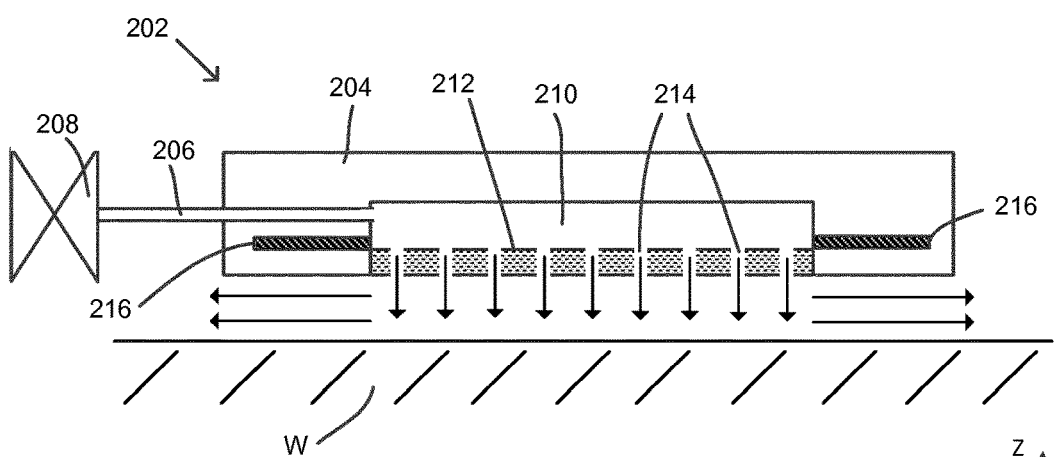
FIGS. 11A-11B schematically depict in cross section a cooling element according to an embodiment of the invention.

The holes 214 may be distributed across the floor 212. The holes 214 may for example measure at least 10 microns across. The holes 214 may for example measure up to 50 microns across. The holes 214 may be provided in a single row or as a two-dimensional array. A separation of at least 100 microns may be provided between adjacent holes 214. A separation of up to 1 mm may be provided between adjacent holes 214. The separation between adjacent holes in the X-direction may be different from the separation between adjacent holes in the Y-direction. The holes 214 may for example be formed using laser drilling. Although nine holes are depicted in FIG. 11A (and 5 holes in FIG. 11B) this is merely a schematic illustration, and any suitable number of holes may be used.

Figure 11B:
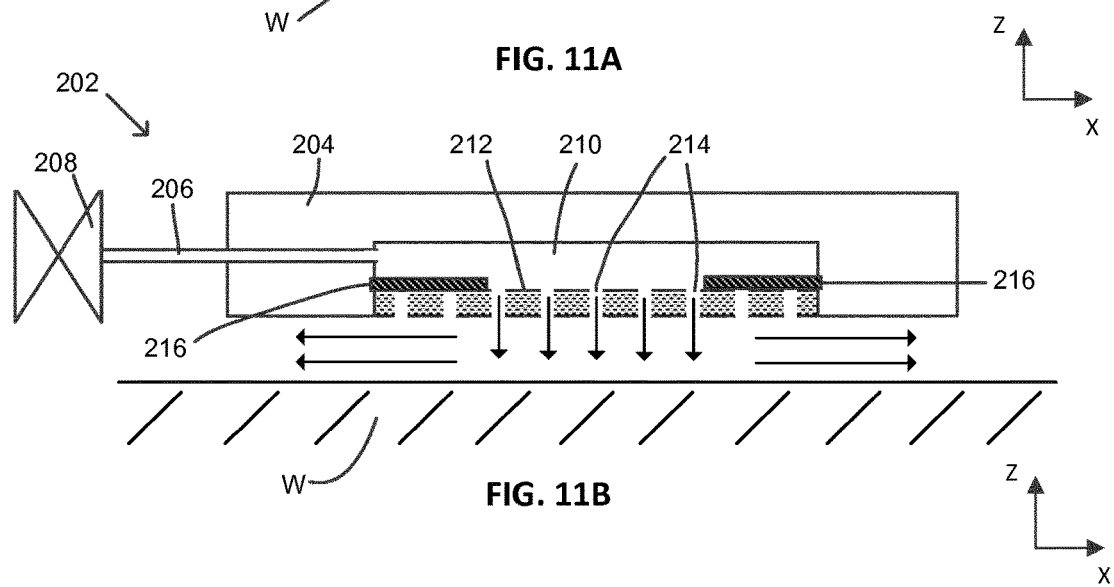

The cooling element 202 further comprises shutters 216. The shutters 216 are movable in the X-direction (the non-scanning direction) and act to close some of the holes 214 in the floor 212 of the chamber 210. In FIG. 11A the shutters 216 are in a first position in which they do not close holes 214 in the floor 212. This position may be referred to as the retracted position. In FIG. 11B the shutters 216 have been moved to a position in which they close some of the holes 214 in the floor 212 of the chamber 210. This position may be referred to as the deployed position. As may be seen from comparing FIG. 11A with FIG. 11B, the X-direction dimension of the substrate area onto which cooling gas is incident is reduced when the shutters 216 are moved from the retracted position to the deployed position. This is advantageous for the reasons discussed below in connection with FIG. 12.

Figure 12:
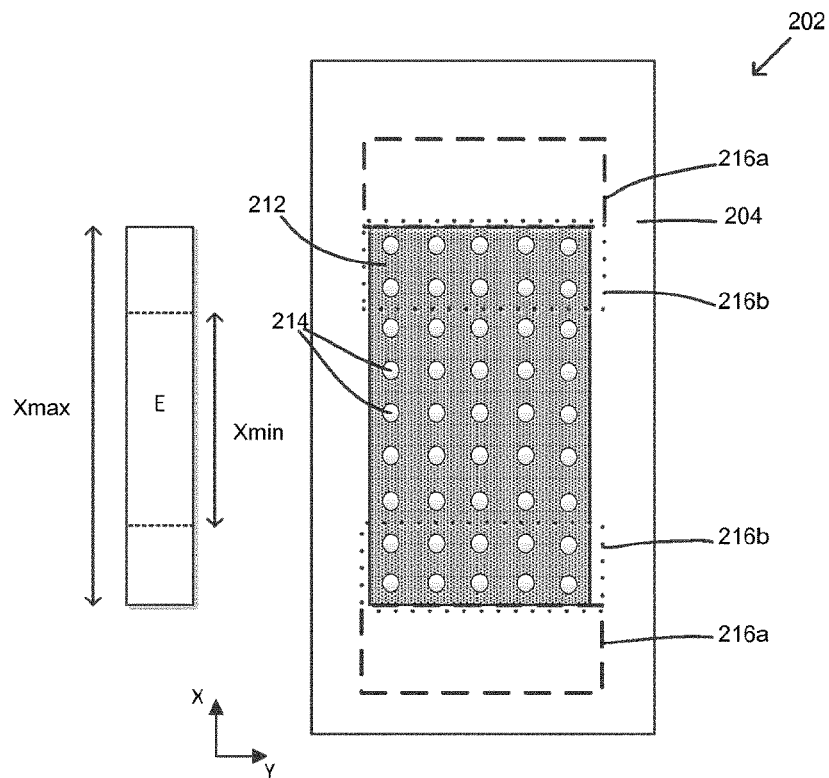
FIG. 12 schematically depicts viewed from below the embodiment of FIG. 11.

FIG. 12 schematically depicts the cooling element 202 viewed from below. Also depicted in FIG. 12 is the exposure area E which is illuminated by the radiation beam B of the lithographic apparatus LA (see FIG. 1). The body 204 of the cooling element 202 forms an outer perimeter which surrounds the floor 212 of the cooling element. The floor 212 is provided with holes 214 out of which gas flows during operation of the cooling element 202. The shutters 216 of the cooling element 202 will not be visible when the cooling element is viewed from below, but are depicted here in order to facilitate understanding of the invention. The shutters are movable from the retracted position 216a (depicted with dashed lines) to the deployed position 216b (depicted with dotted lines).

During operation of the lithographic apparatus LA (see FIG. 1) the size of the exposure area E which is illuminated by the radiation beam B in the X-direction (the non-scanning direction) may be selected by an operator of the lithographic apparatus. This selection may be determined by the size of dies which are to be exposed on substrates W by the lithographic apparatus. The maximum X-direction dimension of the exposure area E may for example be 26 mm (although other maximum X-direction dimensions are possible). The maximum X-direction dimension is labelled $X_{max}$ in FIG. 12. The minimum X-direction dimension of the exposure area E may for example be 16.5 mm (although other minimum sizes are possible). The minimum size of the exposure area is labelled $X_{min}$ in FIG. 12. The X-direction dimension of the exposure area E may adjusted by the illuminator IL of the lithographic apparatus LA (see FIG. 1), for example using masking blades (not depicted) in a known manner.

The shutters 216 of the cooling element 202 allow the X-direction dimension of the area which onto which cooling gas is directed to be adjusted, so that it corresponds with the X-direction dimension of the exposure area E. Thus, when the exposure area E has the maximum size $X_{max}$ the shutters 216 are in the retracted position 216a. The X-direction dimension of holes in the floor 212 which deliver gas to the substrate then substantially corresponds with $X_{max}$. When the exposure area E has the minimum X-direction size $X_{min}$, the shutters 216 are in the deployed position 216b. The X-direction dimension of holes in the floor which deliver gas onto the substrate then substantially corresponds with $X_{min}$.

Other X-direction dimensions of the exposure area E are possible between $X_{max}$ and $X_{min}$. The shutters 216 may be deployed to intermediate positions between the retracted position and the deployed position accordingly. Thus, the shutters 216 are positionable such that the cooling element 202 directs cooling gas onto an area which has an X-direction dimension that corresponds with the X-direction dimension of the exposure area E. By matching the X-direction dimension of the area to which cooling gas is delivered with the X-direction dimension of the exposure area E, the embodiment avoids directing cooling gas onto an area which extends beyond X-direction edges of the exposure area. If cooling gas were to be delivered onto an area which extends beyond X-direction edges of the exposure area E then this could cause unwanted distortion of the substrate. This could in turn reduce the accuracy with which the lithographic apparatus is able to project a pattern onto the substrate. For example, the cooling gas could cause cooling of part of a die adjacent to the die currently being exposed and thereby reduce overlay accuracy when a pattern is subsequently projected onto that adjacent die. This issue is avoided by the embodiment of the invention because the X-direction dimension of the area onto which cooling gas is incident corresponds with the X-direction dimension of the exposure area E.

In the illustrated embodiment of the invention when the shutters 216 are in the retracted position 216a they do not close any of the holes 214 in the floor 212 of the cooling element 202. However, it is not necessary that this is the case. Thus, for example, the shutters 216 may close some holes 214 of the floor 212 when they are in the retracted position. Whether or not this is the case will depend upon the specific configuration of the shutters and the floor. In any event, moving the shutters from the retracted position 216a to the deployed position 216b closes some holes 214 in the floor 212 of the cooling element 202.

In an alternative arrangement, instead of providing holes in the floor 212 the floor may be formed from a porous material. Where this is the case, a network of pores in the material allows the gas to flow out of the floor 212. Examples of porous materials which may be used are graphite (e.g. as sold by Xycarb Ceramics of Helmond, Netherlands) and sintered ceramics (e.g. as sold by Gimex of Geldermalsen, Netherlands). The porosity of the porous material may be reduced if desired by applying an epoxy layer together with a solvent to a surface of the porous material. The amount of solvent used may be selected such that a desired permeability of the layer is achieved.

The holes 214 and the pores of the porous material may both be considered to be examples of openings which allow gas to pass through the floor 212. The shutters 216 work in the same way irrespective of whether the openings are holes 214 or pores of a porous material. Thus, moving the shutters 216 from the retracted position 216a to the deployed position 216b closes some openings in the floor 212 of the cooling element 202.

Although only a single cooling element 202 is depicted in FIGS. 11 and 12, it will be appreciated that cooling elements according to this embodiment may be provided on either side of the exposure area E of the lithographic apparatus (e.g. in an arrangement which corresponds with the arrangement depicted in FIG. 3).

Although the illustrated embodiment has two shutters, some other number of shutters may be used. For example, a single shutter may be used. Where this is the case, some X-direction movement of the cooling element 202 may be needed in combination with movement of the shutter. This will ensure that openings that have not been closed by the shutter remain aligned with the exposure area E in the X-direction.

In a further embodiment (not illustrated) a cooling element may be generally as depicted in FIGS. 11 and 12 but without the shutters 216 being present. Thus, the cooling element may include a floor provided with openings through which gas is delivered onto a substrate. The openings may for example be an array of holes or pores of a porous material.

FIG. 13 schematically depicts an alternative embodiment of the invention which provides similar functionality to the embodiment depicted in FIGS. 11 and 12 but does so in a different manner. FIG. 13 is a schematic cross-sectional view of a cooling element 302 according to an embodiment of the invention. As with FIG. 11, the cross-section is along the X-direction of the cooling element. The cooling element 302 comprises a body 304 within which three chambers 306-308 are provided. The chambers are separated from each other by walls 310. The chambers may be referred to as outer chambers 306, 308 and an inner chamber 307. Each chamber is connected to a different gas conduit along with associated valves (not depicted in FIG. 13). The body 304 has a floor 312 which forms a lowermost surface of the chambers 306-308. The floor 312 is provided with holes 314 through which gas can flow from the chambers 306-308. The cooling element 302 is located above a substrate W, and the gas which passes out of the holes 314 fills a space between the cooling element 302 and the substrate W until it flows out from beneath the cooling element (as schematically depicted by arrows). The gas has a lower temperature than the substrate W and thus acts to cool the substrate. The gas may be referred to as cooling gas. Appropriate temperatures which may be used for the cooling gas are discussed elsewhere in this document in connection with other embodiments. Features and considerations discussed in connection with other embodiments may also be used in connection with this embodiment.

Figure 13A:
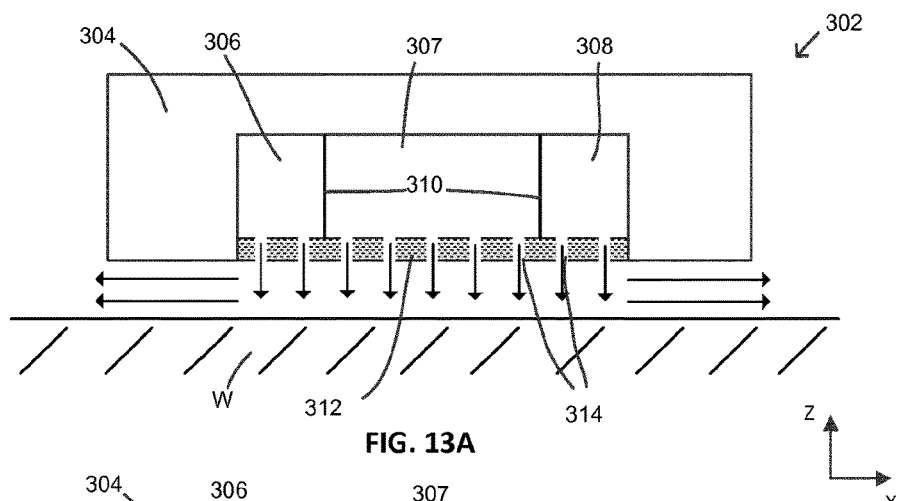
FIGS. 13A-13B schematically depict in cross section a cooling element according to an alternative embodiment of the invention.

Referring to FIG. 13A, valves connected to all of the gas conduits may be open such that gas is delivered to all of the chambers 306-308. Since gas is being delivered to all of the chambers 306-308 gas passes out of holes 314 distributed across the full X-direction dimension of the floor 312. This may correspond with the maximum X-direction dimension $X_{max}$ of the exposure area E of the lithographic apparatus (see the left hand side of FIG. 12)

Figure 13B:
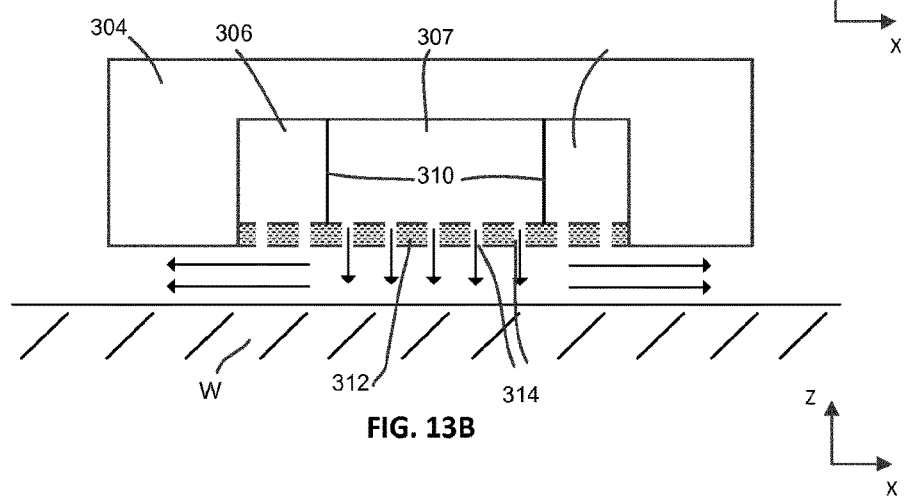

Referring to FIG. 13B, valves connected gas conduits which pass to the outer chambers 306, 308 may be closed, with the valve connected to the gas conduit which passes to the inner chamber 307 being open. Since no gas has been delivered to the outer chambers 306, 308 there is no flow of gas through holes 314 in the floor 312 located beneath those outer chambers. Gas continues to flow from holes 314 in the floor 312 of the inner chamber 307. Thus, the X-direction dimension of substrate area onto which gas is delivered is reduced in FIG. 13B when compared with FIG. 13A. The walls 310 may be positioned such that the X-direction dimension onto which gas is delivered from the inner chamber 307 corresponds with the minimum X-direction dimension $X_{min}$ of the exposure area E of the lithographic apparatus (see the left hand side of FIG. 12).

The walls 310 may be thin (e.g. less than 1 mm thickness) in order to minimise the X-direction dimension portion which does not receive cooling gas from the floor 312 (the portion of the floor which is immediately beneath the walls 310 may be blocked by the walls from emitting cooling gas).

The cooling element 302 of FIG. 13 may incorporate features described above in connection with the cooling element of FIGS. 11 and 12. For example, the holes 314 may have properties described above in connection with FIGS. 11 and 12. The floor 312 may be formed from porous material. The holes 314 and pores of the porous material are examples of openings through which cooling gas may flow.

In an embodiment the holes provided in the floor (e.g. holes 214, 314) may provide a choked gas flow, resulting in a mass flow (through the holes) which is independent of the pressure in the gap between the lowermost surface of the cooling element body and the substrate (and therefore also independent of the gap height). An advantage of keeping a constant mass flow through the holes is that the total gas flow in the gas conduits toward the cooling element also remains constant.

When the mass flow through the gas conduits increase, for example when the cooling element is half over the edge of the substrate during exposing an edge target area, this increase in mass flow can determine a different pressure drop over the gas conduits. Consequently, it results in a different gas supply pressure in the cooling element before it enters the holes. A different gas supply pressure may result in a different pressure in the gap between the lowermost surface of the cooling element body and the substrate; thereby the cooling flux may change and no longer match the exposure thermal load.

A choked flow may be realized by the appropriate choice of a combination of a high gas supply pressure and small hole diameters (depending on the supply gas type), such that the pressure drop is sufficient to ensure a choked flow. However, a choked flow is not necessary as long as the flow resistance through the holes is significantly larger (e.g. an order factor 100) than the flow resistance of the gap.

In an embodiment, the floor of the cooling element has a single row of holes 314. For example, the row of holes contains between 10 and 100 holes, preferably between 20 and 80 holes and more preferably between 25 and 55 holes. The holes may have a diameter between 10 and 200 microns, such as between 50 and 150 microns. The numbers may be chosen such as to operate at a point close to the continuum (high pressure) gas regime. However, making a large numbers of holes with such diameters may be challenging. It may therefore be more convenient to have a lower number of holes and increase the holes diameter, while still being within a boundary to ensure a choked gas flow (if that is desired).

FIG. 14 schematically depicts in cross-section viewed from above a cooling apparatus 40 which comprises two cooling elements 302, 303 of the form illustrated in FIG. 13. FIG. 14 also schematically depicts gas conduits of the cooling apparatus and the exposure area E of the lithographic apparatus. As has been explained above in connection with FIG. 13, the cooling elements 302, 303 each comprise an inner chamber 307 a first outer chamber 306 and a second outer chamber 308. The chambers 306-308 are separated from each other by walls 310. A first valve 316 is connected to a first gas conduit 318 which branches into two parts 318a, 318b. The gas conduit branches 318a, 318b are respectively connected to a first outer chamber 306 of the first cooling element 302 and to a second outer chamber 306 of the second cooling element 303. A second valve 320 is connected to a second gas conduit 322. The second gas conduit 322 splits into two branches 322a, 322b which are respectively connected to a second outer chamber 308 of the first cooling element 302 and a second outer chamber 308 of the second cooling element 303. A third valve 324 is connected to a third gas conduit 326. The third gas conduit 326 splits into two branches 326a, 326b which are respectively connected to the inner chamber 307 of the first cooling element 302 and to the inner chamber 307 of the second cooling element 303.

Figure 14A:
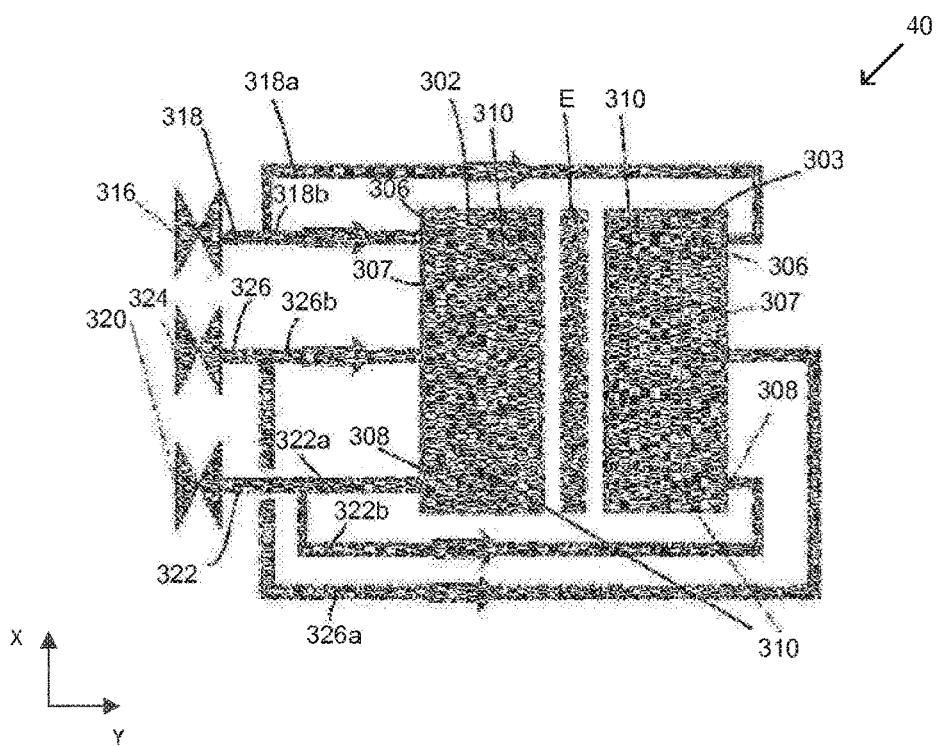
FIGS. 14A-14B schematically depict viewed from below the embodiment of FIG. 13.

As schematically depicted in FIG. 14A, when all of the valves 316, 320, 324 are open gas is delivered to all of the chambers 306-308 of the cooling elements 302, 303. As a result, the X-direction dimension of a substrate onto which gas is delivered by the cooling elements 302, 303 correspond with the maximum X-direction dimension $X_{max}$ of the exposure area E of the lithographic apparatus.

Figure 14B:
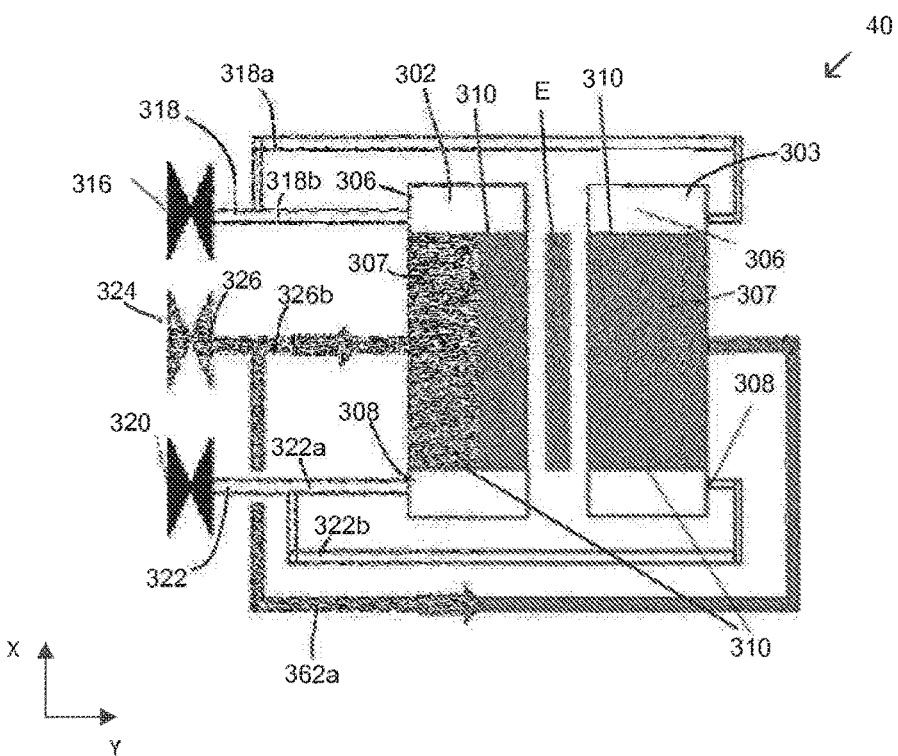

In FIG. 14B the first and third valves 316, 320 are closed and as a result no gas flows to the outer chambers 306, 308 of the cooling elements 302, 303. The third valve 324 is open and thus gas flows to the inner chamber 307 of the cooling elements 302, 304. As a result, gas does not flow out of the outer chambers, 306, 308 but does flow out of the inner chambers 307 of the cooling elements 302, 303. Thus, cooling gas is delivered across a smaller X-direction dimension of a substrate being exposed by the lithographic apparatus. The X-direction dimension to which cooling gas is delivered may correspond with the X-direction dimension of the exposure area E which is illuminated by the lithographic apparatus. This may for example be the minimum X-direction dimension $X_{min}$ of the exposure area E of that lithographic apparatus.

Thus, by opening and closing the first and third valves, 316, 320 the X-direction dimension to which cooling gas is delivered may be switched between a maximum value and a minimum valve. In an alternative configuration (not depicted) a single valve may arranged to control the flow of gas to both of the outer chambers 306, 308, for example via a single conduit which splits into four conduits.

A disadvantage of the embodiment of FIGS. 13 and 14 compared with the embodiment of FIGS. 11 and 12 is that the X-direction dimension to which cooling gas is delivered is not controllable to values which are between the minimum and maximum values. Thus, if the exposure area E used by the lithographic apparatus has an X-direction dimension which is somewhere between the minimum dimension $X_{min}$ and the maximum dimension $X_{max}$, the X-direction dimension of the substrate onto which cooling gas is delivered by the cooling elements 302, 303 will not correspond with the exposure area E.

An advantage of the embodiment of FIGS. 13 and 14 is that the moveable elements (i.e. valves 316, 320, 324) which control the delivery of gas from the cooling elements 302, 303 are located away from the cooling elements themselves. In contrast, in the embodiment of FIGS. 11 and 12, the shutters 216 are located inside the cooling element 302. As will be appreciated from FIG. 1, the cooling elements 202, 302, 303 form part of a cooling apparatus 40 which is located beneath the projection system PS of the lithographic apparatus and above the substrate table WT of the lithographic apparatus. This is a relatively inaccessible location. Thus, maintenance and repair of the valves 316, 320, 324 of the embodiment of FIGS. 13 and 14 may be significantly easier than maintenance and repair of the shutters of the embodiment of FIGS. 11 and 12.

Figure 15:
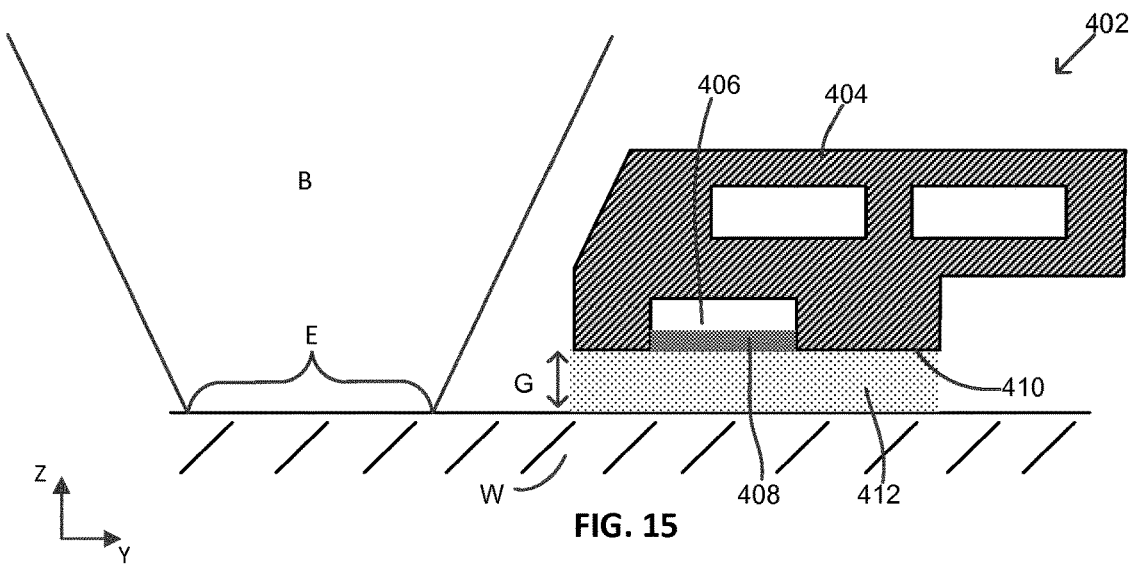
FIG. 15 schematically depicts in cross section a cooling element according to an alternative embodiment of the invention.
Figure 16:
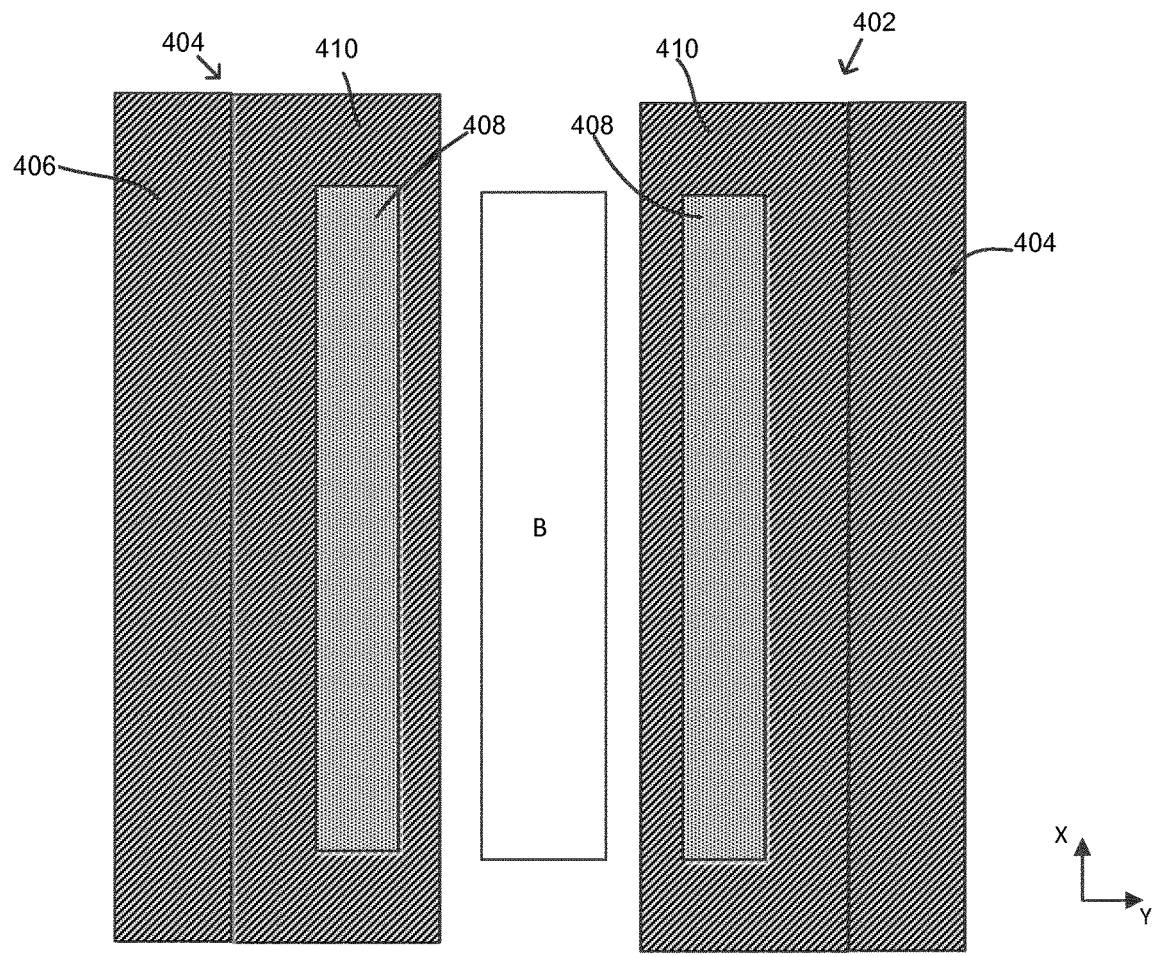
FIG. 16 schematically depicts viewed from below a cooling apparatus which comprises the cooling element of the embodiment of FIG. 15.

FIG. 15 schematically depicts a cooling element 402 according to an alternative embodiment of the invention. In common with other embodiments of the invention, the cooling element 402 is configured to direct cooling gas onto a substrate W at a location which is adjacent to an exposure area E which is illuminated by a radiation beam B during operation of a lithographic apparatus. The cooling element 402 is schematically depicted in cross-section in FIG. 15 and schematically depicted viewed from below in FIG. 16. FIG. 15 is enlarged relative to FIG. 16. In common with some other embodiments, no gas delivery conduit is depicted in FIGS. 15 and 16 although in practice the embodiment will include a gas delivery conduit. Features and considerations discussed in connection with other embodiments may also be used in connection with this embodiment.

The cooling element 402 comprises a body 404 which is provided with a chamber 406. The chamber 406 has a floor 408 formed from a porous material (examples of suitable porous material are described further above). The body 404 has a lowermost surface 410 which faces towards the substrate W. Part of the lowermost surface 410 is formed by the floor 408 of porous material. The lowermost surface 410 of the body 404, which may be substantially planar, is separated from the substrate W by a gap G which may for example be around 80 microns. The gap G may for example be less than 200 microns, and may for example be less than 100 microns. The gap G may for example be greater than 20 microns.

In some embodiments, the gap G may be actively controlled. For example, in some embodiments, sensors (not shown in FIG. 15) may be provided to determine the size of the gap G and actuators (not shown) may be provided to adjust raise and lower the cooling element 402 in relation to the substrate W. By adjusting the gap G, the heat transfer coefficient between the substrate W and the cooling element 402 may be adjusted. It may, for example, be desirable to adjust an amount of cooling that is provided to the substrate W during scanning between exposure areas, or to address fluctuations in temperature.

Cooling gas which has been delivered through the floor 408 of porous material fills the gap G between the lowermost surface 410 of the body 404 and the substrate W. The cooling gas in the gap G is schematically depicted by a shaded area 412. The cooling gas 412 may for example be hydrogen (or may be some other gas). The cooling gas 412 has a temperature which is lower than the temperature of the substrate. The cooling gas 412 facilitates transfer of heat from the substrate W to the cooling element body 404, which also has a temperature that is lower than the temperature of the substrate. The cooling gas 412 thus acts to cool the substrate W.

The cooling element 402 of FIG. 15 further comprises first and second cooling fluid channels 414, 416. Cooling fluid is pumped through the cooling fluid channels 414, 416 and thereby carries heat away from the cooling element 402. The cooling fluid may for example be nitrogen gas (or some other gas) and may be for example cooled to a temperature of around −100° C. The nitrogen gas may for example be held at a pressure which is above atmospheric pressure (e.g. greater than 4 bar, e.g. around 8 bar, e.g. 12 bar or less). The nitrogen (or other gas) acts to cool the cooling element 402 to a temperature which is below 0° C. The nitrogen (or other gas) may act to cool the cooling element 402 to a temperature which is below −50° C., and may act to cool the cooling element to a temperature which is below −70° C. (e.g. around −100° C.). Since the cooling element 402 is held at a temperature which is below 0° C., e.g. around −100° C., the cooling gas in the chamber 406 is also cooled to that temperature. Consequently, cooling gas 412 delivered through the porous floor 408 has the same temperature as the temperature of the cooling element 402.

The cooling gas is delivered at a rate which will provide a pressure of cooling gas 412 between the cooling element 402 and the substrate W which is greater than atmospheric pressure. The pressure may for example be in the excess of 500 Pascals, and may for example be around 700 Pascals. The pressure may for example be less than 1000 Pascals. The cooling gas 412 may for example provide a heat transfer coefficient which is greater than 300 W/m K. The cooling gas 412 may for example provide a heat transfer coefficient which is less than 600 W/m²K. The cooling gas 412 may for example provide a heat transfer coefficient of around 450 W/m²K.

The cooling element 402 is located adjacent to the edge of the exposure area E. In this context the term 'adjacent' may be interpreted as meaning less than 1 cm from the edge of the exposure area E. The cooling element 402 may be less than 0.5 cm from an edge of the exposure area E, and may be around 1 mm from an edge of the exposure area. The cooling element 402 may be within the range 1 mm-1 cm from the edge of the exposure area E. The smaller the separation between the cooling element and the exposure area, the greater the extent to which some undesirable distortions of the substrate caused by substrate heating are avoided In order for the cooling element 402 to be located as close as possible to the exposure area E, the cooling element may be shaped such that it does not intersect with the radiation beam B when it is at a desired distance from the exposure area E. Thus, for example, the cooling element in this embodiment is provided with a sloping inner surface 418 which faces towards the radiation beam B. The sloping surface 418 may for example subtend an angle relative to the vertical which substantially corresponds with the angle subtended by the radiation beam B relative to the vertical. This shape avoids the cooling element 402 having an innermost corner which projects into the radiation beam B. A corresponding shape may be used for cooling elements according to other embodiments of the invention.

The cooling element 402 is thin (when measured in the vertical direction) because this allows the cooling element to be positioned closer to the radiation beam B without intersecting with the radiation beam. Thus, for example, the cooling element may have a thickness in the vertical direction (the z-direction) which is 3 mm or less. The thickness of the cooling element 402 may for example be 2 mm or less. The cooling element 402 is sufficiently thick to allow space for the chamber 406 which receives the cooling gas and also to allow space for the cooling fluid channels 414, 416. A minimum thickness for the cooling element 402 may thus for example be around 1 mm.

The closer the cooling element 402 is to the exposure area E, the greater the extent to which some undesirable distortions of the substrate caused by substrate heating are avoided. Thus, for example, a separation of less than 3 mm between the cooling element 402 and the edge of the exposure area E may be desirable. A separation of 2 mm or less may be preferred since this provides even more effective cooling. A separation of 1 mm or less may be most preferred, although this may be challenging to implement in practice. There may be for example a tolerance of around 0.3 mm of the position of the edge of the exposure area E. There may be a tolerance of for example around 0.3 mm of the accuracy with which the cooling elements 402 can be positioned relative to the exposure area E. The above mentioned values may take this into account. Thus, the above mentioned values may for example have an accuracy of +/−0.6 mm.

The lowermost surface 410 of the cooling element 402 may for example measure between 1 mm and 3 mm in the Y-direction (e.g. between 1.5 mm and 2 mm). The lowermost surface 410 of the cooling element 402 may for example measure less than 5 mm in the Y-direction. The length of the lowermost surface 410 in the Y-direction has a significant impact upon the amount of cooling which is provided to the substrate W because this determines the area of cooling gas 412 which is located between the cooling element 402 and the substrate. The floor 408 of porous material may for example be separated by around 0.5 mm from an inner edge of the cooling element 402 measured in the Y-direction (scanning direction). The floor 408 of porous material may for example have a length in the Y-direction of between 0.3 mm and 0.7 mm (e.g. around 0.5 mm).

The embodiment of FIG. 15, by providing cooling at locations close to the exposed area E, may reduce the tendency of the substrate to expand due to heating caused by the radiation beam B. Such expansion is particularly problematic at the edge of the substrate because the substrate tends to be less well restrained by the substrate table WT at its edges. An additional benefit of the embodiment is that it may relax the stiffness tolerance with which burls of the substrate table WT must be provided (the required precision of stiffness of the burls is interrelated with expansion of the substrate due to heating).

FIG. 16, depicts viewed from below a first cooling element 402 on one side of the exposure area E and a second cooling element 403 on an opposite side of the exposure area. The cooling elements are of the type illustrated in FIG. 15. One cooling element 402 cools an area of the substrate prior to that area being exposed by the radiation beam B, and the other cooling element 403 cools the substrate after the area has been exposed. This will swap over when the direction of scanning exposure swaps over.

As will be appreciated from FIG. 16, the X-direction dimension of the floor 408 formed from porous material may correspond with the X-direction of the exposure area E. This may for example be the maximum X-direction dimension $X_{max}$ of exposure area which the lithographic apparatus is capable of illuminating. The cooling elements 402, 403 may include one or more shutters or chambers or other components (not depicted) which are operable to adjust the X-direction dimension of the floor 408 through which cooling gas is delivered.

Although the embodiment depicted in FIGS. 15 and 16 has a floor 408 formed from porous material, in other embodiments the floor may be formed from a non-porous material with an array of holes being provided in the floor to allow cooling gas to be delivered through the floor. The holes may include properties mentioned further above in connection with the preceding embodiment. The holes and the pores are examples of openings through which cooling gas may flow.

Embodiments of the invention depicted in FIGS. 2-4 may be modified such that they include a floor which faces towards the substrate W instead of having cavities 48, 49. The floor may be substantially planar and may for example be coplanar with the lowermost surface of the cooling element. The floor may be provided with openings (e.g. formed from a porous material or provided with an array of holes). A chamber may be provided above the floor from which gas is delivered through the floor.

Although described embodiments of the invention comprise two cooling elements other embodiments of the invention may comprise other numbers of cooling elements. For example, a single cooling element may be provided. The single cooling element may for example extend along one side of the exposure area E (or have a cavity which extends along one side of the exposure area). Where this is the case the cooling element will cool the exposure area E either before exposure or after exposure (depending upon the scanning direction during that exposure). Alternatively, a single cooling element may for example extend around a plurality of sides of the exposure area (e.g. have a cavity or floor with openings which extends around a plurality of sides of the exposure area). A single cooling element may for example extend around a perimeter of the exposure area (e.g. have a cavity or floor with openings which extends around the perimeter of the exposure area).

In an alternative example more than two cooling elements may be provided. For example four cooling elements may be provided, one cooling element being provided adjacent to each edge of the exposure area.

Figure 17A:
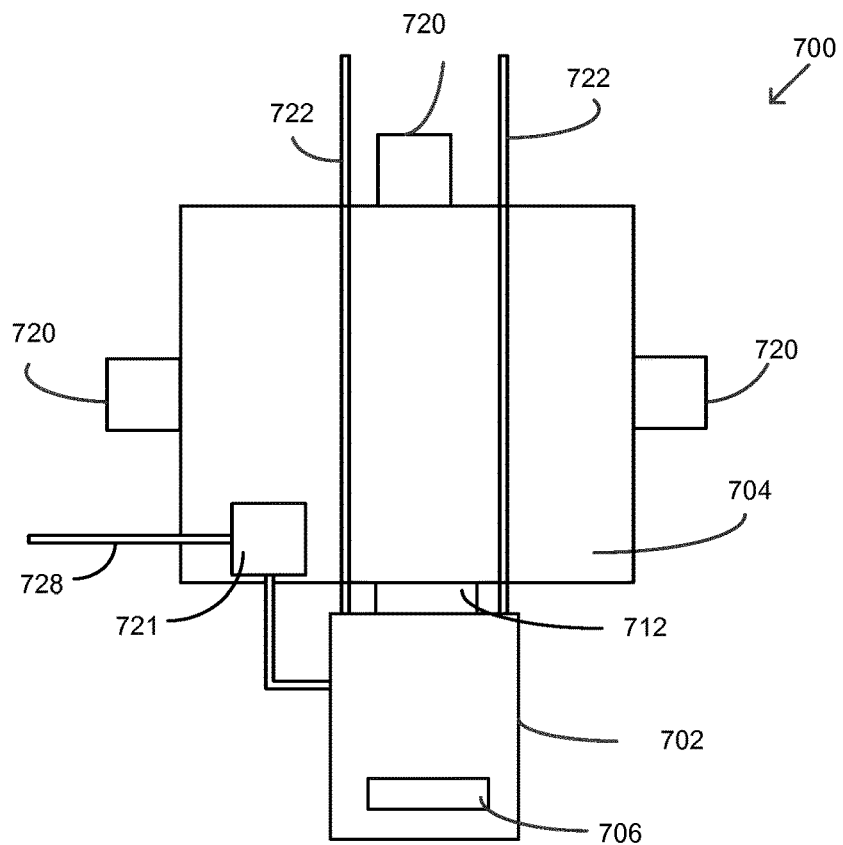
FIG. 17a schematically depicts viewed from above a cooling apparatus according to an embodiment described herein.
Figure 17B:
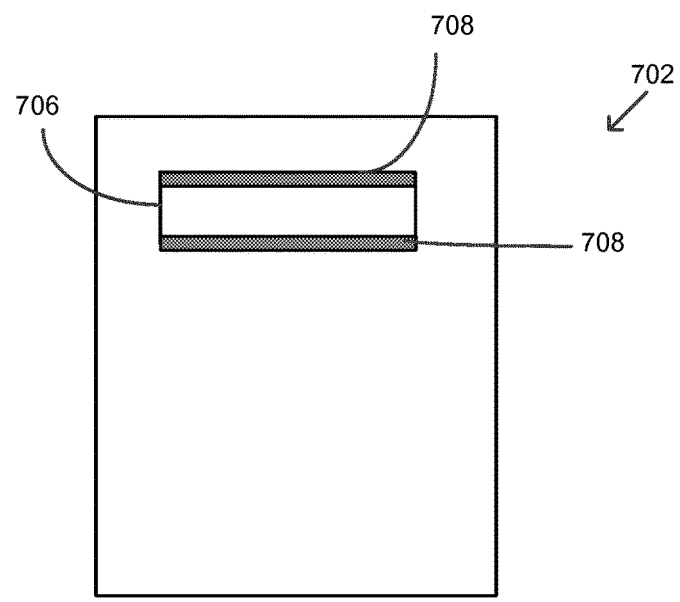

FIG. 17a, schematically illustrates an embodiment of a cooling element 700 in top view, while FIG. 17b schematically illustrates a cooling plate of the cooling element 700 in bottom view. In the embodiment of FIG. 17, the cooling element 700 is formed of two parts; a cooling plate 702 and an actuation body 704. The cooling element 700 may operate in accordance with the principles of any of the cooling elements described above. The cooling plate 702 is cooled to a desired temperature. For example, the cooling plate 702 may be cooled to a temperature of less than 0 degrees, and may be cooled to a temperature of around −70° C. The cooling plate 702 may be cooled by the circulation of a cooling fluid (such as nitrogen gas) through cooling channels (not shown in FIG. 17) provided within the cooling plate 702. The cooling fluid may be provided from an external source via conduits 722. During use, the cooling plate 702 is positioned so that a cooling slit 706 in the cooling plate 702 is aligned with the exposure area E (as shown in FIG. 15). The radiation beam B therefore passes through the cooling plate 702 through the cooling slit 706. The cooling slit 706 is shaped so as to match the shape of the radiation beam B. The cooling slit 706 may be, for example, of the order of 2 mm.

The cooling element 700 is also provided with a gas supply 728. The gas provided by the gas supply 728 may be referred to as a cooling gas or a bearing gas. As indicated above with reference to other embodiments, the cooling gas may be, for example, hydrogen gas, but may be another gas. The gas supply 728 is delivered from the cooling plate adjacent the cooling slit 706. The cooling gas creates a bearing between the cooling plate 702 and the substrate W. Additionally, the cooling gas allows for conduction of heat from the exposure area E to the cooling plate 702. The bearing gas may be supplied at a temperature which is lower than the temperature of the substrate W, but need not be cooled to the temperature of the cooling plate 702. For example, the bearing gas may be supplied at a temperature of around 22° C. However, it will be appreciated that as the cooling plate 702 is cooled to a temperature of, for example, −70° C., the cooling gas will also be cooled through interaction with the cooling plate 702. In other embodiments, the cooling gas may be pre-cooled or heated (i.e. before interaction with the cooling plate 702) to a desired temperature.

The actuation body 704 is connected to the cooling plate 702 and is provided with actuators 720 for positioning the cooling plate 702. Three actuators 720 are depicted in FIG. 17a, though it will be appreciated that this is merely exemplary. The actuators 720 may be arranged to actuate the cooling plate 702 with sufficient degrees of freedom to allow for accurate alignment of the cooling plate, and in particular the cooling slit 706, with an exposure area. In some embodiments, the actuators 720 may be capable of raising and lowering the cooling plate 702 with respect to the substrate W (i.e., in the Z-direction) so as to control a thermal transfer coefficient between the substrate W and the cooling plate 702.

The actuation body 704 need not be cooled to the temperature of the cooling plate 702 and may, for example, be arranged to operate at an ambient temperature (i.e. the temperature of the environment surrounding the actuation body 704). The ambient may be, for example, a temperature of around 22° C. Indeed, by providing a "warm" (or non-cooled) actuation body 704, the area of the substrate W which is exposed to cooling temperatures may be more easily localised to the exposure area E.

The cooling plate 702 may be connected to the actuation body 704 through connection members 712. The connection members 712 are preferably constructed from a material with low thermal conductance and low thermal expansion to provide for thermal separation between the actuation body 704 and the cooling plate 702. For example, the connection members 712 may be constructed from invar, although it will be appreciated that this is merely exemplary. The connection members 712 may be, for example, leaf hinges to provide kinematic support while minimizing a contact area between the cooling plate 702 and the actuation body 704. In this way, components and operations (e.g., actuation), which cause temperature changes are separated from the cooling plate 702, allowing for more accurate and stable control of the temperature of the cooling plate 702 and the area which is cooled.

FIG. 17b schematically depicts an underside (i.e., the wafer-facing side) of the cooling plate 702. The cooling slit 706 is provided with floor members 708 (each of which may, for example, correspond with the floor 408 shown in FIG. 15) through which the cooling gas is delivered to the gap between the cooling plate 702 and the substrate W. As described above with reference to other embodiments, the cooling gas may be provided at a pressure which depends on the distance between the substrate W and the floor members 708. For example, the cooling gas may be delivered at a rate which will provide a pressure of cooling gas between the cooling plate 702 and the substrate W which is greater than atmospheric pressure. The pressure may for example be of the order of 500 Pascals where a distance between the floor members 708 and the substrate W is around 2 mm.

The cooling plate 702 may be constructed from a material which has high thermal conductivity and low thermal expansion. The cooling plate 702 may be constructed from a ceramics material, such as, for example, silicon carbide (SiC). Alternatively, the cooling plate 702 may be constructed from a metal such as aluminium. The particular material from which the cooling plate 702 is constructed may depend on a number of factors including the material's thermal conductivity, thermal expansion, thermal bending, cost and others. For example, while SiC exhibits particular low thermally induced bending, aluminium responds quickly to thermal disturbance and is less costly. Other materials which may be used include, for example, invar, which is notable for its very low thermal expansion, titanium, stainless steel, or others.

Figure 18:
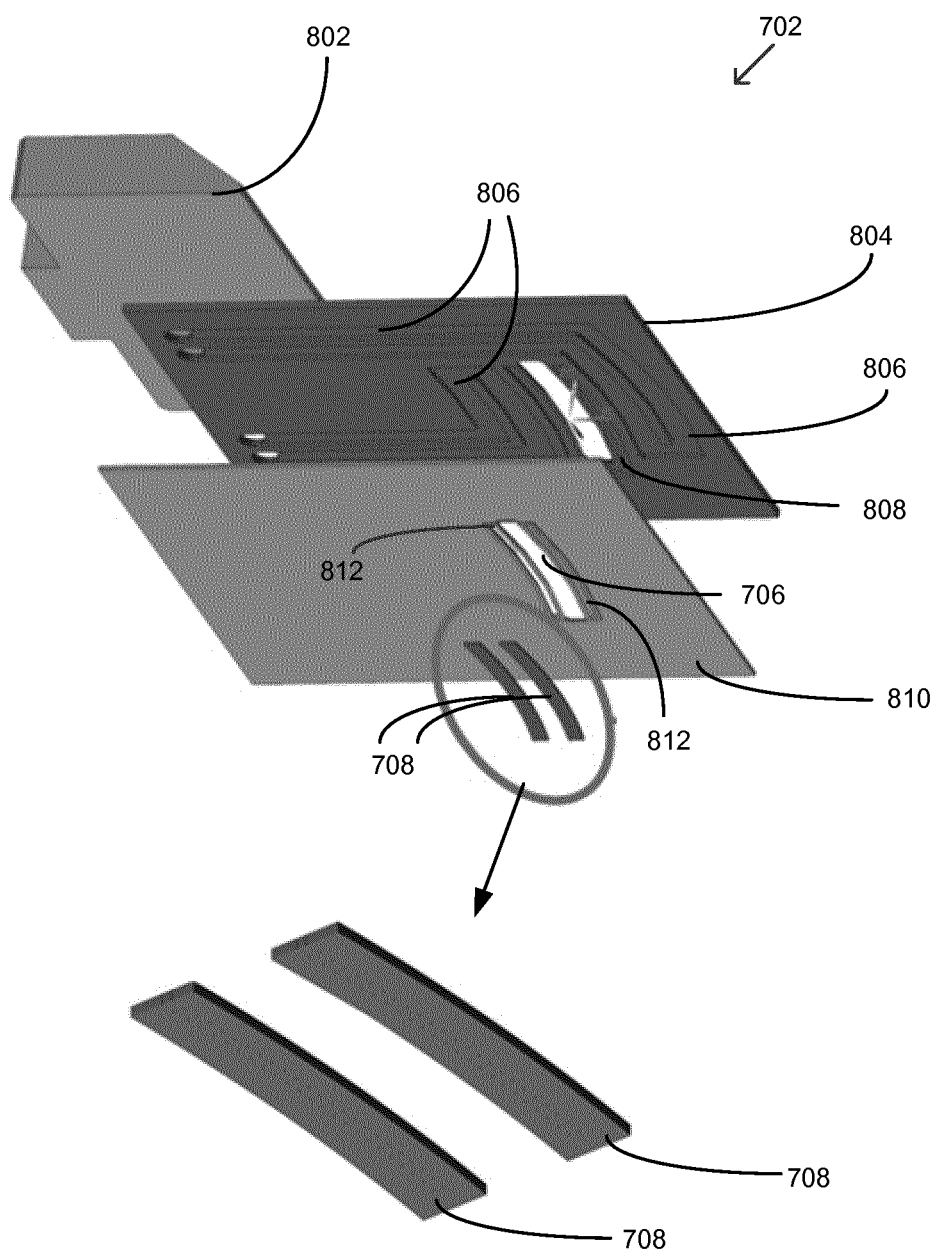
FIG. 18 schematically depicts in perspective view an exemplary construction of the cooling plate of FIG. 17b.

FIG. 18 schematically illustrates an exemplary construction of the cooling plate 702 in an exploded perspective view. In the example embodiment of FIG. 18, the cooling plate 702 is constructed in a laminar fashion from four layers. A connection part 802 provides internal ducting for passage of the coolant fluid and the cooling gas. The connection part 802 provides connection points for connection to the connection members 712 (not visible in FIG. 18). A second layer 804 provides channels 806 for receiving the coolant fluid from conduits 722 and channel 808 for receiving the cooling gas from conduit 728. A third layer 810 seals the channels 804, 806 and provides outlets 812 for the cooling gas. The second layer 804 and the third layer 810 may for example, have a combined thickness of approximately 0.3 mm to 1 mm. The flooring members 708 are provided over the outlets 812 and are depicted with a plurality of holes to direct the flow of cooling gas. The holes may be laser "drilled", for example, and may be of the order of 49.5 to 50.5 µm in diameter. As will be described in more detail below, other layers may be included within the cooling plate 702, providing, for example, heating elements and sensors (such as temperature sensors). It will be appreciated that the construction shown in FIG. 18 is merely exemplary and that the cooling plate may be constructed in other ways.

Referring again to FIG. 17a, the cooling element 700 may further include a valve 721 for controlling the flow of the cooling gas to the channel 808 and thereby control the flow of cooling gas to the cooling slit 706 through the floor members 708. The valve may be used to switch off the supply of cooling gas to the channel 808 when moving between target portions, and switch on the supply of cooling gas when a target portion is to be exposed. The valve 721 may operate with a time constant of less than around 5 ms and may operate with a time constant of approximately 3 ms.

It is generally desirable to maintain a thermal balance over the entirety of the substrate W. That is, it is desirable that thermal energy which is added to the wafer by the radiation beam B is removed through cooling. It is desirable, however, not to remove more heat from the substrate W than is added by the radiation beam B. In some embodiments, therefore, thermal shielding is provided in order to reduce cooling in areas adjacent the exposure area E.

Figure 19A:
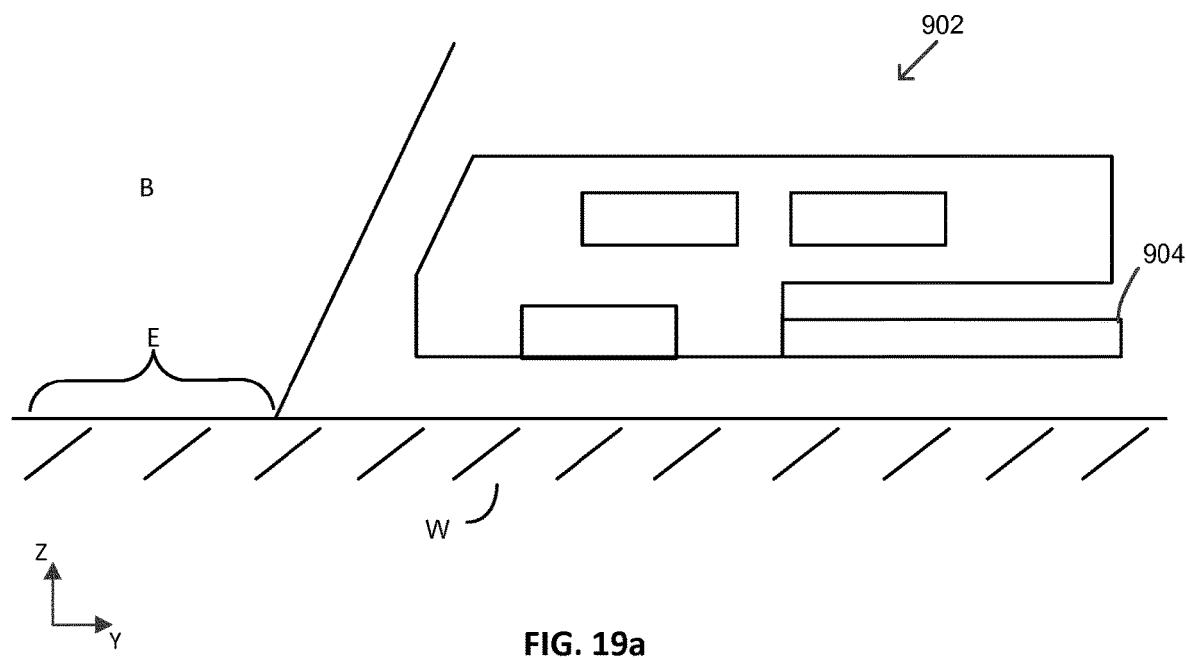
FIGS. 19a, 19b schematically depict a cooling apparatus having a thermal shield according to an embodiment described herein.
Figure 19B:
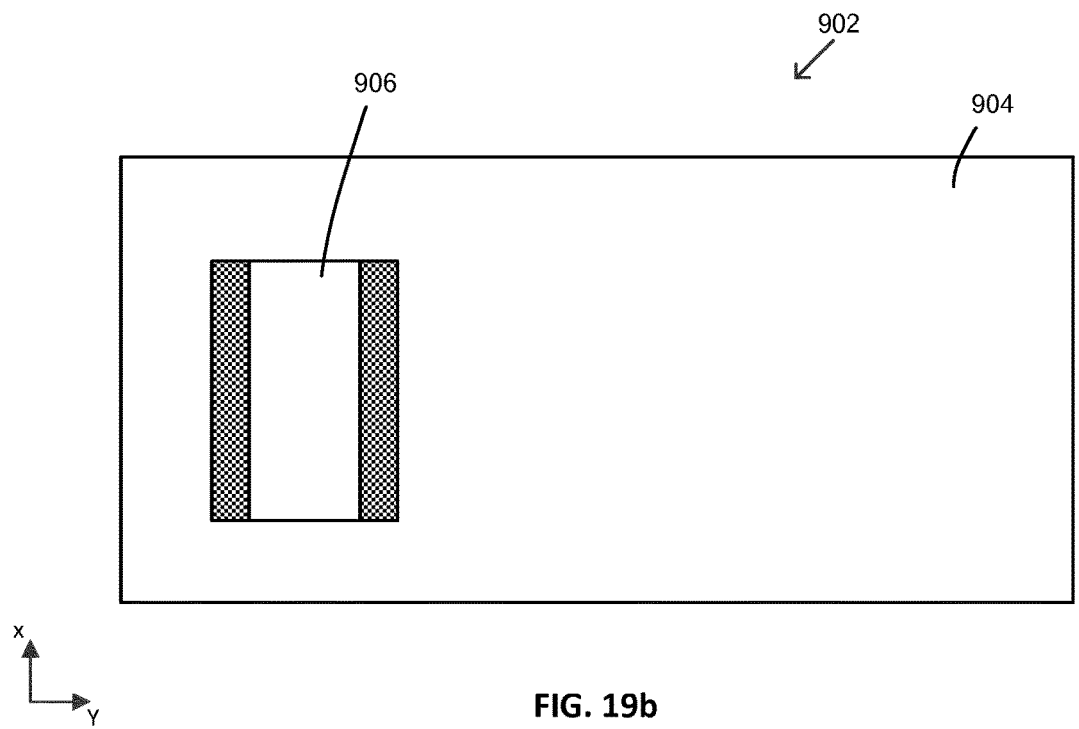

FIGS. 19a, 19b schematically illustrate an embodiment in which a thermal shield 904 is provided between the substrate W and the underside of a cooling element 902 (which may be, for example, a cooling element as described with reference to any preceding embodiment, such as described with reference to FIGS. 15, 16 and 17). The thermal shield 904 is arranged to minimize the cooling effect of the cooling element 902 on the surrounding environment, and in particular the substrate W. In the exemplary embodiment of FIG. 19, the thermal shield 904 covers a part of the underside (i.e., wafer-facing side) of the cooling element 902 surrounding a cooling slit 906. In the depicted example, the thermal shield 904 covers the whole of the underside of the cooling member 902, although it will be appreciated that this is merely exemplary. Additionally, while the thermal shield 904 is depicted as separated (in the Z direction) from the underside of the cooling member 902, in other embodiments, the thermal shield 904 may be in physical contact with the underside of the cooling member 902.

Figure 20:
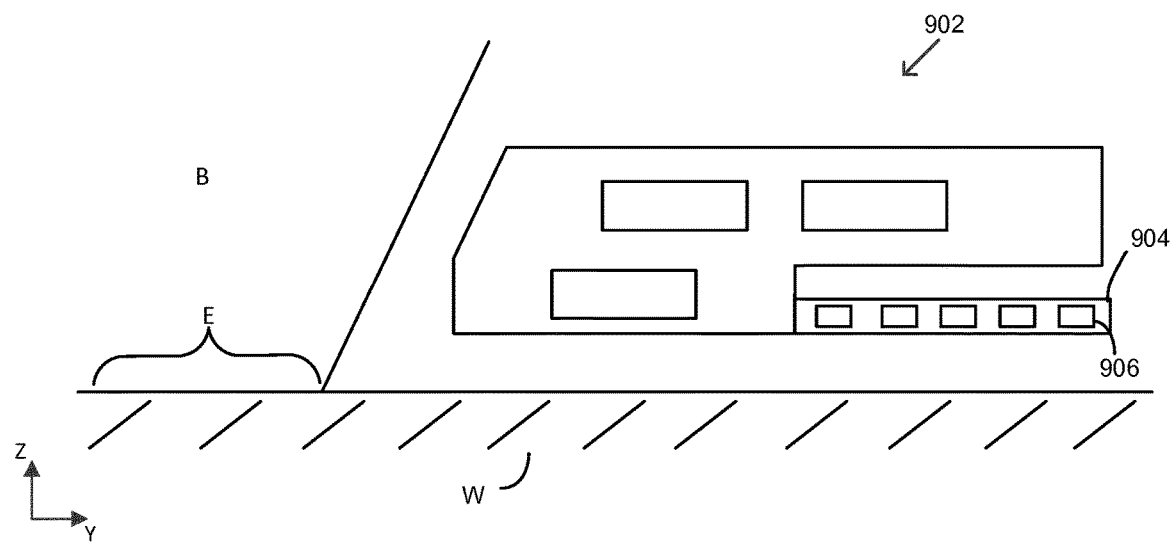
FIG. 20 schematically depicts a cooling apparatus having a thermal shield according to an alternative embodiment described herein.
Figure 21:
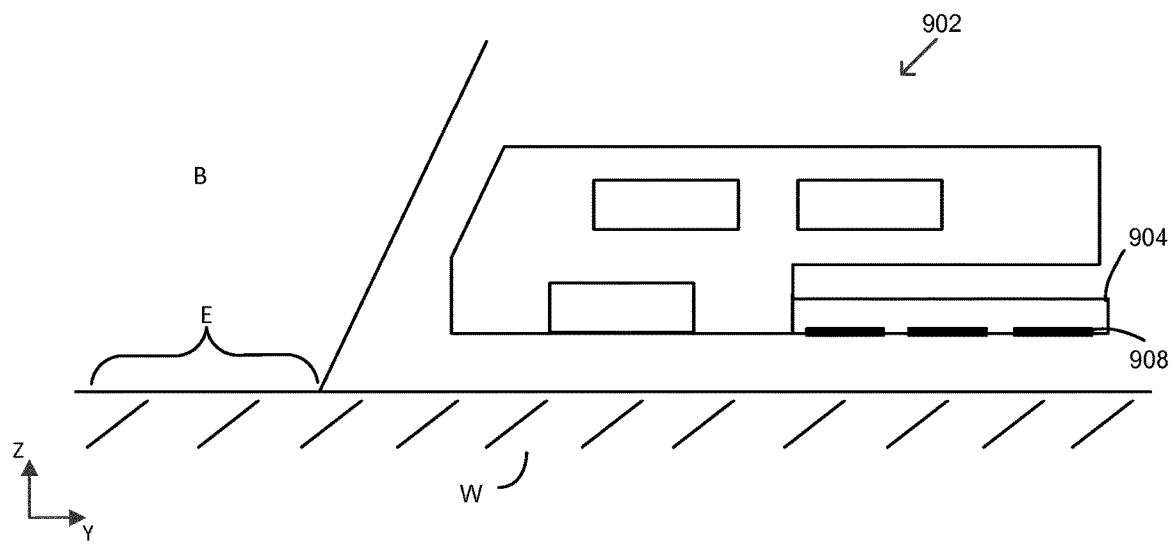
FIG. 21 schematically depicts a cooling apparatus having a thermal shield according to an alternative embodiment described herein.

The thermal shield 904 may be constructed from a material having a low thermal conductivity and be arranged to provide a barrier between the substrate W and an underside of the cooling element 902 so as to reduce conduction of heat from the substrate W to the cooling element 902. FIG. 20 depicts an exemplary embodiment in which the thermal shield 904 is provided with one or more channels 906 to allow the thermal shield 904 to be cooled and/or heated by flowing a temperature regulation fluid (such as water, or nitrogen, for example) through the channels. The flow of temperature regulation fluid through the one or more channels 906 may be configured to maintain the thermal shield 904 at an ambient temperature such as, for example, around 22° C. Alternatively, or additionally, the thermal shield 904 may be provided with one or more heating elements 908, as depicted in FIG. 21. The heating elements 908 may take any appropriate form, and may be, for example, thin film heaters or one or more resistors with an electrical current applied thereto. Heating elements 908 may be preferable to channels 906 because the heating elements 908 may be more compact than the channels 906. The thermal shield 904 may be constructed from one or more materials that have a suitably high resonant frequency such that resonance is not induced by normal operational movements of the system. The thermal shield 904 may, for example, be constructed from one or more ceramics materials or aluminium.

Figure 22:
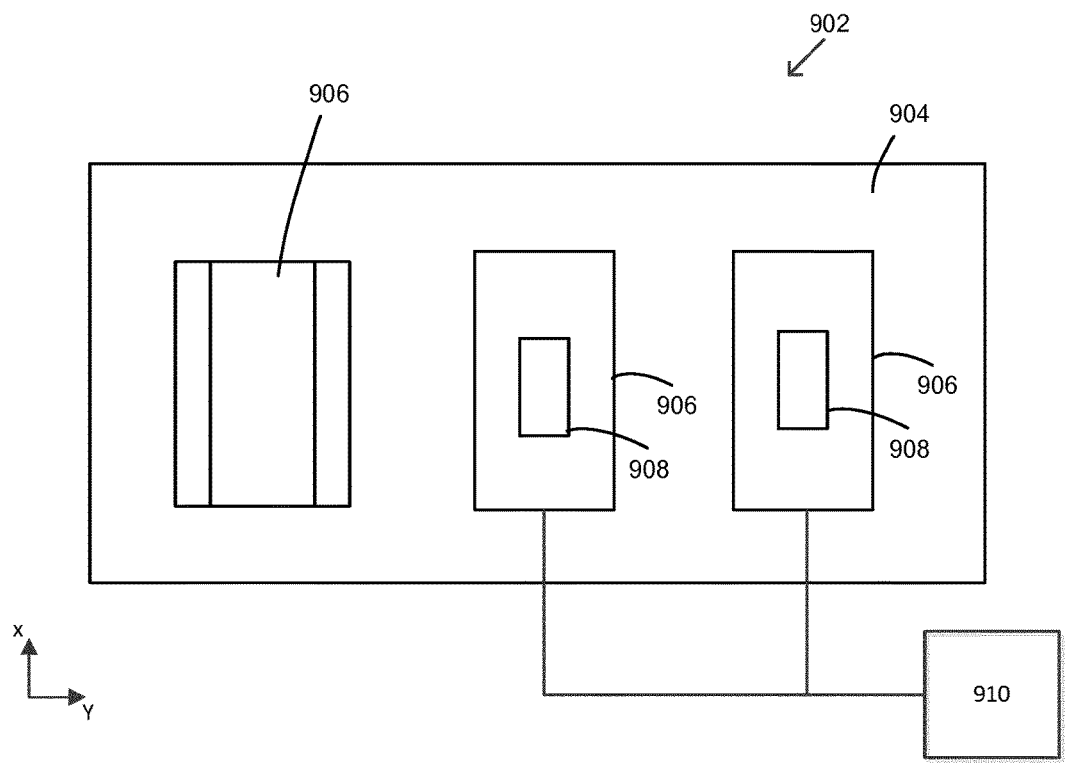
FIG. 22 schematically depicts a cooling apparatus according to an embodiment described herein.
Figure 23:
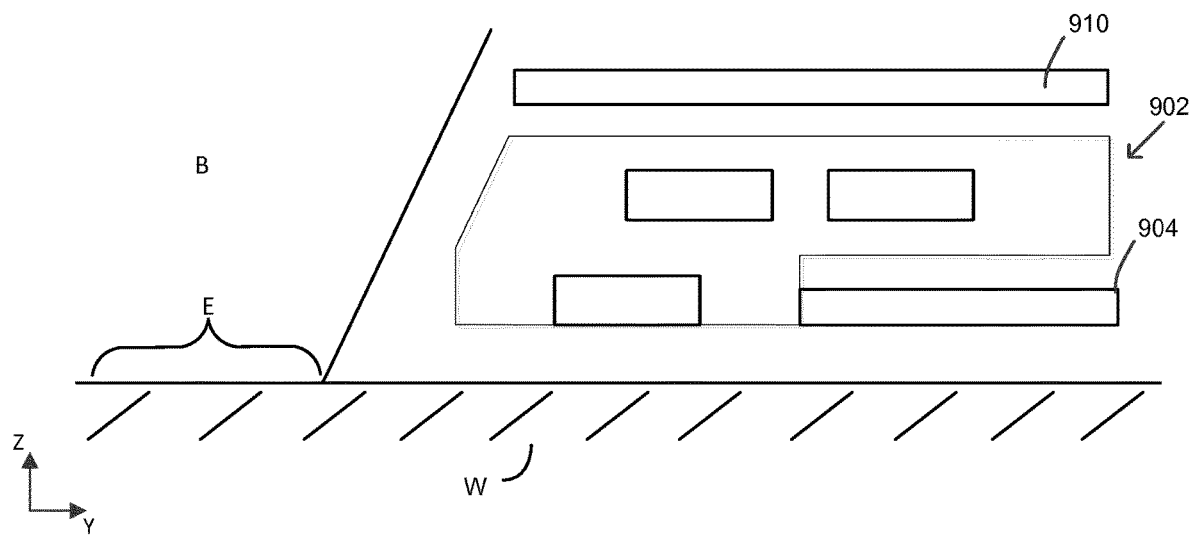
FIG. 23 schematically depicts a cooling apparatus according to an embodiment described herein.

The thermal shield 904 may be actively controlled. In particular, the one or more heating elements 908 and/or the temperature regulation fluid provided by way of the channels 906 may be controlled by a feedback loop arranged to receive a measurement of a temperature, and to control a heating or cooling of the thermal shield 904 to provide a desired temperature. The thermal shield 904 may therefore be provided with one or more temperature sensors. FIG. 22 schematically depicts a cooling element 902 in a bottom view (in the x-y plane) in which the thermal shield 904 comprises a plurality of thin film heaters 906 and a plurality of temperature sensors 908. The temperature sensors 908 and the thin film heaters 906 are connected to a processor 910. The processor 910 is arranged to receive signals from the temperature sensors 908 and, responsive to the received signals, to control the thin film heaters 906. By way of example only, the controller 910 may be arranged to control the heaters 906 to provide a temperature of between 21 and 22° C.

In FIGS. 19 to 22, a thermal shield 904 is provided between the substrate W and the underside of the cooling element 902. In an embodiment, a second thermal shield may be provided above the cooling element 902. The second thermal shield 910 may take the same form as the thermal shield 904, as described above. In particular, the second thermal shield 910 may be provided with active or passive cooling means, including heaters and/or fluid cooling channels. By providing a second thermal shield 910 above the cooling element 902, the cooling element 902 is more effectively isolated from the surrounding environment.

It is described above that it is generally desirable to control the amount of cooling that is provided to the substrate W, and this may be accomplished by any of a plurality of mechanisms. The amount of cooling may be determined, at least in part, by the gap between the substrate W and the active cooling surface of the cooling element. For example, with reference to FIG. 15, the amount of cooling may be determined, at least in part, by the size of the gap G between the substrate W and the floor 408. In particular, and still with reference to FIG. 15, actuators may be provided to translate the body 404 of the cooling element 402 in the Z-direction so as to increase and decrease the size of the gap G. With reference to FIG. 17a, for example, the actuators 720 may be operable to move the cooling plate 702 so as to increase the gap between the floor members 708 and the substrate W.

The cooling that is provided to the substrate W may also be determined, at least in part, by the pressure of the gas that is emitted from the cooling element towards the surface of the substrate W and this may therefore also be controlled to increase or decrease the thermal transfer coefficient. FIG. 6, described above, illustrates how the coefficient of heat transfer by gas between two surfaces varies as a function of distance between those surfaces at different gas pressures.

The cooling that is provided to the substrate W may also be determined, at least in part, by the temperature of the cooling element in the vicinity of the wafer (e.g., the temperature of the floors 708, 408 and the cavity roofs 60). The temperature of the cooling element may therefore also be controlled in order control the thermal transfer coefficient between the substrate W and the cooling element.

In order to control the amount of cooling that is provided to the substrate W, it is desirable to be able to determine a temperature in the vicinity of area that is being cooled. For example, FIG. 24 depicts a cooling element 1002 which comprises temperature sensors near a cooling surface. The cooling element 1002 may be generally arranged as described above with reference to FIG. 15 and comprises a cooling body 1004, fluid channels for the flow of a cooling fluid (e.g., nitrogen) to carry heat away from the cooling body 1004 and a gas channel 1006 for the supply of a cooling gas to a gap G between the substrate W and a cooling surface 1012 of the cooling body 1004. One or more temperature sensors 1010 may be provided in a wall that also includes the cooling surface 1012. One or more temperature sensors 1010 may be provided adjacent the cooling surface 1012. For example, the one or more temperature sensors 1010 may be located a distance of approximately 0.5 mm or less away from the cooling surface 1012. Providing the one or more temperature sensors 1010 adjacent the cooling surface 1012 reduces negative effects on the accuracy of temperature measurements made by the one or more temperature sensors 1010 that are caused by unwanted temperature gradients present between the cooling surface 1012 and the one or more temperature sensors 1010. By placing the temperature sensors 1010 adjacent to the cooling surface, the temperature sensors 1010 may be made more insensitive to heat load disturbances within the body 1004 and allow for more accurate determination of the temperature, and to quickly respond to changes of the temperature, within the gap G. Unwanted temperature gradients may be present on the cooling surface 1012. The temperature sensors 1010 may be distributed at different locations around the cooling surface 1012 and an average temperature of the cooling surface 1012 may be calculated from the measurements made by the temperature sensors 1010. Calculating the average temperature of the cooling surface 1012 from a plurality of temperature sensors 1010 distributed around the cooling surface 1012 may reduce negative effects on temperature measurement accuracy that are caused by unwanted temperature gradients present on the cooling surface 1012. The temperature sensors 1010 may be of any appropriate construction. For example, the temperature sensor 1010 (and/or other temperature sensors within the vicinity of the cooling element 1002) may be of any other appropriate form, such as resistance thermometers, negative temperature coefficient sensors, optical resonators, hot wire anemometers, etc.

In one embodiment, the temperature sensors 1010 are resistance thermometers, such as Platinum Resistance (PT) thermometers, such as PT100 sensors. With reference to FIG. 18, the temperature sensors 1010 may be included within a laminar construction of the cooling element 1002. The temperature sensors 1010 are preferably located adjacent (e.g. approximately 0.5 mm or less from) the surface 1012 that is exchanging heat with the substrate W to provide accurate temperature measurements of the surface 1012 that is exchanging heat with the substrate W.

Temperature sensors may be provided in other locations of the cooling element 1002. For example, a temperature sensor 1014 is depicted in dashed outline generally in the vicinity of a roof portion 1015 of the cooling element 1002.

As described with reference to the temperature sensor 1010, the temperature sensor 1014 may have a laminar construction to provide small sensor which is nonetheless protected from the ambient environment of the lithographic apparatus. It will be appreciated, however, that one or each of the temperature sensors 1010, 1014 may be constructed in any other appropriate manner. For example, while it is described above that the temperature sensor 1010 may be within the laminar construction of the cooling element 1002, in other embodiments, the temperature sensor 1010 and/or the temperature sensor 1014 (and/or other temperature sensors provided) may be separated from the body of the cooling element. For example, one or more temperature sensors may be separated from surfaces of the cooling body by thin struts or membranes. In this way, the temperature sensors may be thermally decoupled from the cooling element 1002. By decoupling the sensor from the cooling element 1002, the sensor may respond more rapidly to changes in the temperature of the substrate W.

By providing two temperature sensors 1010, 1014 at different distances from the substrate W, a more accurate determination of the temperature of the substrate W may be obtained by determining the heat flux through the gap between the cooling element and the substrate W. In some embodiments, one, both or the combination of the temperature sensors 1010, 1014 provides temperature measurements of millikelvin (mK) resolution or lower and may provide a response time of one second or lower. By separating the temperature sensors 1010, 1014 from the body of the cooling element 1002 (as discussed above), the response time of the sensors may be improved.

Temperature sensors may additionally be provided in other areas of the lithographic apparatus, such as the substrate table WT. For example, the substrate table WT may be provided with channels to allow for the flow of a coolant (such as water) to remove heat from the substrate table WT. Temperature sensors may be provided to detect a difference in the temperature of the coolant entering the channels and the temperature of the coolant leaving the channels. Feedback and/or feedforward controls may be used to adjust the temperature of the coolant supplied to the substrate table WT in response to detected changes in the temperature to maintain an overall temperature balance within the substrate W.

Generally, a temperature of an area of the substrate W to be cooled (e.g., the area within the vicinity of the exposure area E) may be controlled by any of a plurality of mechanisms in response to determined temperatures at various points within a cooling system (including, for example, the gap G, the coolant supply conduits, the cooling gas supply conduits, the substrate table WT, etc.). Some temperature control mechanisms may be more suitable for controlling high-frequency temperature variations, while temperature control mechanisms may be more suitable for addressing low-frequency temperature variations (or drift). For example, adjusting a gap between the cooling surface of a cooling element and the substrate W may be utilised to make high-frequency adjustments to the thermal transfer coefficient between the cooling element and the substrate W. Where it is determined that the temperature of the cooling surface (e.g., the cooling surface 1012 of FIG. 24) should be adjusted (e.g., the temperature of the cooling surface drifts from a desired temperature), the temperature of the cooling fluid supplied to the cooling element may be adjusted. As described above, the temperature of the cooling fluid may be adjusted in any appropriate way and may depend upon the method by which the cooling fluid is provided to the cooling element. As one example, the temperature of the cooling fluid may be adjusted using heaters provided within or around the conduits providing the cooling fluid to the cooling element.

In some embodiments, a pre-exposure calibration operation may be performed to ensure that the amount of cooling that is provided to the substrate W is within a desired range. As the calibration operation need not be performed with high frequency, the calibration operation may utilise measurements obtained from a substrate table cooling system, in addition to, or rather than, measurements obtained from sensors near to a cooling surface of a cooling element. In contrast, because in-exposure adjustments to the temperature may require high frequency adjustments, such adjustments may be primarily based upon temperature readings obtained from sensors such as the sensor 1010 of FIG. 18.

With reference to various embodiments described above, it is described that the supply of cooling gas to the area to be cooled may be controlled by use of a valve. In particular, it may be desirable to prevent cooling when the substrate W is being moved after exposure of a target portion and before exposure of the next target portion. This is advantageous because there is no benefit to be had by cooling the substrate W when the radiation beam B is not heating the substrate. Indeed, as described above, it may be desirable to maintain an overall heat-balance such that the heat energy supplied to the substrate W is equal to the heat removed by a cooling element.

In order to allow the cooling gas to be switched off quickly, the valve supplying the cooling gas may be operable to switch between an open and a closed position within approximately 3 ms. In some embodiments, the valve may be a piezo valve. Generally, it may be desirable to provide a valve with a large stroke and a high resonance frequency.

FIG. 25, consisting of FIG. 25a and FIG. 25b, schematically illustrates an example valve 1020 that may be utilised with any of the embodiments described herein to provide a cooling gas to the area to be cooled. The valve 1020 operates in a sliding fashion to toggle between an on state (cooling gas provided to the area to be cooled) and an off state (cooling gas vented away from the area to be cooled). The valve 1020 comprises a housing 1022 and a sliding member 1024. The sliding member 1024 is slidable within a cavity 1028 between a first position (depicted in FIG. 25a) and a second position (depicted in FIG. 25b). The cavity 1028 is in fluid communication with a cooling element and therefore the area to be cooled. In the first position, a cooling ingress 1026 is in fluid communication with the cavity 1028 such that cooling gas flows from the ingress 1026, through the cavity 1028 towards the cooling element and to the area to be cooled. A fluid path from the cavity 1028 and a vent 1030 is blocked by the abutment or closer proximity of the sliding member 1024 against the housing 1022.

In the second position, the fluid path between the ingress 1026 and the cavity 1028 is closed or restricted through interaction between the sliding member 1024 and the housing 1022. As such, cooling gas is prevented from flowing from the ingress 1026 to the cavity 1028. In the second position, the vent 1030 is in fluid communication with the cavity 1028 to allow cooling gas already present in the cooling element to egress through the valve 1020.

So as to prevent contamination, it may be desirable to prevent particles from entering the stream of cooling gas and being carried to the substrate W. As such, the valve 1020 may be constructed such that a gap is maintained between the sliding member 1024 and the housing 1022 at all times. That is, in some embodiments, the valve 1020 is constructed such that no part of the valve 1020 which comes into contact with the flow of cooling gas comes into physical contact with the housing 1022. For example, in FIG. 25*a* an arrow 1032 points to a location at which the sliding member 1024 is closest to the housing 1022 in the first ("open") position. In some embodiments, a small gap is maintained between the sliding member 1024 and the housing 1022 at the location pointed to by arrow 1032. Similarly, with reference to FIG. 25*b*, in the second ("closed") position, the sliding member 1024 may be separated from the housing 1022 at the position 1034. While this may mean that a small quantity of cooling gas is able to enter the cavity 1028 (and therefore the cooling element) when the valve 1020 is in the closed position, the cooling gas will be sufficiently reduced to prevent cooling. For example, the size of a gap maintained between the sliding member 1024 and the housing 1022 may be selected so as to prevent 97% of the open flow of cooling gas when the valve is in the closed position.

FIG. 26, consisting of FIG. 26*a* and FIG. 26*b*, schematically illustrates an alternative design of a valve 1040 which may be utilised with any of the embodiments described herein to control a flow of cooling gas to the area to be cooled. The valve 1040 comprises a housing 1042 and a sliding member 1044. The sliding member 1044 is arranged to slide between a first position (FIG. 26*a*) and a second position (FIG. 26*b*). In the first position, the sliding member 1044 is positioned such that a cooling gas ingress 1046 is in fluid communication with a cavity 1048. The cavity 1048 is in fluid communication with a cooling element and therefore an area to be cooled. In the first position, a fluid path between a vent 1050 and the cavity 1048 is blocked by the housing 1042. In the second position, the fluid path between the cooling gas ingress 1046 and the cavity 1048 is blocked by the housing 1042, preventing cooling gas from the cooling element and the area to be cooled. In the second position, the vent 1050 is in fluid communication with the cavity 1048 allowing cooling gas to vent from the cooling element.

As with the valve 1020, in some embodiments, a gap may be maintained between the sliding member 1044 and the housing 1042 so as to prevent particles from entering the flow of cooling gas. Such a gap is visible in FIGS. 26*a* and 26*b*. As described above, in some embodiments, the gap may be selected such that, in the closed position, 97% of the flow of cooling gas is prevented from entering the cavity 1048.

FIG. 27 depicts an alternative cooling surface that may be used in combination with the cooling elements described herein. In FIG. 27, a cooling body 1100 comprises a channel 1102 for providing cooling gas to a substrate W. In common with some other embodiments, no gas delivery conduit is depicted in FIG. 27 although in practice the embodiment will include a gas delivery conduit. A lowermost surface 1104 (i.e., the part of the cooling body 1100 which is closest to the substrate W) is provided with a non-flat, three-dimensional structure configured to increase the effective thermal accommodation coefficient of the surface 1104. In the particular example of FIG. 27, the surface 1104 is provided with a plurality of repeating rectangular grooves 1106, although it will be appreciated that this is merely exemplary. For example, other structures may be used, such as honeycomb structures, or "V-shaped" grooves. The structures may be repeating structures or non-repeating structures. In one embodiment, the surface 1104 may be provided with a structure which satisfies:

$$\frac{f^{2.04}}{1 + 0.47 \cdot R^{-1.96}} > 0.05$$

wherein f is the fraction of the structure which is occupied by space, and R is the depth of the structure divided by the width of the structure. In tests, providing a structure on the surface of a cooling body may increase the effective thermal accommodation coefficient by approximately 10% to 15%. Additional details as to the types of structures that may be used may be found in U.S. Pat. No. 8,970,818.

In some of the embodiments described above, a cooling element comprises two cooling bodies each of which provides cooling on a respective side of an exposure area E. For example, in FIG. 3, the cooling body 42 provides cooling on one side of the exposure area E, while the cooling body 44 provides cooling on the other side of the exposure area E. Similarly, in the embodiment depicted in FIGS. 17 and 18, the cooling plate is arranged such that the gas expelled through the floor members 708 cools either side of an exposure area. It is also described above that it may be desirable to remove all of the heat that is added to the substrate W by the radiation beam B. In some embodiments, therefore, each cooling body is configured to remove 50% of the heat that is added by the radiation beam B. This may be referred to as a "uniform" cooling profile.

Figure 28:
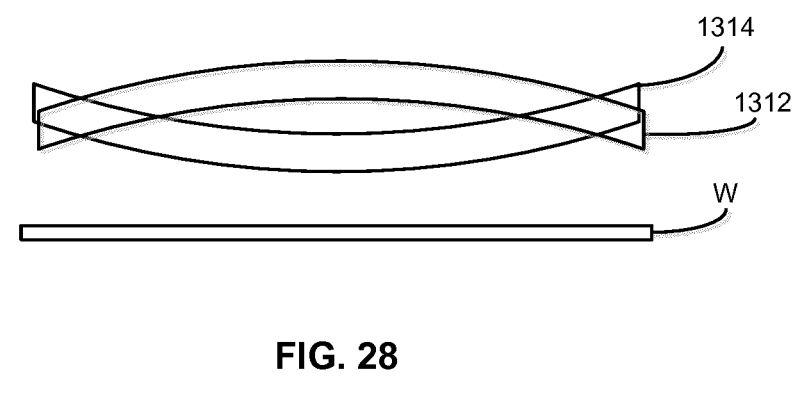
FIG. 28 schematically depicts bending of cooling elements in accordance with an embodiment described herein.

In some embodiments, however, it may be beneficial to provide a different cooling profile. In an embodiment, one or more of the cooling bodies may be bent during use so as to adjust the cooling profile that is provided to the substrate W. This is schematically illustrated in FIG. 28, in side view (the X-Z plane), showing two cooling bodies 1312 and 1314 which are bent so that the distance between each cooling body 1312, 1314 changes over the length of the cooling body. It will be appreciated that, in this way, the temperature gradient of the cooling gas between the cooling bodies and the substrate W will also vary over the length of the cooling body. In particular, where the bending causes a part of the cooling body 1312, 1314 to be further away from the substrate W, the cooling gas will provide less cooling than where the bending has caused the cooling body to be closer to the substrate W. By changing the profile of the cooling body in this way, the cooling profile is thereby adjusted. It may be desirable, for example, to bend the cooling body such that it has a substantially parabolic profile. This may for example be with a central portion of the cooling body being furthest from the substrate, such that more cooling is provided at edges of the exposure area than at the centre of the exposure area. This advantageously provides cooling which may improve the overlay performance of the lithographic apparatus, in situations in which the patterned radiation beam causes more substrate heating at edges of the exposure area than at the centre of the exposure area. In general, it may be desirable, for example, to bend the cooling body such that more cooling is provided at ends of the cooling body than at a centre of the cooling body. The bending may be two-dimensional (e.g. without significant bending along the scanning direction (Y-direction). The cooling bodies may be bent individually. It will be appreciated that the particular manner in which the cooling bodies 1312, 1314 are bent in FIG. 28 is merely exemplary for the purpose of explanation and that different profiles may be utilised to obtain differing cooling gas temperature-gradient profiles.

Bending of the cooling bodies 1312, 1314 may be performed through the use of one or more piezo-actuators provided on the cooling bodies 1312, 1314. For example, the cooling bodies 1312, 1314 may correspond to the floor members 708 of the embodiment of FIG. 18, and in this case, piezo-actuators may be provided at each end of one or more of the floor members 708. Control of the bending may be based on a feedforward model and may in addition utilise feedback received from the piezo-electric actuators. Control of the bending may for example have a control frequency of the order of 300 to 3000 Hz. A cooling body 1312, 1314 may be bent so as to increase or decrease the distance between a portion of the cooling body and the substrate W by approximately ±10 to 100 µm, with a "default" distance between any the cooling bodies and the substrate W being approximately 20 to 200 µm. In this case, bending of the cooling bodies allows for the heat transfer coefficient to be increased or decreased by a factor of two.

Figure 29:
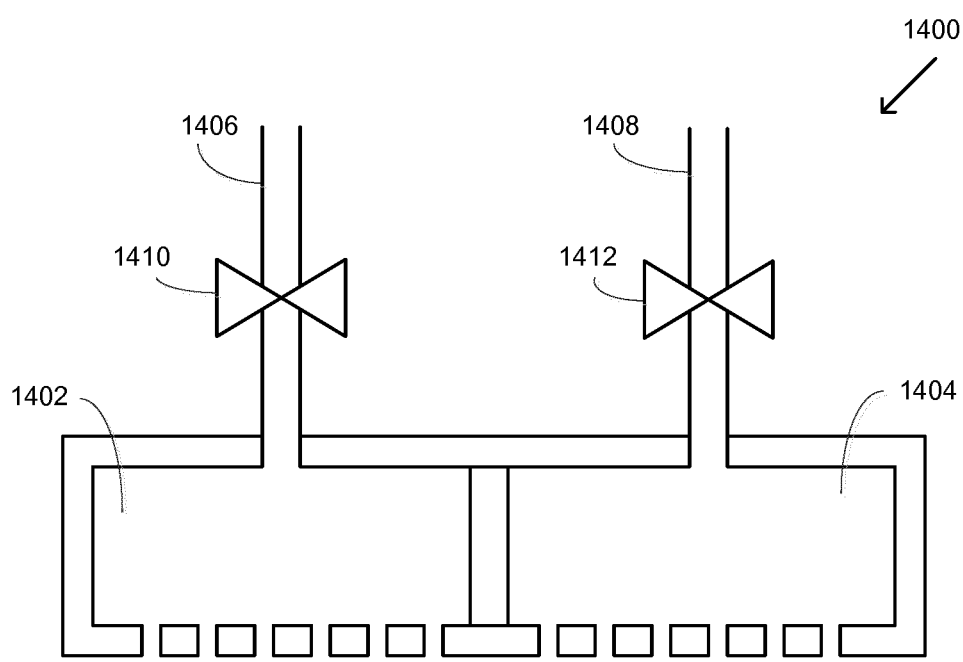
FIG. 29 schematically depicts a cooling element having a plurality of individually controllable chambers in accordance with an embodiment described herein.

FIG. 29 schematically illustrates an alternative embodiment which may be used to adjust the cooling profile provided by a cooling element away from a uniform cooling profile. In the embodiment of FIG. 29, a cooling element 1400 is formed with two internal chambers 1402, 1404, each fed by an independently controllable cooling gas supply 1406, 1408. For example, with reference to FIG. 17, each of the chambers 1402, 1404 of FIG. 29 may correspond with a respective one of the floor members 708. In this way, the gas supplied to each cooling body may be controlled. It will be appreciated that different arrangements of individually controllable chambers may be provided within a cooling element. For example, each cooling body of a cooling element may comprise a plurality of chambers, each of which may be individually controllable. In this way, the amount of cooling gas that is expelled from each of the chambers 1402, 1404 towards the substrate W may be controlled, in turn allowing for control of the cooling that is provided to the area of the substrate W under cooling element 1400.

In the example depicted in FIG. 29, each of the supplies 1406, 1408 is controllable with a respective valve 1410, 1412 so as to control the cooling gas that enters the chamber 1402, 1404. It will be appreciated, however, that alternative methods of controlling the supply of cooling gas into or out of a particular chamber of a cooling element may be used. For example, means may be provided to selectively open or close one or more of the holes through which cooling gas is expelled onto the wafer. For example, a slidable mask may be provided within or on an underside of the chamber, such that sliding the mask into different positions alters which holes of a chamber the cooling gas may exit from. It will be appreciated that such a mask arrangement may additionally be used for a cooling element having only a single chamber. Other methods of creating a variable cooling gas pressure profile across a cooling element will be apparent given the teaching herein.

As with other embodiments described herein, feedback and feedforward processes may be utilised to control the pressure profile of the cooling gas between the cooling element and the substrate W.

Figure 30:
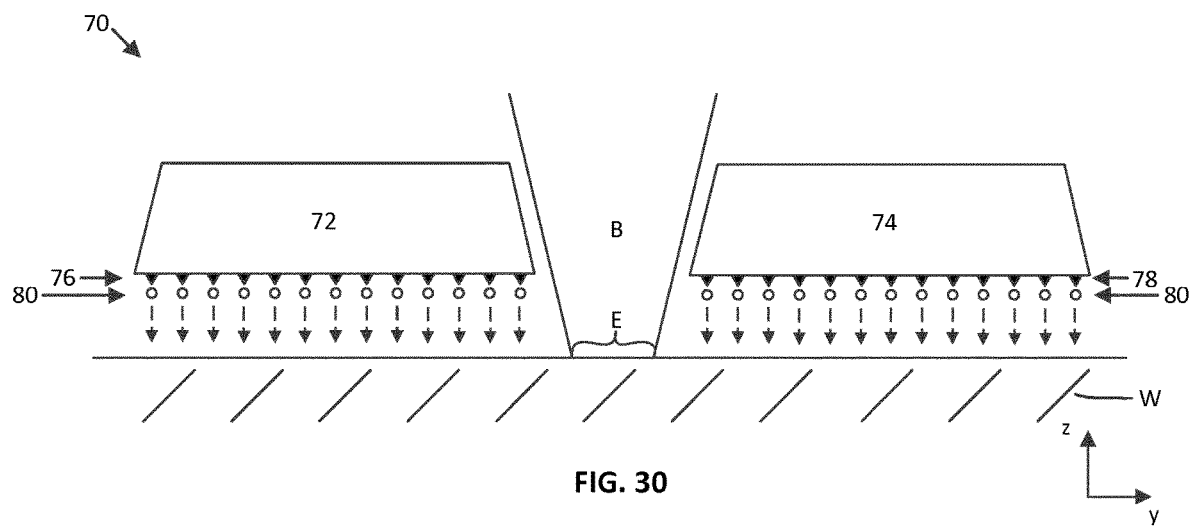
FIG. 30 schematically depicts a cooling apparatus of the lithographic apparatus according to an alternative embodiment of the invention.

An alternative embodiment of the invention is schematically depicted in FIG. 30. The cooling apparatus 70 of FIG. 30 is similar to the embodiment described above in that it comprises a pair of cooling elements 72, 74, however in this embodiment a different cooling mechanism is used to remove heat from the substrate W. Each cooling element 72, 74 is provided with an array of nozzles 76, 78 which is arranged to direct droplets of liquid onto the substrate W. The droplets of liquid are schematically depicted by circles 80 in FIG. 30. The liquid may be water, and the embodiment of FIG. 30 is described in connection with water droplets being used. However, any other suitable liquid may be used. The droplets of water receive heat from the substrate W and evaporate from the surface of the substrate. The transfer of heat to the water droplets and the evaporation of the droplets provides cooling of the substrate W. Evaporation of the droplets from a region of the substrate W which is being cooled may be completed before that region is illuminated by the radiation beam B.

The nozzle arrays 76, 78 may be two-dimensional arrays. The nozzles may for example be provided as rectangular arrays (e.g. with the nozzles having a rectangular grid-like arrangement). Each nozzle array 76, 78 may have any suitable arrangement. The nozzles may be evenly distributed across each array 76, 78. The nozzles may be arranged to provide an even distribution of water droplets on the substrate W.

The considerations set out further above regarding the positioning of the cooling elements 42, 44 of the previously described embodiment generally apply in connection with the positioning of the cooling elements 72, 74 of this embodiment. Thus, for example, the cooling elements 72, 74 are located either side of the radiation beam B in the scanning-direction (i.e. in the Y-direction). The cooling elements 72, 74 are adjacent to an exposure area E. In this context the term "adjacent" may be interpreted as meaning less than 1 cm from an edge of the exposure area E. The cooling elements 72, 74 may be less than 0.5 cm from an edge of the exposure area E, and may be around 0.1 cm from an edge of the exposure area. Each cooling element may be configured to cool an area which lies within 3 cm or less from a line which bisects the exposure area E. Each cooling element may be configured to cool an area which lies within 2 cm or less from an edge of the exposure area.

For the reasons explained further above, the extent of a nozzle array in the Y-direction may be equal to or greater than the maximum exposure area length of the lithographic apparatus in the Y-direction. A nozzle array may for example be configured to deliver water droplets to an area which extends around 26 mm in the X-direction. Each nozzle array may for example be configured to deliver water droplets to an area which extends around 5 mm in the Y-direction.

The separation between a bottom surface of each cooling element 72, 74 (which may be taken as being the bottom surfaces of the nozzles 76, 78) may be significantly larger than in the embodiment described further above because different considerations apply. The bottom surface of a cooling element may be referred to as a cooling surface and vice versa. Some evaporation of the water droplets will occur as the water droplets travel from the nozzles 76, 78 to the substrate W. However, provided that the water droplets are not fully vaporized before they reach the substrate W, the water droplets will provide some cooling of the substrate. The amount of evaporation of water droplets which occurs will depend upon the time of flight of the water droplets, and this in turn will depend upon the speed of the water droplets and the separation between the cooling elements 72, 74 and the substrate W. A separation of a millimeter or more (e.g. up to around 5 mm) may for example be provided without causing a problematic amount of water droplet evaporation (e.g. evaporation during travel to the substrate W may be around 50% or less and may be less than 10%). A smaller separation may be provided, for example 50 microns or more. As noted further above, a separation of 50 microns may be sufficient to substantially eliminate the risk of contact between the cooling elements 72, 74 and the substrate W.

The proportion of a water droplet which evaporates during a given time will depend upon the radius of the water droplet. The water droplets of embodiments of the invention may for example have a diameter of the order of microns or tens of microns. For example, the water droplets may have a diameter of around 20 microns. Where this is the case the time taken for half of a water droplet to evaporate may be around 5 ms. The nozzles 76, 78 may direct water droplets towards the substrate at a speed of around 10 m/s. If the separation between the nozzles and the substrate is 5 mm then around 6% of the water droplet will evaporate before it reaches the substrate W. If less evaporation is desired or a lower droplet speed is desired then the separation between the cooling elements 72, 74 and the substrate W may be reduced accordingly. For example, reducing the separation to 100 microns will allow droplets to be delivered at the same speed with round 0.1% evaporation.

Each cooling element 72, 74 may be arranged to remove around 1.5-3 W from the substrate. The evaporation energy of water is $2 \times 10^6$ J/kg. Thus, in order for example to remove 2 W from the substrate, water droplets may be delivered to the substrate at a rate of around 1 mg/s.

Although the embodiment described in connection with FIG. 30 comprises two cooling elements 72, 74 other embodiments of the invention may comprise other numbers of cooling elements. For example, a single cooling element may be provided. The single cooling element may for example have a nozzle array which extends along one side of the exposure area E. Where this is the case the cooling element will cool the exposure area either before exposure or after exposure (depending upon the scanning direction during that exposure). Alternatively, a single cooling element may for example extend around a plurality of sides of the exposure area (e.g. have a nozzle array which extends around a plurality of sides of the exposure area). A single cooling element may for example extend around a perimeter of the exposure area (e.g. have a nozzle array which extends around the perimeter of the exposure area).

In an alternative example more than two cooling elements may be provided. For example four cooling elements may be provided, one cooling element being provided adjacent to each edge of the exposure area.

It will be appreciated that, where appropriate, variations described further above in connection with the previously described embodiment may also be applied to the currently described embodiment.

Although the described embodiment uses water droplets, any other suitable liquid which will evaporate from a substrate may be used. For example, $CO_2$, $H_2$, or inert gas held at sufficiently high pressure and/or a sufficiently low temperature to be in liquid form may be ejected from the nozzle array.

Figure 31A:
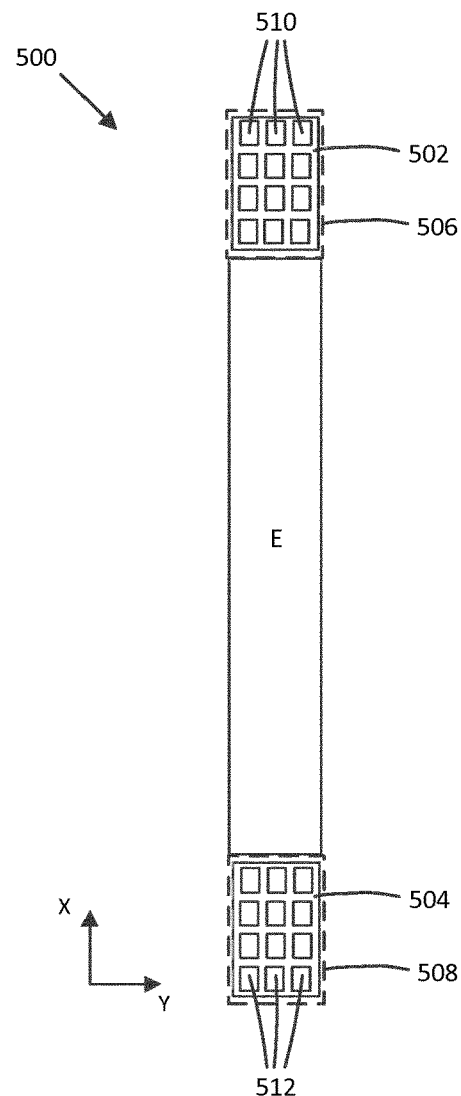
FIGS. 31a and 31b schematically depict a heating apparatus of the lithographic apparatus according to an embodiment of the invention.
Figure 31B:
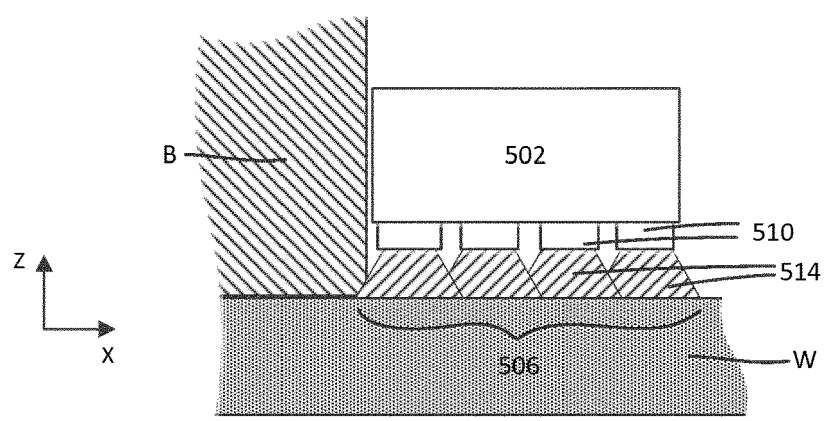

An alternative embodiment of the invention comprises a heating apparatus. FIGS. 18-22 schematically depict embodiments of the heating apparatus and show how the heating apparatus may be used. FIG. 31A is a schematic view of a heating apparatus 500 viewed from below, and FIG. 31B is a schematic view from one side of a heating element 502 of the heating apparatus. The radiation beam B projected by the lithographic apparatus is shown in FIG. 31B, and the exposure area E illuminated by the radiation beam is shown in FIG. 31A.

In common with other illustrated embodiments, Cartesian coordinates are shown in FIGS. 18-22 and use the conventional notation for lithographic apparatus, i.e. the Y-direction is the direction of scanning movement of the substrate W during exposure, the X-direction is transverse to the Y-direction and lies in the plane of the substrate, and the Z-direction generally corresponds with the optical axis of the radiation beam B.

The heating apparatus 500 comprises a first heating element 502 and a second heating element 504. As depicted in FIG. 31A the first and second heating elements 502, 504 may have the same overall construction. The heating elements 502, 504 are located at opposite ends of the exposure area E in the non-scanning direction (i.e. in the X-direction). The heating elements 502, 504 may be adjacent to the exposure area E. In this context the term "adjacent" may be interpreted as meaning less than 1 cm from an edge of the exposure area E. The heating elements 502, 504 may be less than 0.5 cm from an edge of the exposure area E, and may be around 0.1 cm from an edge of the exposure area.

Each heating element 502, 504 provides localized heating of the substrate W in an area which lies directly beneath that heating element. The area which is heated by each heating element 502, 504 may also extend beyond the area which is located directly beneath that heating element. The heated area is schematically depicted in FIG. 31A by dotted lines 506, 508. Each heating element 502, 504 comprises an array of LEDs 510, 512 which are configured to emit infrared radiation. Although the depicted arrays of LEDs 510, 512 each comprise twelve LEDs, any suitable number of LEDs may be used.

FIG. 31B depicts one of the heating elements 502 viewed from one side. As may be seen, the LEDs 510 emit infrared radiation beams 514. The infrared radiation beams 514 diverge and thus illuminate an area 506 on the substrate W which extends beyond the footprint of the heating element 502. As is schematically depicted in FIG. 31B, at least one of the infrared radiation beams 514 may overlap with an edge of the radiation beam B. Thus, the heating apparatus 500 may heat an area which overlaps with the exposure area E.

In general, a heat emitter of a heating element 502, 504 may be configured to emit heat with some outward divergence such that the area 506, 508 on the substrate which receives heat extends beyond the footprint of the heating element.

The heating element 502 delivers localized heating to the substrate W which acts to heat the portion of the substrate which is immediately outside of the edge of the exposure area E (in the X-direction) illuminated by the radiation beam B. As a result, the temperature of the substrate W does not drop off rapidly at the edge of the exposure area E, but instead reduces more slowly. This is advantageous because distortion of the substrate which would otherwise be caused by such a temperature drop is reduced. This enables an improvement of the accuracy with which a pattern may be projected onto the substrate W by the lithographic apparatus LA (it may provide an improvement of the overlay performance of the lithographic apparatus).

Figure 32:
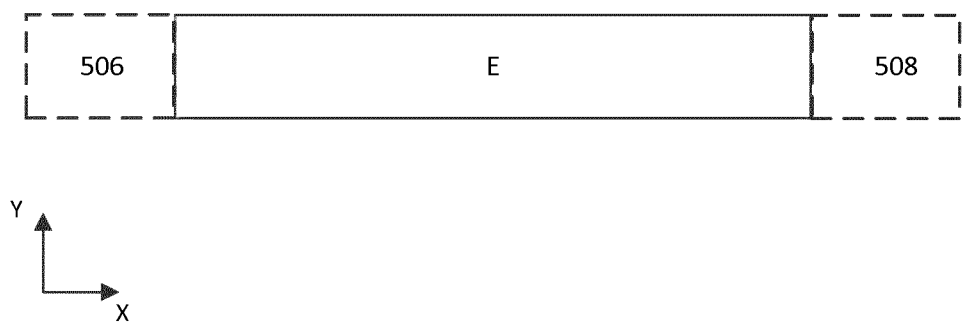
FIG. 32 schematically depicts the effect of the heating apparatus shown in FIG. 31.

FIG. 32 schematically depicts the exposure area E which is exposed by the radiation beam B of a lithographic apparatus, and in addition schematically depicts the areas 506, 508 which are heated by the heating elements of the heating apparatus. As may be seen in FIG. 32, one of the heated areas 506 adjoins the exposure area E on one side in the X-direction of the exposure area, and the other heated area 508 adjoins the exposure area E on the opposite side in the X-direction. As has been mentioned above, the heating elements heat the substrate such that thermal gradients which would otherwise be present at the X-direction edges of the exposure area E are not present (or are reduced). Instead, those thermal gradients are moved outwards in the X-direction to edges of the heated areas 506, 508 which are distal from the exposure area E. Since these edges are not being exposed by the radiation beam B, the presence of thermal gradients at those edges does not have a significant effect upon the accuracy with which patterns are projected onto the substrate W.

In an embodiment, the heated areas 506, 508 may overlap with X-direction edges of the exposure area E. Although the exposure area E is depicted as having a sharp edge, in practice it may have a blurred edge as the intensity of the radiation beam B decreases in the X-direction. Similarly, the heated areas 506, 508, although depicted with sharp edges, may have blurred edges where the heat provided by the infrared radiation beams 514 drops off gradually in the X-direction. The heating elements 502, 504 may be configured such that blurred edges in the X-direction of the heated areas 506, 508 overlap with blurred edges of the exposure area E. Thus, there may be a gradual transition in the X-direction from an area which is heated by the radiation beam B to an area which is heated by a heating element 502, 504.

The heating elements 502, 504 may be configured to emit infrared radiation (as noted above) because infrared radiation is not actinic for lithographic resist. Other non-actinic wavelengths of radiation may be emitted by the heating elements 502, 504. Although the illustrated embodiment uses LEDs 510, 512 to provide radiation beams 514 which deliver heat to the substrate W, any suitable form of heat emitter may be used to emit heat onto the substrate. The heating area may also have a size in the scanning direction that is larger than that of the exposure area. The heating in the heating area does not need to be uniform.

The heating apparatus 500 may be mounted on a housing of the projection system PS. This may for example be done in a manner which generally corresponds with the mounting of the cooling apparatus 40 schematically depicted in FIG. 1. The cooling areas may be larger in X-direction when heating is applied, i.e. they may extend until the width in X-direction until features 506+E+508 of FIG. 31.

Figure 33:
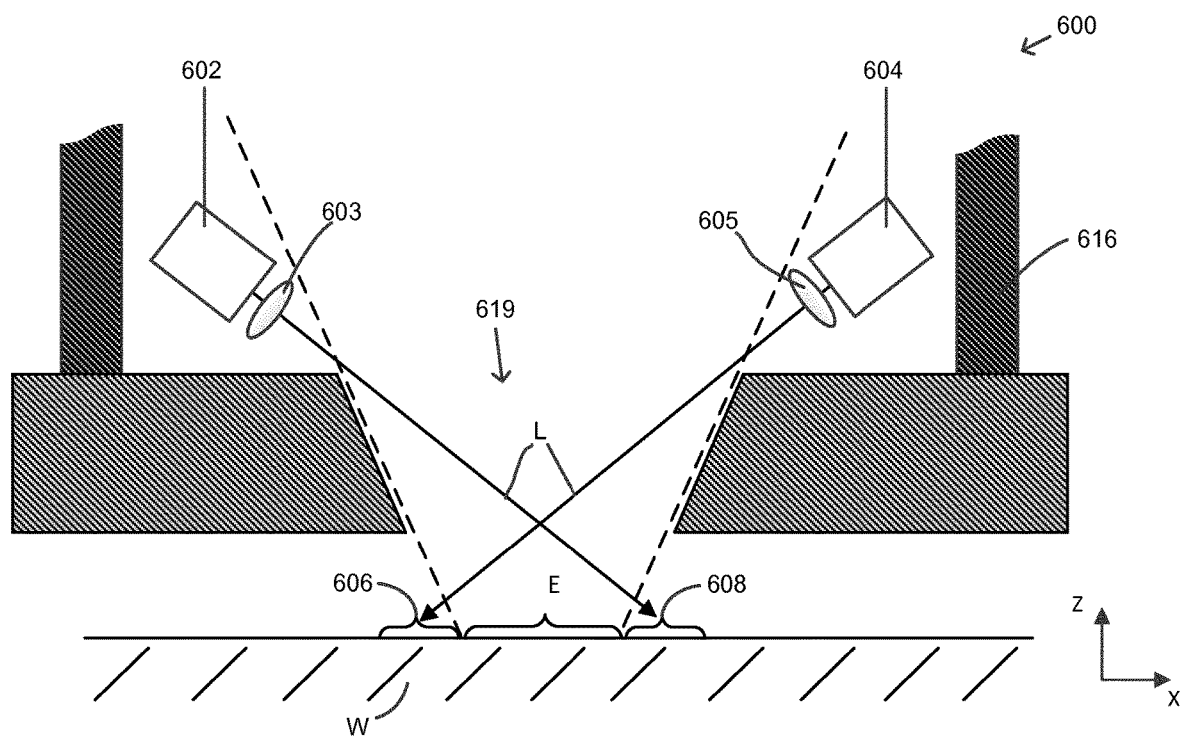
FIG. 33 schematically depicts a heating apparatus of the lithographic apparatus according to an alternative embodiment of the invention.
Figure 34:
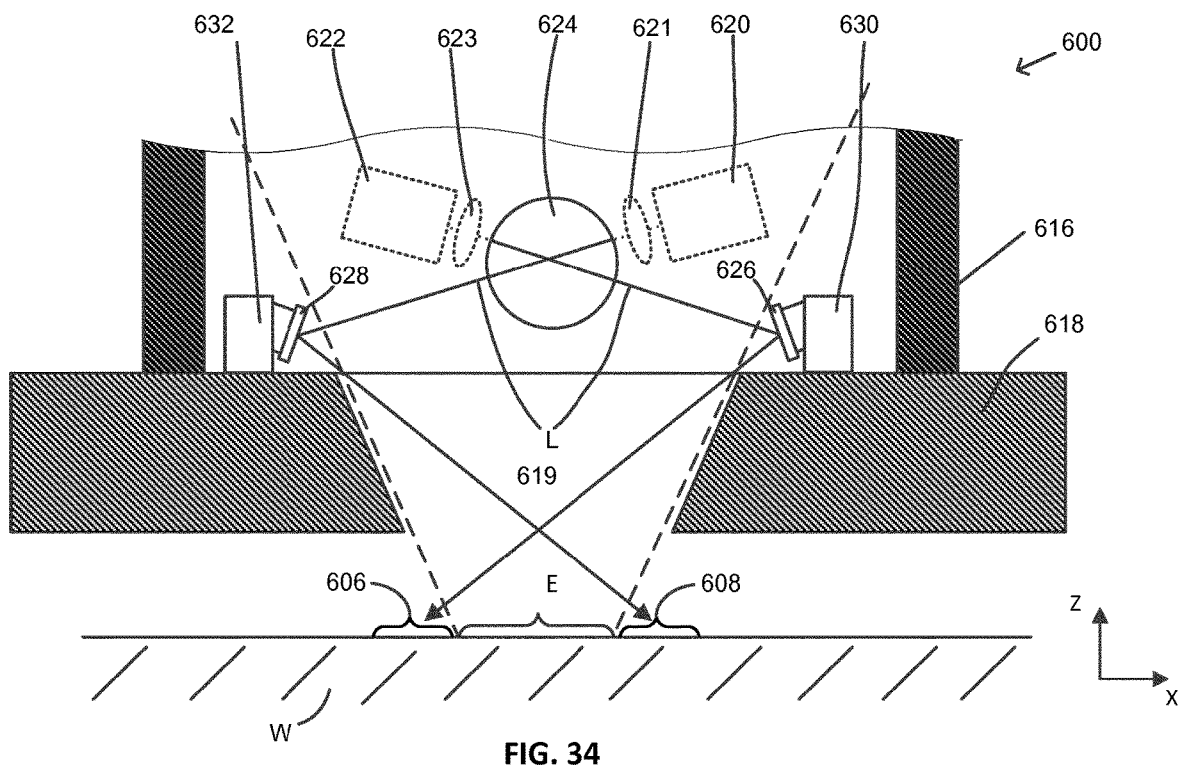
FIG. 34 schematically depicts a heating apparatus of the lithographic apparatus according to a further alternative embodiment of the invention.

FIGS. 33 and 34 schematically depict alternative embodiments of a heating apparatus which may be used instead of the heating apparatus depicted in FIG. 31. Referring first to FIG. 33, the heating apparatus 600 comprises a first laser 602 and a second laser 604 which are configured to output laser beams L that are incident upon a substrate W. The laser beams L illuminate areas 606, 608 on either side of the exposure area E which is illuminated by the radiation beam B of the lithographic apparatus. The illuminated areas 606, 608 may adjoin the exposure area E. The lasers 602, 604 are examples of heating elements.

The laser beams L illuminate areas 606, 608 on the substrate W which generally correspond with the areas 506, 508 depicted in FIG. 32. The shape and size of these areas may be determined by optics 603, 605. The optics 603, 605 may include mirrors which are used to direct the laser beams onto the substrate W. The laser beams L may for example be infrared laser beams. The laser beams L may have some other non-actinic wavelength. The laser beams L deliver localized heating to the substrate W which acts to heat the portion of the substrate which is immediately outside of the edge of the exposure area E (in the X-direction) illuminated by the radiation beam B. As a result, the temperature of the substrate W does not drop off rapidly at the edge of the exposure area E, but instead reduces more slowly. This provides the advantage that distortion of the substrate which would otherwise be caused by such a temperature drop is reduced. This in turn provides an improvement of the accuracy with which a pattern may be projected onto the substrate W by the lithographic apparatus LA (it may provide an improvement of the overlay performance of the lithographic apparatus). This is explained in more detail further above in connection with FIG. 32.

Areas 606, 608 on the substrate W which are illuminated by the laser beams L may overlap with X-direction edges of the exposure area E. The exposure area E may have a blurred edge at which the intensity of the radiation beam B decreases in the X-direction. Similarly, areas 606, 608 which are illuminated by the laser beams L may have blurred edges where the intensity of the laser beams decreases in the X-direction. The laser beams L may be positioned such that blurred edges in the X-direction of the areas 606, 608 illuminated by the laser beams overlap with blurred edges of the exposure area E. Thus, there may be a gradual transition in the X-direction from an area E which is heated by the radiation beam B of the lithographic apparatus to areas 606, 608 which are heated by the laser beams L.

The laser beams L travel out through an opening 619 in a floor 618 of the projection system housing. The opening 619 is provided primarily to allow the radiation beam B of the lithographic apparatus to exit the projection system housing and be incident upon the substrate W. However, the laser beams L also make use of the opening 619. The laser beams L may for example cross over each other (e.g. in the X-direction) as schematically depicted in FIG. 33.

The lasers 602, 604 may be provided within a housing 616 of the projection system PS of the lithographic apparatus (see FIG. 1). The environment within the housing may be a vacuum environment, and lasers suitable for use in a vacuum environment may be selected (e.g. lasers which do not suffer from significant outgassing). In an alternative approach lasers may be located outside of the housing 616 of the projection system with laser beams passing through one or more windows provided in a wall of the projection system housing. This is schematically depicted in FIG. 34.

Referring to FIG. 34, an embodiment of the heating apparatus 600 is depicted which is configured to operate in a manner that corresponds with that described above in connection with FIG. 33, but in which lasers 620, 622 are located outside of the housing 616 of the projection system. The lasers 620, 622 may be considered to be examples of heating elements. The lasers 620, 622 may be located remotely from the housing 616 and provide laser beams L which travel from those remote locations to the projection system housing 616. A window 624 is provided in the projection system housing 616. The window 624 may for example be formed from quartz or some other suitable material, and is substantially transparent at the wavelength of the laser beams L. Mirrors 626, 628 located within the projection system housing 616 are configured to receive and reflect the laser beams L. The mirrors 626, 628 are oriented to direct the laser beams L onto the substrate W on either side (in the X-direction) of the exposure area E. The laser beams L thus illuminate areas 606, 608 either side of the exposure area E (e.g. adjoining the exposure area). The shape and size of the illuminated areas 606, 608 may be determined by optics 621, 623 located downstream of the lasers 620, 622.

The mirrors 626, 628 are held by mountings 630, 632. The mountings may be fixed such that the orientations of the mirrors 626, 628 are fixed. Alternatively, the mountings 630, 632 may include actuators which are configured to adjust the orientations of the mirrors 626, 628. The actuators may be controlled by a controller (not depicted). If actuators are provided then these actuators may be used to change the positions at which the laser beams L are incident upon the substrate W. This positional adjustment may be used for example if an exposure area E with a reduced X-direction dimension is selected by an operator of the lithographic apparatus. Advantageously, this may ensure that the areas

606, 608 illuminated by the laser beams L continue to adjoin edges of the exposure area E.

Mirrors on actuators may be provided at any suitable locations, and may be used to control the positions of the illuminated areas 606, 608 on the substrate W.

Although the embodiments of FIGS. 33 and 34 have two lasers, any suitable number of lasers may be used. For example, a single laser may be used to provide a single laser beam which is then split into two beams (e.g. using a beam splitter), so that a first laser beam can illuminate one substrate area 606 and the other laser beam can illuminate the second substrate area 608.

The Y-direction extent of the areas 506, 508, 606, 608 illuminated by the heating apparatus 500, 600 may generally correspond with the Y-direction extent of the exposure area E illuminated by the radiation beam B. This is advantageous because it allows the heating apparatus to deliver heat at either end of the exposure area E in a manner which corresponds with the manner with which heat is delivered by the radiation beam B.

The heating elements of the heating apparatus 500, 600 may be switched off when the radiation beam B is not incident upon the substrate W. This may occur for example when the substrate W is being moved after exposure of a target portion and before exposure of the next target portion. This is advantageous because there is no benefit to be had using the heating apparatus 500, 600 to heat the substrate W when the radiation beam B is not heating the substrate.

Figure 35:
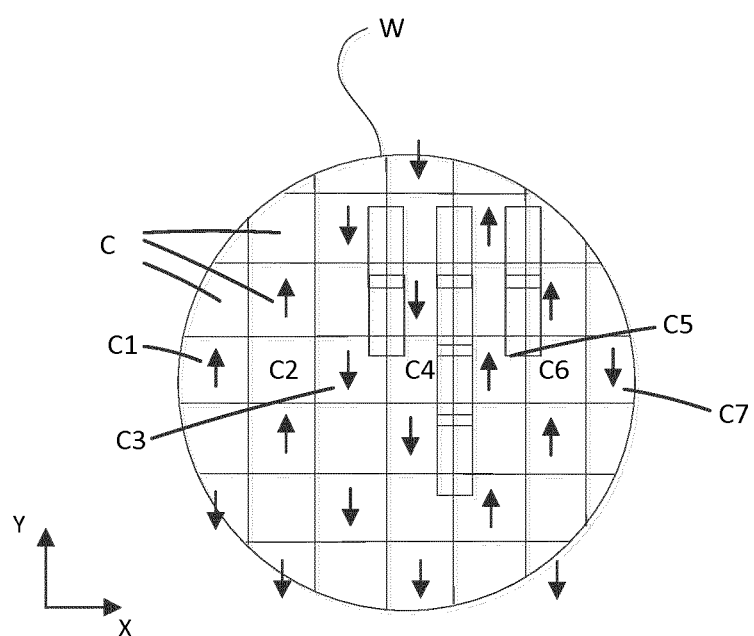
FIG. 35 schematically depicts scanning exposure of a substrate using the embodiment depicted in FIGS. 31 to 34.

FIG. 35 schematically depicts a substrate W divided up into an array of target portions C. In a conventional scanning exposure of a substrate W a meander path is used in which adjacent target portions C of the substrate in the X-direction are exposed in series. When a heating apparatus 500, 600 according to an embodiment of the invention is used a different form of meander path may be used in which adjacent target portions in the X-direction are not exposed. Instead, target portions separated in the X-direction by at least one interposed target portion may be exposed. An example of this is schematically depicted in FIG. 35. In FIG. 35 the arrows depict the direction of scanning exposure of the target portions. Thus, referring to the labelled row of target portions, C1 is exposed by a scanning exposure in the +Y-direction, then C3 is exposed by a scanning exposure in the −Y-direction. C2 is not exposed because it has received heat from the heating apparatus 500, 600 and thus may include some localised distortion. C5 is then exposed by a scanning exposure in the +Y-direction, following which C7 is exposed by a scanning exposure in the −Y-direction. C4 and C6 are not exposed because they have received heat from the heating apparatus 500, 600 and may include some localised distortion.

Once all of the target portions which include arrows in FIG. 35 have been exposed, the other target portions may be exposed. This approach is advantageous because it allows time for heat which has been delivered to target portions by the heating apparatus 500, 600 to dissipate before those target portions are exposed using the lithographic apparatus.

The X-direction extent of the heated areas 506, 508, 606, 608 may be less than the X-direction extent of the exposure area E. This is advantageous because it avoids a given heating element heating multiple target portions at the same time. Referring to FIG. 35, it will be appreciated that if a heated area 506, 508, 606, 608 extended by more than the X-direction extent of the exposure area then, for example, target portion C3 would be heated during exposure of target portion C1. This heating would cause unwanted distortion of target portion C3 that would be present during exposure of target portion C3.

The X-direction extent of each heated area 506, 508, 606, 608 may be less than half the X-direction extent of the exposure area E.

The heating apparatus 500, 600 may be used in combination with the cooling apparatus 40 described further above. The combined use of a cooling apparatus 40 and a heating apparatus 500, 600 might be expected to provide no net benefit because the effect of the cooling apparatus would cancel out the effect of the heating apparatus. However, this is not the case. The cooling apparatus 40 and the heating apparatus 500, 600 may be provided at different positions relative to the exposure area E to obtain different beneficial effects. Thus, for example, the heating elements 502, 504 of the heating apparatus 500 may be provided at X-direction ends of the exposure area E in order to reduce distortion arising at edges of the exposure area. This distortion, which may be referred to as an edge effect, is not a significant issue at the Y-direction edges of the exposure area E. This is because the scanning movement of the substrate W relative to the exposure area E averages the radiation delivered to the substrate W in the Y-direction such that edge effects do not arise. Thus, providing the cooling apparatus 40 at Y-direction edges of the exposure area E will provide the advantageous effects described further above without causing edge effects at the Y-direction edges. Therefore, the heating apparatus 500 may be provided at X-direction ends of the exposure area E and the cooling apparatus 40 may be provided at at least one Y-direction end of the exposure area. The heating apparatus 500 and the cooling apparatus 40 may be connected together to form a single unit.

References to the surface of the substrate in this document may be interpreted as referring to the surface of resist provided on the substrate.

As has been noted above, slipping of the substrate W over the surface of burls of the substrate table WT may reduce the accuracy with which a projected pattern is aligned with a previously projected pattern (generally referred to as overlay). Using above described embodiments may reduce or prevent slipping of a substrate W over burls. Additionally or alternatively, slipping of a substrate W over burls may be reduced or prevented by heating the substrate to a temperature which is above the temperature of the substrate table WT upon which it will be placed. For example, the substrate W may be heated by a temperature adjustment unit AU (see FIG. 1) to a temperature which is around 100 mK higher than the temperature of the substrate table WT. The temperature adjustment unit AU may comprise a plate which is held at the desired temperature. When the substrate W is placed onto the plate it is heated to the temperature of the plate. The heated substrate W is then placed onto the substrate table WT and a clamped to the substrate table using a clamp which forms part of the substrate table (e.g. an electrostatic clamp). The substrate then cools to the temperature of the substrate table, thereby introducing a stress into the substrate. The stress which is introduced into the substrate tends to draw an outer edge of the substrate inwards towards the centre of the substrate. When the substrate is patterned using the radiation beam B this heats the substrate and introduces stress which tends to push an outer edge of the substrate outwards away from the centre of the substrate. The stress already introduced during cooling of substrate will at least partially counteract the stress caused by heating of the substrate, thereby reducing the cumulative stress experienced by the substrate. This is particularly the case in the vicinity of the outer edge of the substrate. The reduction of cumulative stress reduces or prevents slippage of the substrate W over burls of the substrate table WT, particularly in the vicinity of the outer edge of the substrate. This is advantageous because slippage is most likely to occur in the vicinity of the outer edge of the substrate (the clamp may apply less force in the vicinity of the outer edge of the substrate than at other locations).

Although in the above example the temperature adjustment unit AU heats the substrate by 100 mK, the temperature adjustment unit may heat the substrate by other amounts. For example, the temperature adjustment unit may heat the substrate by up to around 0.5K.

In schematic illustrations of embodiments of the invention the exposure area E is depicted as a rectangle. This is for ease of illustration, and it will be appreciated that the exposure area E may have some other shape. The exposure area E may for example include some curvature along the X-direction (e.g. it may have a shape which generally resembles a banana).

Heat transfer between the cooling apparatus and the substrate may depend upon the cooling gas pressure and/or flow, the position (i.e. the x, y and z coordinates) of the cooling apparatus with respect to the substrate, a temperature difference between the cooling apparatus and the substrate, an ambient pressure of the lithographic apparatus and a proximity of the substrate edge to the cooling apparatus. In general, the gas supply may, for example, be configured to provide a gas at a pressure of 200 Pa or more. In general, it may, for example, be desirable to achieve a heat transfer coefficient between the substrate W and the cooling element of between approximately 200 $Wm^{-2}K^{-1}$ to 800 $Wm^{-2}K^{-1}$.

In addition to the cooling gas which is supplied from the cooling apparatus towards the substrate W, in some embodiments other gas may be supplied from a gas supply that is not part of the cooling element. For example, in some embodiments, gas may be provided from a conduit to an opening opposing the substrate W, and such gas may reduce a likelihood of contamination (e.g. gas-phase organic compounds coming from resist on the substrate W) from reaching optical components of the projection system PS. Such gas may be referred to as a gas barrier.

Where other gas, such as a gas barrier, is provided in the vicinity of the substrate W, ceasing the supply of cooling gas may not cease the supply of the gas barrier. As such, a conducting gas supply may remain present between the cooling element and the substrate W. Additionally, where the only gas present between the cooling element and the substrate W is supplied from a supply other than the cooling gas supply, the pressure of the remaining gas may be unpredictable. As described above, while the temperature of the cooling element may be adjusted, such adjustments may be relatively slow, such that quick control of cooling that is applied to the substrate W may utilise changes in the distance between the cooling element and the substrate W, and changes in the pressure of the cooling gas supplied to the substrate W. It will be appreciated, therefore, that where other gas is present between the substrate W and the cooling element, cooling of the substrate W may still occur even after ceasing of supply of the cooling gas.

Such undesirable cooling may be problematic. For example, where sensors (such as alignment sensors) are located beneath cooling element, cooling of those sensors may be detrimental to the intended measurements of those sensors. When projecting an image onto a substrate it is desirable to ensure that the substrate held on a substrate table is correctly positioned to receive the projected image. The substrate table may be positioned using a positioning system which has six degrees of freedom (X, Y, Z, $R_X$, $R_Y$, $R_Z$). For any given position of the substrate table an error in each of the six degrees of freedom will be present. A calibration of the positioning system may be performed to measure and record these errors using image alignment sensors. This calibration allows the substrate table to be accurately positioned during subsequent operation of the lithographic apparatus. Where an alignment sensor is located beneath the cooling element, undesirable cooling of those alignment sensors may degrade the alignment measurements that are obtained, and this in turn may lead to alignment errors in subsequent exposures of the substrate W.

In an embodiment, therefore, a lithographic apparatus may include an optical sensor apparatus on the substrate table W. The optical sensor apparatus may comprise an optical sensor and a heater arranged to supply heat to the optical sensor. In an embodiment, the heater may be arranged to supply heat to the optical sensor. The heater may be activated to supply heat to the optical sensor during a time when the cooling body is above the optical sensor. In some embodiments, the optical sensor apparatus may additionally comprise one or more temperature sensors. The temperature sensor may be arranged within the optical sensor apparatus so as to measure a temperature of the optical sensor. For example, one or more temperature sensors may be provided on the substrate table adjacent the optical sensor. Feedback and/or feedforward control loops may be utilised based on the temperature sensor within the optical sensor apparatus to control the heater to maintain the optical sensor within a predetermined desired temperature range. It will be appreciated that measurements from other temperature sensors may also be used in a control loop for controlling the heater of the optical sensor. For example, various temperature sensors are described above with reference to other exemplary embodiments, the outputs of each of which may be used in a heater control loop.

It will further be appreciated that outputs of a temperature sensor of an optical sensor apparatus may also be used in the control loops for adjusting parameters of the cooling element, such as a temperature of the cooling element, a distance of the cooling element from the substrate W, a cooling gas pressure provided by the cooling element, etc.

As discussed above, in order to accurately control the amount of cooling that is provided to the substrate W, it is desirable to be able to determine a temperature of the substrate. For example, it may be desirable to measure the temperature of the substrate W and use the measurement to control cooling of the substrate such that a net heat transfer to and from the substrate is substantially stable (e.g. to within about 1%) when using the cooling apparatus. Some factors may negatively affect the stability of heat transfer to and from the substrate W. For example, different substrates may comprise different materials that are distributed differently within layers of the substrates and across the surface of the substrates. Differences between substrates W may result in the substrates having different thermal characteristics and/or a different thermal accommodation coefficient between the substrate and the cooling apparatus when performing lithographic exposures on the different substrates. Variations of the thermal accommodation coefficient between different substrates may result in a lithographic error such as an overlay error.

The lithographic apparatus may be provided with a remote temperature sensing system. The remote temperature sensing system may be configured to measure the temperature of a surface of interest such as, for example, a surface of the substrate W that is in the vicinity of the area that is being cooled by the cooling apparatus.

Figure 36:
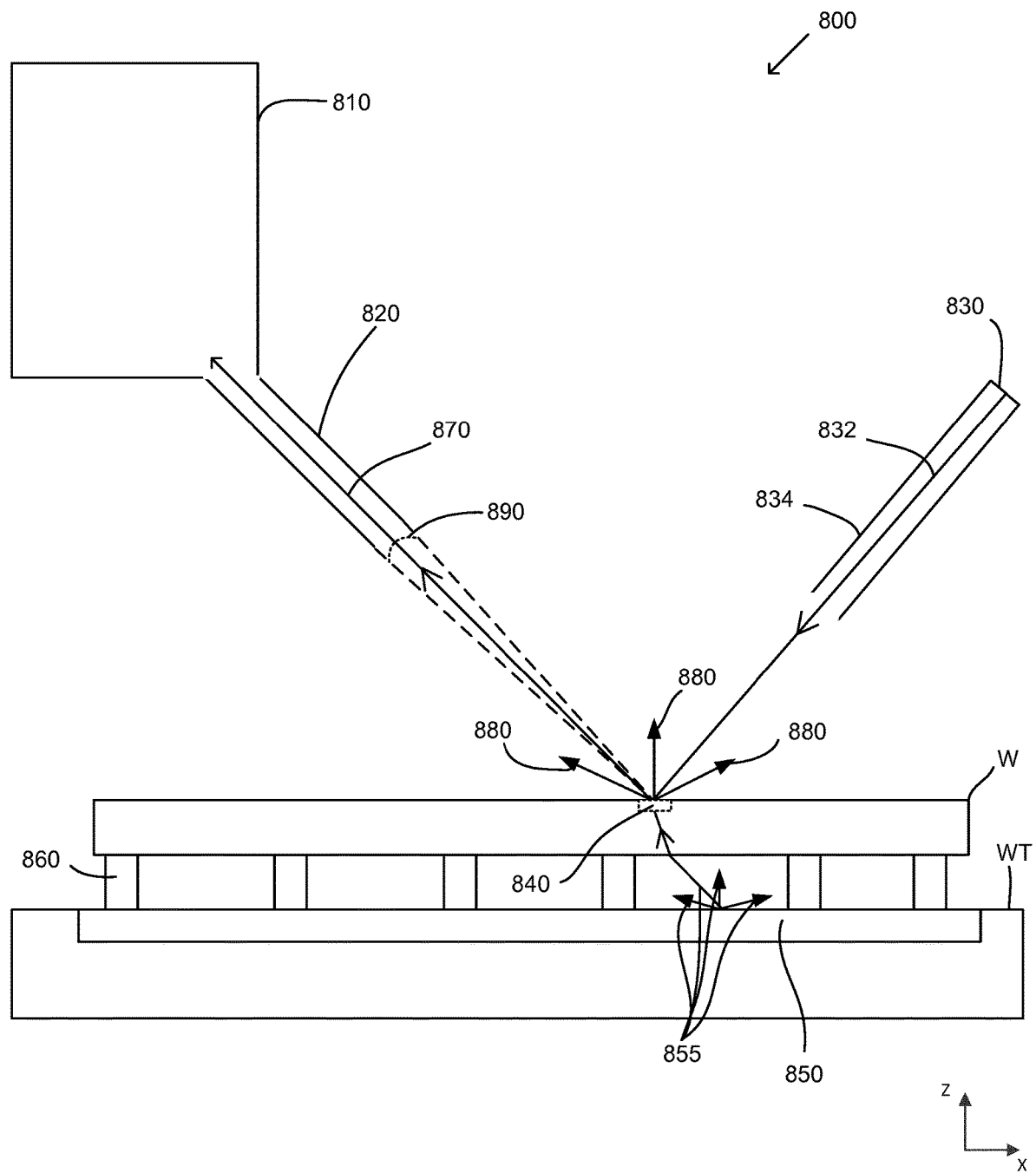
FIG. 36 schematically depicts a remote temperature sensing system according to an embodiment of the invention.

FIG. 36 schematically depicts a remote temperature sensing system 800. The remote temperature sensing system 800 comprises a photodetector 810, shielding 820 and a control surface 830. In the example of FIG. 36, the remote temperature sensing system 800 is configured to measure the temperature of a target area 840 of a substrate W. The substrate W is attached to a substrate table WT via a clamp 850 and is supported by burls 860. The remote temperature sensing system 800 may be used to measure the temperature of other areas of the substrate W or other surfaces of the lithographic apparatus. The photodetector 810 may be configured to measure thermal radiation emitted by the target area 840. Preferably the photodetector 810 comprises an upconversion photodetector. The upconversion photodetector may comprise a plurality of pixels (e.g. in a CCD device) configured to detect incident radiation. The upconversion photodetector may be configured to detect infrared radiation and may be considered to be an example of an infrared camera. Other types of infrared camera may be used, e.g. conventional infrared cameras that may or may not be cryogenically cooled. However, conventional infrared cameras may be less accurate than an upconversion photodetector configured to detect infrared radiation.

An upconversion photodetector 810 comprises a non-linear crystal such as, for example, periodically-poled lithium niobate. The upconversion photodetector 810 may be configured to receive infrared radiation and mix the infrared radiation with pump radiation so as to convert the infrared radiation into radiation having a shorter wavelength (e.g. visible radiation). The quantum efficiency of an upconversion photodetector configured to detect infrared radiation may be greater (e.g. about 20% quantum efficiency) than the quantum efficiencies of other types of infrared camera. The upconversion photodetector may be configured to provide remote temperature sensing of a surface of interest with milli-Kelvin accuracy at a sample-rate of between about 1 Hz and about 10 Hz. The upconversion photodetector may, for example, be configured to detect infrared radiation having a wavelength in the range of about 2 μm to about 5 μm. The upconversion photodetector may advantageously provide accurate temperature measurements (e.g. to within about 1 mK) of a target area 840 on the surface of the substrate W.

In the example of FIG. 36, the shielding 820 comprises an elongate hollow tube through which radiation 870 may enter the photodetector 810. The shielding 820 may take a different form. For example, the shielding 820 may comprise one or more plates with each plate having an aperture through which radiation 870 travelling from a well-defined surface area (e.g. the target area 840 of the substrate W) may enter the photodetector 810. The shielding 820 and the photodetector 810 may be arranged such that substantially all of the radiation 870 entering the photodetector 810 through the shielding 820 has travelled from a target area 840 of the substrate W. Having such an arrangement advantageously provides an accurate measurement of the temperature of the target area 840 by reducing the impact of the surrounding environment on measurements made by the remote temperature sensing system 800.

The target area 840 has an unknown temperature $T_{ta}$ and emits thermal radiation 880. Some of the thermal radiation 880 emitted by the target area 840 is incident on the photodetector 810 through the shielding 820. The temperature of an object may be determined by measuring the thermal radiation being emitted by that object. The power emitted by the target area 840 may be represented via the Stefan-Boltzmann law as:

$$P_{ta} = A_{ta} \sigma \varepsilon_{ta} T_{ta}^4 \quad (1)$$

where $A_{ta}$ is the surface area of the target area, $\sigma$ is the Stefan-Boltzmann constant and $\varepsilon_{ta}$ is the emissivity of the target area 840. The target area 840 may, for example, have an area of about 4 mm². Assuming that the target area 840 has an ambient temperature of $T_{ta}$=295K, an area of $A_{ta}$=4 mm² and an emissivity of $\varepsilon_{ta}$=1 then the target area 840 will emit thermal radiation having a power of about $P_{ta}$≈1.8 mW.

A view angle 890 of the photodetector 810 is the angle through which radiation 870 emitted from the target area 840 may enter the photodetector 810 via the shielding 820. The view angle 890 may for example, be in the range of about 0.1° to about 10°. The selected size of the view angle 890 may depend at least in part upon a selected size of the target area 840 and/or a selected distance between the photodetector 810 and the target area 840. For example, the size of the target area may be selected in light of the size of the target portions on the substrate, the distance between the target area and the photodetector may be selected in light of space restrictions within the lithographic apparatus and the size of the view angle may be determined in light of the size of the target area and the distance between the target area and the photodetector. Other considerations may determine the size of the view angle. For example, decreasing the size of the view angle may reduce the signal output from the photodetector 810. As another example, increasing the size of the view angle 890 may result in the photodetector 810 and/or the shielding 820 taking up a large amount of space in the lithographic apparatus.

It may be desirable to locate the photodetector 810 a distance away from the target area 840 such that the photodetector 810 does not interfere with other components of the lithographic apparatus (not shown). For example, the photodetector 810 may be provided in and/or on the projection system of the lithographic apparatus. If located in and/or on the projection system then the photodetector 810 may, for example, be between about 0.5 cm and about 10 cm from the target area 840 of the substrate W. The photodetector 810 may be located in any desired region of the lithographic apparatus. For example, the photodetector 810 may be located on the cooling apparatus. If located on the cooling apparatus then the photodetector 810 may, for example, be a distance of between about m and about 6 mm from the target area 840 of the substrate W.

Radiation being emitted by the target area 840 that travels away from the substrate W may be thought of as being emitted from the target area 840 across an angle of 180° about the z-axis along the x-direction and across an angle of 180° about the z-axis along the y-direction. The smaller the view angle 890 the less radiation being emitted by the target area 840 will enter the photodetector 810. The amount of radiative power incident on the photodetector 810 may scale with the size of the view angle 890 according to the following equation:

$$F = \left(\frac{\theta}{180}\right)^2 \quad (2)$$

where θ is the view angle 890 expressed in degrees. Assuming that the view angle is 0.5°, radiation 870 travelling from the target area 840 to the photodetector 810 may reduce by a factor of about $$\left(\frac{0.5}{180}\right)^2.$$

Radiation may enter the photodetector 810 after being emitted by an object and subsequently being reflected from the target area 840 toward the photodetector. Radiation reflecting from the target area 840 to the photodetector 810 may negatively affect an accuracy of the remote temperature sensing system 800. It is advantageous to have knowledge of and/or control emission of radiation that reflects from the target area 840 into the photodetector 810 such that the negative affect on the accuracy of the photodetector is reduced. This may be achieved by arranging the photodetector 810 and the target area 840 such that radiation that reflects from the target area into the photodetector is emitted by a control surface that has known emission characteristics (e.g. a known temperature).

Referring to FIG. 36, a control surface 830 having a known temperature emits thermal radiation 832. The temperature of the control surface 830 may be assumed to be substantially the same as a known ambient temperature of the lithographic apparatus (e.g. about 22° C.). Alternatively, the control surface 830 may be provided with a temperature sensor such as, for example, a resistance thermometer (not shown). The control surface 830 may comprise its own shielding 834. The shielding 834 of the control surface 830 may be configured such that the control surface 830 is at least partly protected from heating via absorption of radiation. Some of the thermal radiation 832 emitted by the control surface 830 is incident on the target area 840 of the substrate W. Some of the thermal radiation 832 emitted by the control surface 830 that is incident on the target area 840 may then reflect from the target area 840 towards the photodetector 810. The amount of thermal radiation 832 emitted by the control surface 830 which is then reflected to the photodetector 810 by the target area 840 may be determined at least in part by a reflection coefficient of the target area 840.

It may be advantageous to reduce the amount of thermal radiation 832 emitted by the control surface 830 that contributes to an output signal of the photodetector 810 such that a majority of the output signal of the photodetector 810 is generated by radiation emitted by the target area 840 of the substrate W. It may be preferable to form the control surface 830 from a material having a low emissivity (e.g. less than about 0.2) such that the amount of thermal radiation 832 emitted by the control surface 830 is reduced. It may be preferable to provide the control surface 830 with cooling (e.g. via a conduit that contains a flow of cooling fluid such as water) such that the amount of thermal radiation 832 emitted by the control surface 830 is reduced.

Some of the radiation 870 that is incident on the photodetector 810 may be emitted by an object beneath the substrate W, e.g. the clamp 850, and transmitted through the substrate W towards the photodetector 810. For example, FIG. 36 shows some thermal radiation 855 being emitted by the clamp 850 and travelling through the substrate W towards the photodetector 810. Objects beneath the substrate W, such as the clamp 850, may emit different wavelengths of radiation by different amounts. It may be advantageous to provide a photodetector 810 that is configured to detect radiation having a range of wavelengths that are emitted in relatively small amounts by objects beneath the substrate, such that the effect of radiation 855 emitted by those objects on an output of the photodetector 810 is reduced. For example, the reflectivity of the clamp 850 may be high (e.g. about 80%) for wavelengths of radiation in the range of about 2 µm to about 5 µm. The emissivity of the clamp 850 may be correspondingly low (e.g. less than about 20%) for wavelengths of radiation in the range of about 2 µm to about 5 µm. In this case, it may be desirable to provide a photodetector 810 that is configured to detect wavelengths of radiation in the range of about 2 µm to about 5 µm such that the effect of radiation emitted by the clamp 850 on an output of the photodetector 810 is reduced. The photodetector 810 may be configured to detect a different range of wavelengths of radiation 870. Objects beneath the substrate W, such as the clamp 850, may be provided with cooling (e.g. via conduits that contain a flow of cooling fluid such as water) such that the amount of thermal radiation emitted by those objects is reduced.

The following is an example scenario that demonstrates how the remote temperature sensing system 800 may be used to detect milli-Kelvin temperature changes of the target area 840. As discussed above in relation to Equation 1, a target area 840 having a temperature of $T_{ta}$=295K, an area of $A_{ta}$=4 mm² and an emissivity of $\varepsilon_{ta}$=1 will emit a power of about $P_{ta}$ 0.0018 W. As discussed above in relation to Equation 2, when the photodetector 810 has a view angle 890 of 0.5° the power emitted by the target area 840 is reduced by a factor of $$\left(\frac{0.5}{180}\right)^2,$$

which leaves a power of $$\left(\frac{0.5}{180}\right)^2 \times 1.8 \approx 1.4 \times 10^{-8} W$$

that reaches the photodetector 810. A photon having a wavelength of 5 µm has an energy that may be calculated by using the following equation:

$$E = h\frac{c}{\lambda} = 6.626 \times 10^{-34}\left(\frac{3 \times 10^8}{5 \times 10^{-6}}\right) \approx 3.98 \times 10^{-20} J \quad (3)$$

where h is Planck's constant, c is the speed of light in vacuum and λ is the wavelength of the photon. Assuming (for simplicity) that all of the photons reaching the photodetector 810 are photons having a wavelength of 5 µm, then the number of photons emitted by the target area 840 that reach the photodetector 810 per second is given by $$N = \frac{1.4 \times 10^{-8}}{3.98 \times 10^{-20}} \approx 3 \times 10^{11}$$

photons per second. A similar calculation may be performed to show that if the temperature of the target area 840 were to change by about 1.5 mK, then the number of photons per second reaching the photodetector 810 changes by about $10^7$ photons per second. In other words, in order for the remote temperature sensing system 800 to have 1.5 mK measurement accuracy, the photodetector 810 must be able to efficiently detect at least part of the change of $10^7$ photons per second.

Assuming that the photodetector 810 is an upconversion photodetector, then the photodetector 810 is able to efficiently detect radiation across a frequency bandwidth that corresponds with the thickness of the non-linear crystal present in the upconversion photodetector via the relationship:

$$B \propto \frac{1}{d} \qquad (4)$$

where d is the thickness of the non-linear crystal in the upconversion photodetector. Assuming that the non-linear crystal has a thickness of about 1 mm, the frequency bandwidth of detectable radiation is about 0.3 THz. Thus, if the upconversion photodetector 810 is configured to detect radiation having a wavelength of 5 µm, then the range of wavelengths that the upconversion photodetector 810 could measure efficiently is between about 4.75 µm and about 5 µm. This wavelength range accounts for about 0.1% of the spectrum of radiation emitted by the target area 840 at 22° C. Thus, the number of photons reaching the upconversion photodetector 810 per second that are efficiently detectable by the upconversion photodetector is about $0.001 \times 10^7 = 10^4$ photons.

Throughout this example scenario, the emissivity of the target area 840 has been assumed to be equal to one. In reality, the emissivity of the target area 840 will be less than one. This means that the number of photons that are emitted by the target area 840 that are within the view angle 890 of the upconversion photodetector 810 and that are also efficiently detectable by the upconversion photodetector 810 will be reduced, e.g. by a factor of about ten. This leaves a detectable change of about $10^3$ photons per second to indicate that the temperature of the target area 840 has changed by 1.5 mK. Given that known upconversion photodetectors 810 have a dark noise of about 0.2 photons per pixel per second when operating at 30° C., the detectable change of about $10^3$ photons per second provides an adequate signal for the remote temperature sensing system 800 to detect a temperature change of about 1.5 mK. Temperature measurements of the target area 840 may be used as part of a control loop (e.g. a feedforward control loop or a feedback control loop) to control the amount of cooling that is provided to the substrate W by the cooling apparatus.

Figure 37:
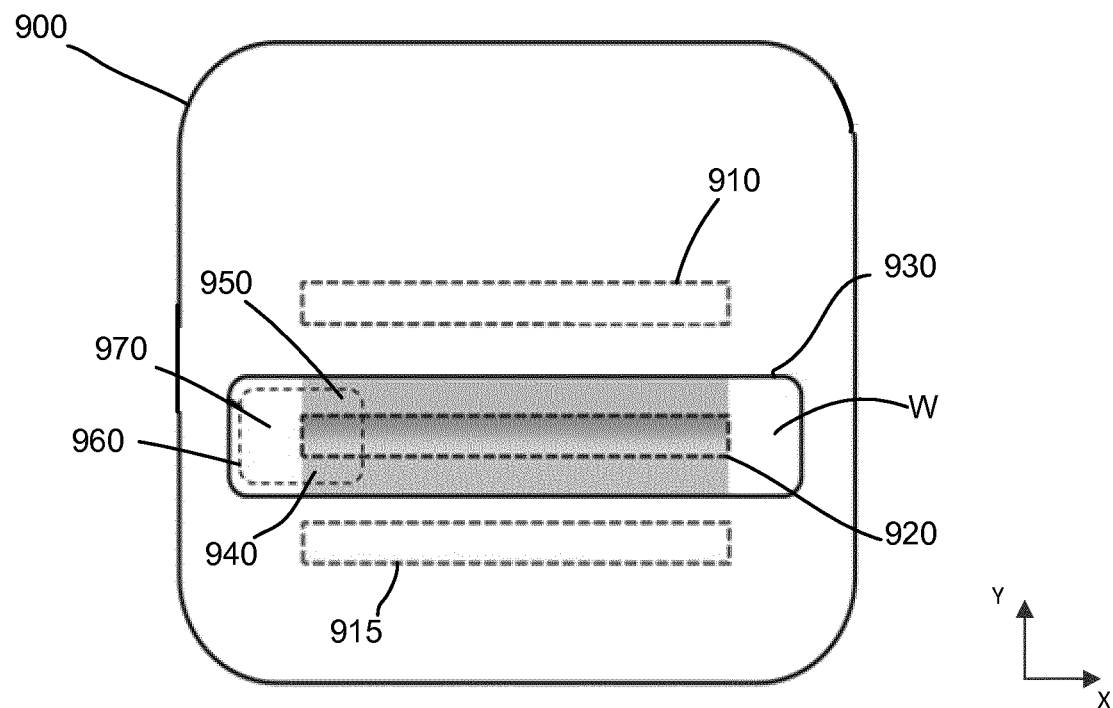
FIG. 37 schematically depicts a cooling apparatus and a substrate as viewed from above, a target area of the substrate being measured by a remote temperature sensing system according to an alternative embodiment of the invention.

FIG. 37 schematically depicts a cooling apparatus 900 in combination with a target area 960 of a remote temperature sensing system as viewed from above. Cooling regions 910, 915 provide the substrate W with cooling (e.g. via cooling elements of the cooling apparatus 900). Areas of the substrate W that lie within the cooling regions 910, 915 are cooled by the cooling apparatus 900. An exposure region 920 of the lithographic apparatus provides radiation that has passed through a cooling apparatus slit 930 of the cooling apparatus 900 to the substrate W. An area of the substrate W that lies within the exposure region 920 gains heat from the radiation. The substrate W may be scanned in a scanning direction during a lithographic exposure. In the example of FIG. 37, the substrate W is scanned is the positive y-direction. Thus, a heated area 940 of the substrate W that has recently passed underneath the exposure region 920 is at a higher temperature than a cooled area 950 of the substrate W that has not yet passed underneath the exposure region 920 but has recently passed underneath a cooling region 910. An ambient area 970 of the substrate W that has either already been scanned underneath the cooling apparatus 900 or is yet to be scanned under the cooling apparatus 900 may have a temperature that is about the same as an ambient temperature of the lithographic apparatus (e.g. about 22° C.). The temperature of the ambient area 970 may already be known or may be approximated via modelling.

In the example of FIG. 37 a target area 960 of the remote temperature sensing system is located on the substrate W within an area bound by the cooling apparatus slit 930 of the cooling apparatus 900. The remote temperature sensing system may be configured such that radiation being emitted, reflected or transmitted by the target area 960 passes through the cooling apparatus slit 930 towards a photodetector (not shown) of the remote temperature sensing system. The target area 960 may be smaller than a target portion (not shown) of the substrate W. The target area 960 may have a length in the y-direction that is less than a length of the cooling apparatus slit 930 in the y-direction.

The substrate W may scan at a high enough speed such that heat exchange between the cooled area 950, the heated area 940 and/or the ambient area 970 is insignificant. That is, heat exchange between the heated, cooled and ambient areas is small enough for the measured temperature of the heated area to be representative of a heating effect provided by the lithographic exposure, and for the measured temperature of the cooled area to be representative of a cooling effect provided by the cooling apparatus. For example, the scanning speed of the substrate may be greater than or equal to about 50 mm s$^{-1}$ for the heat exchange between heated areas, cooled areas and/or ambient areas to be considered as being insignificant.

Different pixels of the photodetector may receive radiation emitted by different parts of the target area 960. For example, a first group of pixels may receive radiation emitted by a heated area 940 of the substrate W, a second group of pixels may receive radiation emitted by a cooled area 950 of the substrate W and a third group of pixels may receive radiation emitted by the ambient area 970 of the substrate W. Alternatively, multiple photodetectors may be used to detect radiation emitted from the different areas 940, 950, 970 of the substrate W. The outputs of different groups of pixels (or different photodetectors) may be compared with each other in order to determine the relative temperatures of the heated area 940, the cooled area 950 and/or the ambient area 970. For example, an output of the pixels that receive radiation from the cooled area 950 may be compared with an output of the pixels that receive radiation from the ambient area 970 to determine a relative effect of cooling provided by the cooling apparatus 900 to the substrate W. As another example, an output of pixels that receive radiation from the heated area 940 may be compared with an output of pixels that receive radiation from the ambient area 970 to determine a relative effect of heating caused by a lithographic exposure of the substrate W.

Different areas of the substrate W may have different emission properties due to the presence of multiple materials being distributed differently throughout the layers of the substrate. Comparing outputs of the photodetector that have been generated by radiation emitted from areas of the substrate having different emission properties may introduce errors. Although emission properties of the substrate may vary within a single target portion of the substrate, the emission properties of an area within a first target portion are expected to be substantially the same as the emission properties across the corresponding area of a different target portion of the substrate, because different target portions have been exposed to the same pattern and processing. To provide an accurate measurement of the relative temperatures of the cooled areas 950 and the heated areas 940 of the substrate W it is preferable to take measurements from corresponding target areas 960 within different target portions of the substrate W such that there are substantially no differences in emission properties between the target areas.

Figure 38:
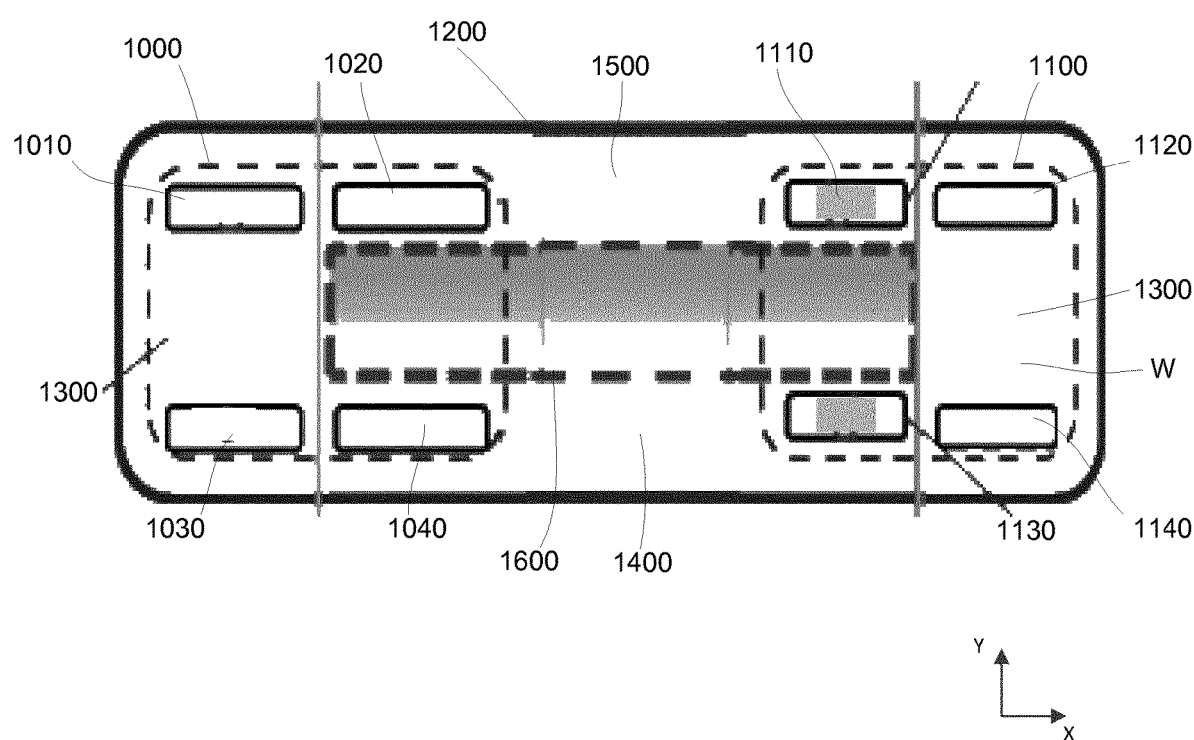
FIG. 38 schematically depicts two target areas of a substrate as viewed through a cooling apparatus slit, the target areas being measured by a remote temperature sensing system according to a further alternative embodiment of the invention.

FIG. 38 schematically depicts target areas 1000, 1100 of a substrate W viewed through a cooling apparatus slit 1200 of a cooling apparatus. A first target area 1000 is located on one side of the cooling apparatus slit 1200 such that half of the first target area 1000 covers an ambient area 1300 of the substrate W and the other half of the first target area 1000 covers a heated area 1400 of the substrate W and a cooled area 1500 of the substrate W. A second target area 1100 is located on the other side of the cooling apparatus slit 1200 such that half of the second target area 1100 covers an ambient area 1300 of the substrate W and the other half of the second target area 1100 covers a heated area 1400 of the substrate W and a cooled area 1500 of the substrate W. First, second, third and fourth measurement areas 1010, 1020, 1030, 1040 are present in the first target area 1000 and fifth, sixth, seventh and eighth measurement areas 1110, 1120, 1130, 1140 are present in the second target area 1100. The target areas 1000, 1100 are arranged with respect to the target portions (not shown) of the substrate W such that the first and fifth measurement areas 1010, 1110 cover corresponding areas across different target portions of the substrate W, the second and sixth measurement areas 1020, 1120 cover corresponding areas across different target portions of the substrate W, the third and seventh measurement areas 1030, 1130 cover corresponding areas across different target portions of the substrate W and the fourth and eighth measurement areas 1040, 1140 cover corresponding areas across different target portions of the substrate W. That is, the first and fifth measurement areas 1010, 1110 have substantially the same emission properties, the second and sixth measurement areas 1020, 1120 have substantially the same emission properties, the third and seventh measurement areas 1030, 1130 have substantially the same emission properties and the fourth and eighth measurement areas 1040, 1140 have substantially the same emission properties.

Preferably, a distance between the fifth measurement area 1110 and the nearest cooling element of the cooling apparatus is substantially the same as a distance between the seventh measurement area 1130 and the exposure area 1600 in order to reduce the negative effects of heat transfer on the accuracy of the remote temperature sensing system.

Radiation reaching the photodetector that has been emitted by objects underneath the substrate W is expected to be substantially equal for all measurement areas and is therefore expected to have an insignificant effect on the accuracy of the remote temperature sensing system.

The difference between the output of photodetector pixels receiving radiation from the first measurement area 1010 and the output of photodetector pixels receiving radiation from the fifth measurement area 1110 provides a relative measurement of the cooling power of a cooling element of the cooling apparatus. The difference between the output of the pixels receiving radiation from the third measurement area 1030 and the output of the pixels receiving radiation from the seventh measurement area 1130 provides a relative measurement of the heating power delivered via the exposure area 1600 of the lithographic apparatus.

The results of the comparisons of different measurement areas may be used to control cooling provided by the cooling apparatus. For example, it may be desirable to operate the cooling apparatus such that the cooling apparatus removes substantially the same amount of heat from the substrate W that was provided to the substrate by the exposure area 1600 (i.e. that the net heat gained by the substrate is substantially zero). In this case, the cooling apparatus may be controlled such that when the difference between the output of the pixels receiving radiation from the first measurement area 1010 and the output of the pixels receiving radiation from the fifth measurement area 1110 is added to the difference between the output of the pixels receiving radiation from the third measurement area 1030 and the output of the pixels receiving radiation from the seventh measurement area 1130, the result is substantially zero. The relative temperatures of the whole or parts of different target areas of the substrate may be determined during a lithographic exposure.

The output of the photodetector indicates the number of photons that are being absorbed by the photodetector, which is not a direct measurement of the temperature of the substrate. However, as discussed above, outputs of the photodetector may be compared to provide relative temperature measurements of the substrate. Alternatively, or in addition to relative temperature measurements, it may be desirable to measure an absolute temperature of the whole or part of a target area of the substrate W. This may be achieved by determining emission properties of the substrate W which may be used to convert the output of the remote temperature sensing system to an absolute temperature measurement of the whole or part of a target area of the substrate. For example, during a calibration phase the substrate W may be analysed using Fourier Transform Infrared Spectroscopy (also known as FTIR) such that emission properties of the substrate are known. Some known lithographic apparatus comprise one or more FTIR devices which may be used to determine emission properties of the substrate W. A calibration measurement of the substrate W may be performed using the remote temperature sensing system before the substrate is exposed to radiation. The cooling apparatus may provide cooling to the substrate W (when no exposure of the substrate is taking place) and the substrate may be scanned underneath the cooling apparatus. The remote temperature sensing system may be used to measure how much infrared radiation is being emitted by a cooled area 1500 of the substrate W, e.g. by having some or all of the pixels of the photodetector receive radiation from a cooled area of the substrate. A cooling power of the cooling apparatus (i.e. the temperature change of the substrate W caused by the cooling apparatus) may be determined by comparing results of the FTIR measurement with results of the remote temperature sensing system measurement. The determined cooling power of the cooling apparatus may be used to control the cooling apparatus during a lithographic exposure of the substrate. It may be desirable to repeat the calibration measurement for different lots of substrates. The calibration measurement may be performed at any desired frequency, e.g. once per substrate.

Other methods of using the remote temperature sensing system to control cooling provided by the cooling apparatus include measuring the relative and/or absolute temperature of a target area of the substrate before the substrate undergoes a lithographic exposure and measuring the relative and/or absolute temperature of the same target area of the substrate after the substrate has undergone a lithographic exposure. The results of each measurement may be compared with each other and the cooling provided by the cooling apparatus may be controlled accordingly.

Figure 39:
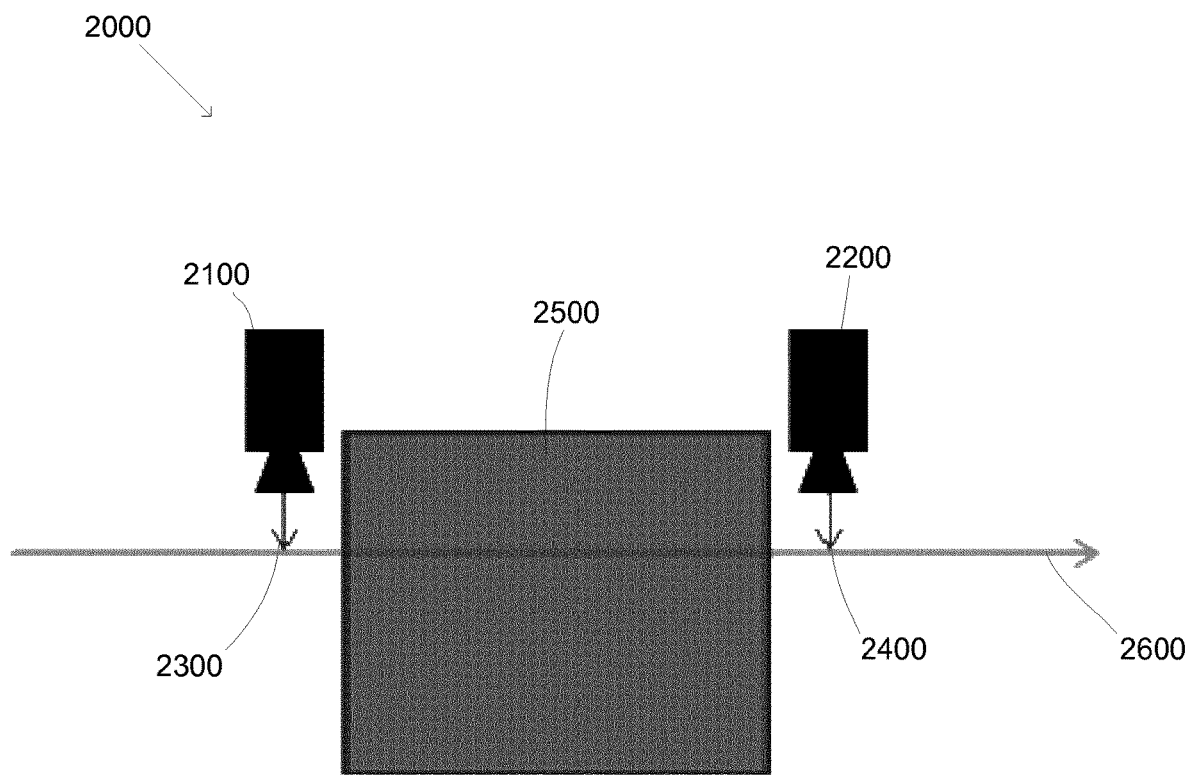
FIG. 39 schematically depicts a method of measuring a temperature of a target area of a substrate using a remote temperature sensing system according to an embodiment of the invention.

FIG. 39 schematically depicts a method 2000 in which the temperature of a target area of a substrate is measured using first and second photodetectors 2100, 2200 of a remote temperature sensing system before 2300 and after 2400 a lithographic process 2500 (which includes cooling being provided by the cooling apparatus) has taken place. A single photodetector may be used. The arrow 2600 shown in FIG. 39 represents the passage of time. As mentioned above, it may be desirable to operate the cooling apparatus such that the cooling apparatus removes the same amount of heat from the substrate that was provided to the substrate by radiation in the exposure area (i.e. that the net heat gained and lost by the substrate is substantially zero). In this case, the controlling apparatus may be controlled such that the output signal of the first photodetector 2100 indicates substantially the same measurement of the number of photons per second per pixel as the output of the second photodetector 2200. For example, if the number of photons per second per pixel measured after 2400 the substrate undergoes the lithographic process 2500 is greater than the number of photons per second per pixel measured before 2300 the substrate undergoes the lithographic process 2500 then the cooling apparatus may be controlled such that the cooling provided by the cooling apparatus is increased. Alternatively, if the number of photons per second per pixel measured after 2400 the substrate undergoes the lithographic process 2500 is smaller than the number of photons per second per pixel measured before 2300 the substrate undergoes the lithographic process 2500 then the cooling apparatus may be controlled such that the cooling provided by the cooling apparatus is decreased.

As discussed earlier, the sample-rate of the photodetector may be in the range of about 1 to about 10 Hz, which is fast enough to provide a sufficiently fast feedback loop for correcting for variations between different substrates. Emission properties of a target area of the substrate may be determined (e.g. using FTIR) before or after performing the method shown in FIG. 39 and this information may be used with measurements made by the photodetectors 2100, 2200 to determine an absolute temperature of the target area before and/or after the lithographic process 2500.

In general, outputs of one or more photodetectors of a remote temperature sensing system may be used in the control loops for adjusting parameters of the cooling apparatus. For example, outputs of the photodetector may be used to control a cooling element, such as a temperature of the cooling element, a distance of the cooling element from the substrate W, a cooling gas pressure provided by the cooling element, etc.

Figure 40:
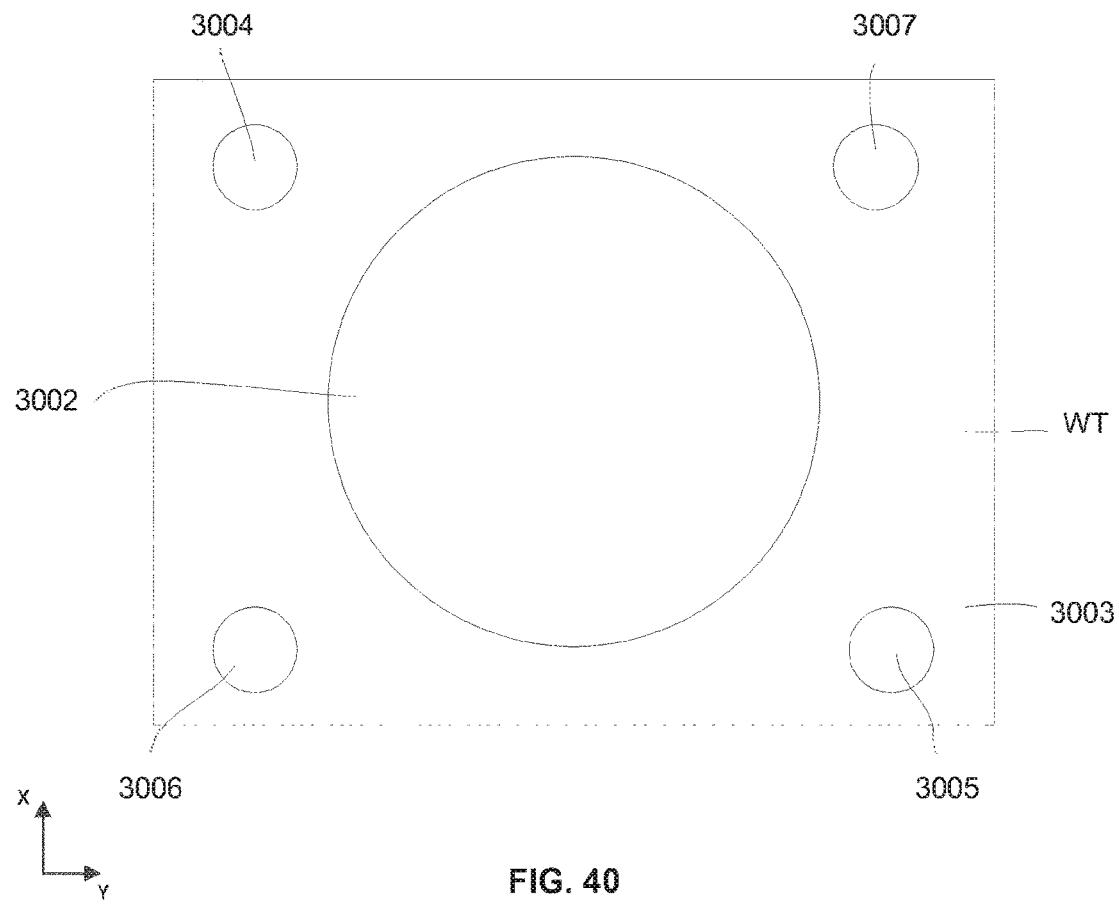
FIG. 40 schematically depicts a substrate table provided with a thermal sensor according to an embodiment of the invention.

FIG. 40 schematically depicts, viewed from above, a substrate table WT including a sensor according to an embodiment of the invention. The substrate table WT comprises a central substrate receiving area 3002, and in addition comprises sensors 3004-7. The sensors 3004-7 are provided in or on a body 3003 of the substrate table WT. In the depicted embodiment, three of the sensors 3004-6 are optical sensors, and may for example comprise imaging sensors and/or a shearing interferometer. The optical sensors 3004-6 are conventional and are not described further here. The other sensor 3007 is a thermal sensor according to an embodiment of the invention.

Figure 41:
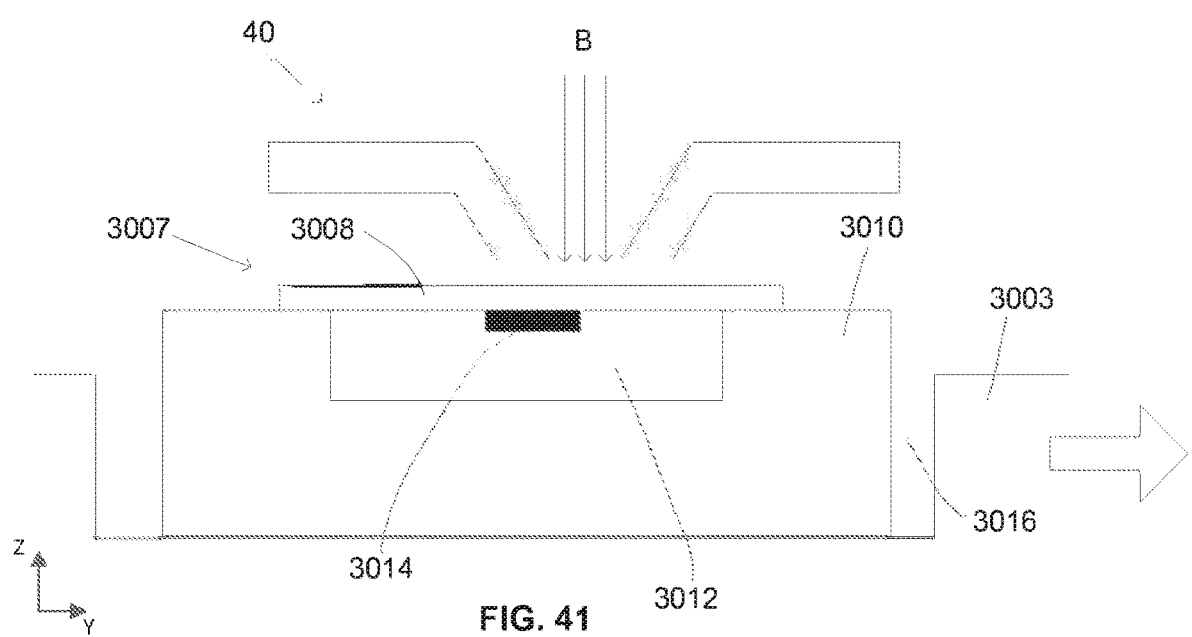
FIG. 41 schematically depicts the thermal sensor in cross-section.

The thermal sensor 3007 is depicted schematically in cross-section in FIG. 41. The thermal sensor 3007 comprises a plate of silicon 3008 which is held by a support 3010. A recess 3012 is provided in the support 3010 such that a central portion of a lowermost surface of the silicon plate 3008 is not in contact with the support. The silicon plate 3008 is instead held around its periphery by the support 3010. A temperature sensor 3014 is fixed to the lowermost surface of the silicon plate 3008. The temperature sensor 3014 is configured to measure the temperature of the silicon plate 3008 and send an output signal indicative of the temperature. The support 3010 is located in a recess 3016 in the body 3003 of the substrate table.

FIG. 41 also schematically depicts a cooling apparatus 40 in cross-section and a radiation beam B of a lithographic apparatus. The cooling apparatus 40 may for example be according to any of the other embodiments described herein. As noted further above, it may be desirable to use the cooling apparatus 40 to cool a substrate during a scanning exposure in order to compensate for heating of the substrate due to the radiation beam B which is incident upon the substrate. It may be desirable for the cooling provided by the cooling apparatus 40 to match the heating provided by the radiation beam B such that there is substantially no localised change of the temperature of the substrate when the scanning exposure takes place. However, it may be difficult to determine how much cooling to provide using the cooling apparatus 40 in order to compensate for the heating provided by the radiation beam B. Although it may be possible to provide temperature sensors in the substrate table and beneath the substrate, these may suffer from the disadvantage that other influences may affect the temperature sensors, such as other heat loads which are being applied to the substrate table.

The embodiment of the invention allows temperature measurements to be made in a manner which avoids (or at least reduces) the influence of unwanted heat loads on those measurements. Referring to FIG. 41, the thermal sensor 3007 moves in a scanning motion beneath the EUV radiation beam under the cooling apparatus 40.

Before the thermal sensor 3007 passes beneath the cooling apparatus 40 and radiation beam B, the thermal sensor will have a temperature which corresponds with the ambient temperature of the substrate table (e.g. around 20 or 21 degrees). When they pass beneath the cooling apparatus 40 and the radiation beam B, the temperature of the silicon plate 3008 as measured by the temperature sensor 3014 may change. If the cooling provided by the cooling apparatus 40 is equal to the heating provided by the radiation beam B then the temperature output for either temperature sensor 3014 will not change (or will vary in a manner which indicates that a net heat load applied to the silicon plate 3008 is substantially zero). If this is not the case, for example if the temperature sensor 3014 gets hotter, then the amount of cooling provided by the cooling apparatus 40 may be adjusted accordingly. In this example, more cooling would be applied because net heating of the temperature sensor 3014 has been observed. Once the cooling provided by the cooling apparatus 40 has been adjusted, then the thermal sensor 3007 may be used to perform a further measurement in order to ensure that the adjustment removes the net heating (or reduces net heating or net cooling to an acceptable level).

The silicon plate 3008 may be thin, e.g. 300 microns or less. Using a thin silicon plate is advantageous because this provides a low thermal capacity of the silicon plate, such that the measurements performed by the thermal sensor have a high sensitivity. The silicon plate 3008 may for example have a thickness which corresponds with the thickness of a silicon wafer (e.g. between 200 and 300 microns).

Although the depicted embodiment has only one temperature sensor 3014, more than one temperature sensor may be provided. For example, an array of temperature sensors may be provided. A line of temperature sensors may be configured to extend across the silicon plate 3008 in a direction generally transverse to the scanning direction.

Although the embodiment has been described above as comprising a silicon plate 3008, the plate may be formed from some other material, e.g. some other semiconductor.

In an embodiment, the substrate table may in addition be provided with a sensor (e.g. an interferometer) which is configured to measure a gap between a lowermost surface of the cooling apparatus 40 and the substrate table.

Figure 42:
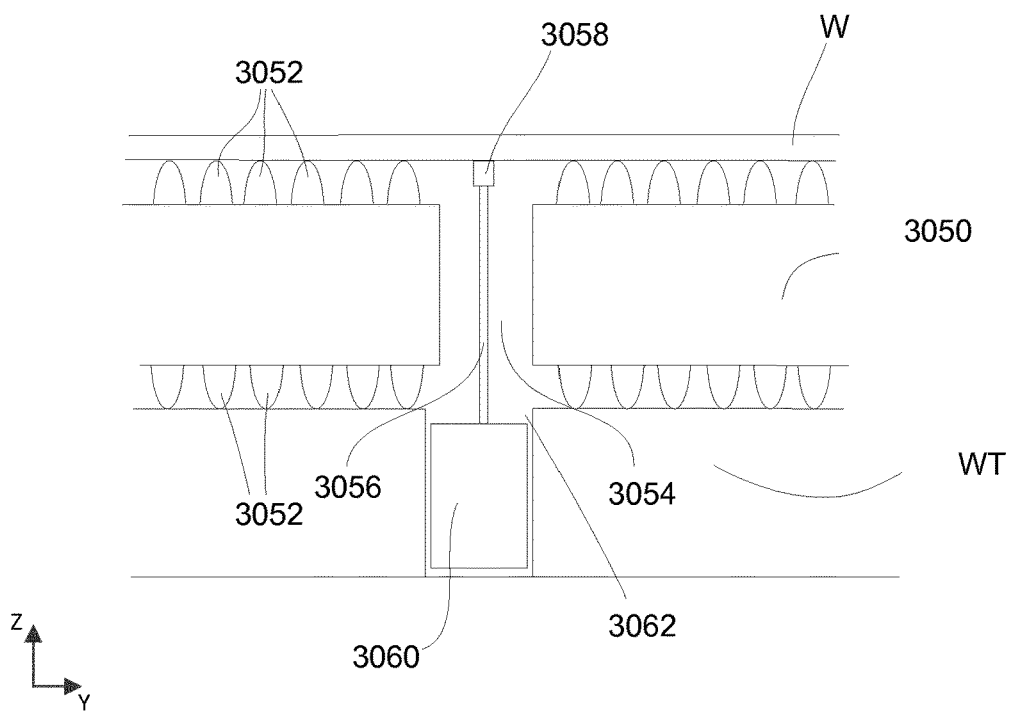
FIG. 42 schematically depicts a substrate table provided with a temperature sensor according to an embodiment of the invention.

FIG. 42 schematically depicts in cross-section a further embodiment of the invention. A substrate table WT is provided with a clamp 3050 which is configured to clamp a substrate W to the substrate table WT. Upper and lower surfaces of the clamp 3050 are provided with burls 3052. A hole 3054 passes through the clamp 3050, and an arm 3056 extends through the hole. A temperature sensor 3058 is provided on a distal end of the arm. An actuator 3060 is configured to lengthen and shorten the arm 3056 (move the arm upwards and downwards). This brings the temperature sensor 3058 into contact with the substrate W and moves the temperature sensor away from contact with the substrate. The actuator 3060 is located in a recess 3062 provided in the substrate table WT.

In use, when it is desired to know the temperature of the substrate W, the arm 3056 is moved upwards until the temperature sensor 3058 is in contact with the substrate W. The temperature sensor 3058 then provides an output signal which indicates the temperature of the substrate W. Once the temperature of the substrate W has been measured. The arm 3056 is moved downwards to move the temperature sensor 3058 away from the substrate. This ensures that the temperature sensor 3058 does not cause any wafer deformation for example during exposure of the substrate W by the lithographic apparatus. Thus, the temperature sensor 3058 does not have any negative impact upon the quality of imaging which may be achieved using lithographic apparatus.

The temperature sensor 3058 is separated from the rest of the substrate table WT by the arm 3056. The arm 3056 may for example be formed from thermally insulting material such as a suitable ceramic (e.g. Zirconia). The temperature sensor 3058 may therefore be substantially isolated from external heat loads. Because the temperature sensor 3058 is located on an arm which provides some thermal isolation from other sources, the thermal capacity of the temperature sensor 3058 is relatively low (compared with if the temperature sensor was for example embedded in the substrate table WT). Consequently, measurements performed by the temperature sensor have a high sensitivity.

The temperature sensor 3058 may be used whenever it is desired to determine the temperature of the substrate W (e.g. during periods when the substrate is not being exposed by the lithographic apparatus). In one example the temperature sensor 3058 may be used to measure the temperature of the substrate W when the substrate is loaded onto the substrate table WT.

As noted above, because the temperature sensor 3058 is not in contact with the substrate W when lithographic exposure is taking place, it causes no distortion of the substrate. A further advantage is that the temperature sensor 3058 provides a simple and direct measurement of the temperature of the substrate W (instead of for example an indirect temperature measurement).

The temperature sensor 3058 will provide an output indicating the temperature of the substrate table WT when no substrate W is loaded onto the substrate table. When a substrate W is loaded onto the substrate table WT, then the temperature sensor will provide an output which indicates the temperature of the substrate. If the output of the temperature sensor does not change then the substrate W and the substrate table WT are at the same temperature. If the output changes then the output can be used to determine a temperature difference between the substrate W and the substrate table WT. This may be referred to as a thermal offset.

Figure 43:
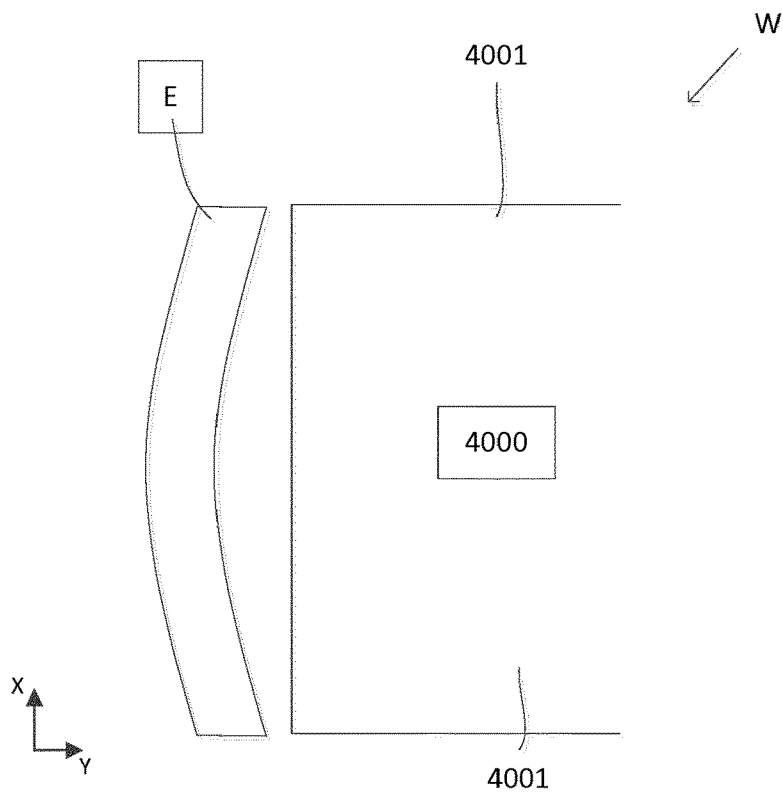
FIG. 43 schematically depicts an exposure area which may form part of an embodiment of the invention, together with a target area of a substrate.

In described and depicted embodiments of the invention, the exposure area E has generally been depicted and described as being rectangular. However, in some embodiments the exposure area E may be curved rather than rectangular. The curved exposure area E may be caused by a configuration of the mirrors of the illumination system IS of the lithographic apparatus LA. An example of a curved exposure area E is schematically depicted in FIG. 43 along with a target area 4000.

Due to the curvature of the exposure area E, during exposure of a target area 4000 on a substrate W cooling of the target area will not take place uniformly across the target area in the X-direction (i.e. in a direction transverse to the scanning direction). For example, during a relative scanning movement in the positive Y-direction, the radiation beam which illuminates the exposure area will be incident at outer edges 4001 of the exposure area 4000 before it is incident at a central portion of the exposure area. During a scanning exposure in the negative Y-direction, the opposite is true with the radiation beam being incident at a central portion of the target area 4000 before it is incident at outer edges 4001 of the target area. Because the radiation beam is delivered at the exposure area E in a curved form, heating of the target area 4000 causes third order deformation of the target area to occur. During scanning exposures in which the target area 4000 is first heated at a central portion, it may be possible to correct for the resulting deformation in a straightforward manner using the projection system or other adjustable parts of the lithographic apparatus. However, when the scanning direction is such that the outer edges 4001 of the exposure area 4000 are heated first it may be more difficult to compensate for the resulting deformation. Embodiments of the invention address this issue.

Desirably the cooling power is uniform over the entire width of the target area. However, the gas pressure towards the left and right side of the lowermost cooling surface may drop towards the pressure of the compartment surrounding the substrate (wafer compartment). This will certainly be the case if all the mass flows through each of the holes in the cooling element floor are equal (i.e. if using equal holes diameters). A calculation done for half of a cooling element surface (neglecting the curvature of the cooling surface) with equal flow through all the holes showed a significant drop in the average heat transfer towards the edge of the substrate. This variation can be reduced to a minimum by tuning the holes diameter towards the edge. For example, to ensure a uniform cooling power one may choose to have a row of holes arranged such that the first hole at the edge of the floor has a mass flow M×3 (i.e. the diameter of the edge hole is chosen such that the mass flow through this hole is three times an average mass flow M), the second edge hole a mass flow M×0.85, a third hole a mass flow M×0.9 and the rest of the middle holes have a mass flow M×0.95. Other variations may also be possible, depending on the desired distribution.

In an embodiment the cooling surface is a thin surface of for example 2.5×27 mm² positioned on one (or both) side(s) of the expose slit, to get the cooling as close to the exposure slit as possible, thereby providing a better overlay performance. However, to establish the required pressure level between the lowermost cooling surface and the substrate (wafer) while injecting a limited amount of gas into the cooling element, and still secure a proper function of contamination suppression in the scanner, limit the EUV absorption and the wave front errors in the same time may be a challenge. It is proposed herein to obtain a maximum pressure and cooling flux by providing a row of holes along the center line (the longer symmetry axis) of the floor which is parallel with the slit (see for a similar example in FIG. 18 depicting two rows of dots (the holes) in floors 708; however in FIG. 18 the dots are not positioned on the centreline, but parallel with it). The center line may be curved or linear, depending on the shape of the floor.

Figure 44:
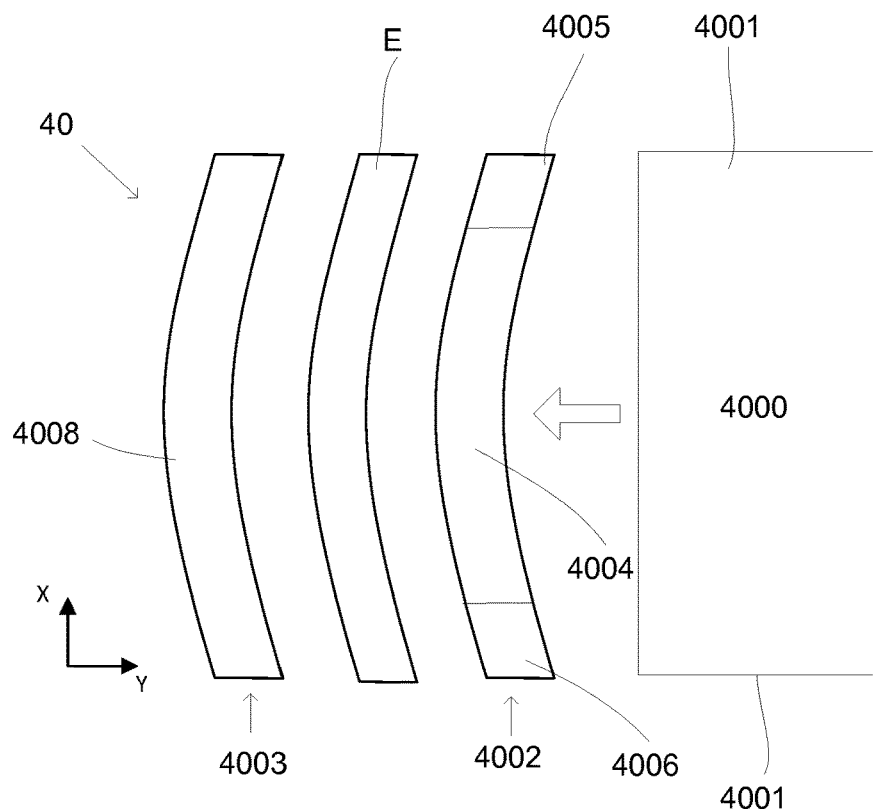
FIG. 44 schematically depicts a cooling apparatus according to an embodiment of the invention.
Figure 45:
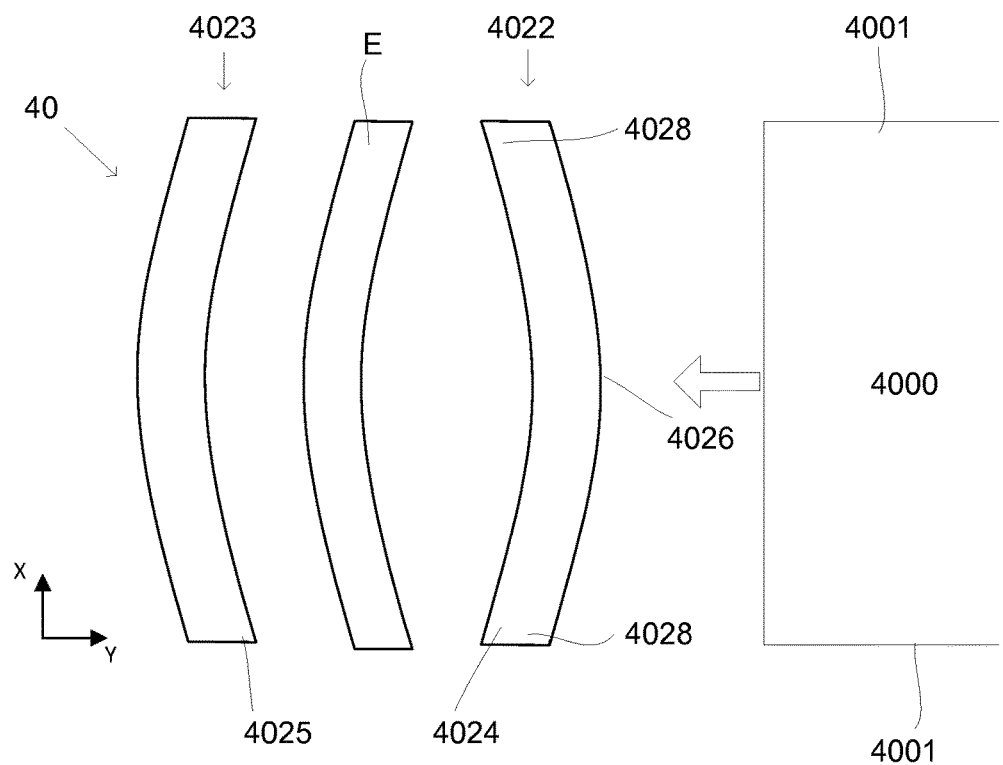
FIG. 45 schematically depicts a cooling apparatus according to an alternative embodiment of the invention.
Figure 46:
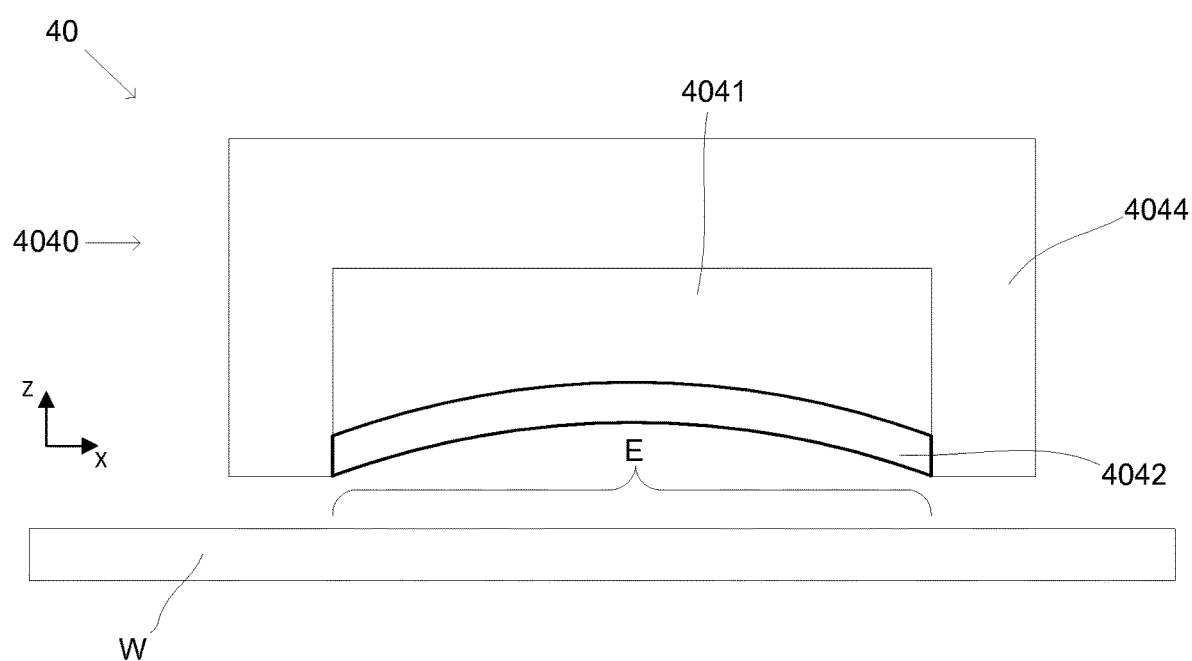
FIG. 46 schematically depicts a cooling apparatus according to a further alternative embodiment of the invention.

FIGS. 44 to 46 schematically depict embodiments of the invention which addresses the above described issue of uniform cooling power distribution. The embodiments may include some features which are common with previously described embodiments. For example, the embodiment of FIG. 44 may include some features from the embodiment of FIG. 14. For brevity, features depicted and/or described in connection with other embodiments are omitted from the following.

FIG. 44 depicts in cross-section viewed from above a cooling apparatus 40 which comprises two cooling elements 4002, 4003. An exposure area E is also depicted. The exposure area E and the cooling elements 4002, 4003 are curved. The first cooling element 4002 is separated into three chambers, an inner chamber 4004 and outer chambers 4005, 4006. The outer chambers 4005, 4006 are located either side of the inner chamber 4004. Following the conventional Cartesian co-ordinate system used for lithographic apparatus, the outer chambers 4005, 4006 are located either side of the inner chamber 4004 in the X-direction (i.e. either side in the non-scanning direction). The second cooling element 4003 is provided with a single chamber 4008, and does not comprise an inner chamber and outer chambers. A floor provided with openings (not depicted) may be located beneath the chambers 4004-6, 4008, and cooling gas may flow out of the openings onto a substrate to cool the substrate.

The cooling elements 4002, 4003 may have a curved shape with a curve which generally corresponds with the curve of the exposure area E. The width of the cooling elements 4002, 4003 may be different from the width of the exposure area E (the exposure area may be narrower than the cooling elements).

The first cooling element 4002 may be considered to have a concave leading edge. The leading edge is an edge of the first cooling element 4002 which first encounters a target area 4000 when the scanning direction is such that the first cooling element leads the second cooling element 4003 (i.e. the first cooling element encounters the target area before the second cooling element).

The second cooling element 4003 may be considered to have a convex leading edge. The leading edge is an edge of the second cooling element 4003 which first encounters a target area 4000 when the scanning direction is such that the second cooling element leads the first cooling element 4003 (i.e. the second cooling element encounters the target area before the first cooling element).

In use, during a scanning exposure with movement of a substrate in the negative Y-direction, outer edges 4001 of a target area 4000 are heated by the radiation beam before a middle portion of the target area. As noted above, this may cause deformation of the target area which is difficult to correct for using the projection system PS of the lithographic apparatus LA. This is addressed by providing cooling gas at the outer chambers 4005, 4006 before cooling gas is provided at the inner chamber 4004. This may be achieved for example by opening valves connected to the outer chambers 4005, 4006 before opening a valve connected to the inner chamber 4004. Additionally or alternatively, stronger cooling may be provided from outer chambers 4005, 4006 than is provided from the inner chamber 4004. The stronger cooling may for example be achieved by providing cooling gas at a higher pressure or lower temperature in the outer chambers 4005, 4006 than in the inner chamber 4004.

Embodiments of the invention may provide focused or dedicated cooling at outer edges 4001 of the target area 4000. As a result, outer edges 4001 of the target area 4000 may be cooler than the central portion of the target area when exposure of the target area begins. Consequently, initial heating of the outer edges 4001 of the target area 4000 during lithographic exposure causes reduced third order deformation of the target area.

The second cooling element 4003 in this embodiment consists of a single chamber 4008 rather than three chambers. This is because when the scanning direction is reversed and the second cooling element 4003 precedes the exposure area E at a target area 4000, the above mentioned third-order deformation problem does not arise. As noted above, third order deformation arises when outer edges 4001 of the exposure area 4000 are heated before a central portion of the exposure area, but this doesn't occur during a scanning exposure in the positive Y-direction. Since the third order deformation issue does not arise when the second cooling element 4008 precedes the exposure area E, no significant benefit would arise from separating the single chamber 4008 into three chambers.

Thus, the embodiment of the invention reduces third order deformation of the target area 4000 using cooling elements 4002, 4003 which are relatively simple (three chambers 4004-6 on one side when this provides a benefit, but only one chamber on the other side when having three chambers doesn't provide a benefit). The possibility of separating the second cooling element 4003 into three chambers is not excluded herein but may not provide a significant benefit for the reason explained above.

Due to the curved shape of the exposure slit, the centre or the left/right side are exposed earlier, depending on the scan direction. To minimize the overlay error, it may be preferred to cool differently over the width of the target area. A curved shaped cooling gas flux, arranged over the width of the cooling surface such as to obtain a cooling flux distribution, may be realised by choosing an appropriate distribution of the holes in the floor of the cooling element. However, having a cooling flux distribution over the width works the best in a rarefied (low pressure) gas regime and not in a continuum (high pressure) gas regime. In such embodiment a gas (e.g. H2) may be chosen to work in a rarefied regime and another gas (e.g. N2) may be chosen to work close to the continuum regime. If a choked gas flow is chosen, it also makes that the profile scales almost linearly with the gap height.

A further embodiment of the invention is schematically depicted in FIG. 45. Again, a cooling apparatus 40 is schematically depicted in cross-section viewed from above. The cooling apparatus 40 comprises a first cooling element 4022 and a second cooling element 4023. The first cooling element 4022 comprises a single chamber 4024, and the second cooling element 4023 comprises a single chamber 4025. The exposure area E is also depicted in FIG. 45. A floor provided with openings (not depicted) may be located beneath the chambers 4024, 4025, and cooling gas may flow out of the openings onto a substrate to cool the substrate.

In common with the embodiment depicted in FIG. 44, the exposure area E and the first and second chambers 4024, 4025 are all curved. However, in this embodiment the chamber 4024 of the first cooling element 4022 has a curve which is generally a mirror image (a reflection about the x-axis) of the exposure area E. In other words, the chamber 4024 of the first cooling element 4022 is curved in an opposite direction to the exposure area E. The curve of the chamber 4025 of the second cooling element 4023 generally corresponds with the curve of the exposure area E.

During a scanning exposure in the negative y-direction, as depicted by the arrow in FIG. 45, the first cooling element 4022 precedes the exposure area E over a target area of a substrate. For the reasons explained further above, it may be desirable to provide more cooling of the target area at edges of the target area than at a central portion of the target area. In the embodiment of FIG. 45, this may be achieved by postponing the time at which cooling is provided by the first cooling element 4022. Specifically, cooling may be postponed such that it does not begin when a central point 4026 of a leading edge of the chamber 4024 passes over a start of the target area 4000. Instead, cooling may be postponed, for example until outer ends 4028, of the chamber 4024 arrive at the edge of the target area 4000. When this approach is used, outer edges 4001 of the exposure area 4000 receive full cooling from the first cooling element 4022 whereas a central portion of the target area does not receive full cooling but instead receives less cooling. Consequently, third order deformation caused by edges of the target area 4000 being exposed before the central region of the target area is prevented or reduced.

For the reasons explained further above, the third order deformation issue does not arise when scanning in the opposite direction. For this reason, the chamber 4025 of the second cooling element 4023 is not a mirror image of the exposure area E.

A further embodiment of the invention is schematically depicted in FIG. 46. In FIG. 46, the cooling apparatus 40 is depicted using cross-section along the y-direction. One cooling element 4040 is shown, the cooling element comprising a housing 4044 which defines a chamber 4041, and a floor member 4042 (which may also be referred to as a floor). The floor member 4042 is provided with openings (not depicted) through which cooling gas passes from the chamber 4041 onto a substrate W in use. The floor member 4042 is curved such that outer ends of the floor member (in the x-direction) are closer to the substrate W than a central portion of the floor member. This advantageously provides stronger cooling of the substrate at edges of an exposure area E than at a central portion of the exposure area. This reduces the third order deformation referred to further above. The curvature of the floor member 4042 may for example be parabolic.

Piezo-actuators (not depicted) may be provided at ends of the floor member 4042. The piezo-actuators may be used to modify curvature of the floor member 4042. For example, the piezo-actuators may be used to move the floor member from a curved arrangement (as depicted) to a flat arrangement. For example, the curved arrangement may be used when edges of a target area are illuminated by the exposure area E but a central portion of the target area is not illuminated. The floor member 4042 may then be moved to a flat profile when all of the target area is illuminated by the exposure area E.

In an alternative embodiment (not depicted), instead of providing a curved floor 4042 the floor may be flat, but may be provided with a higher density of openings at outer ends of the floor (in the x-direction) than in a central portion of the floor. The hole density may be configured to provide cooling which is equivalent to the cooling provided by a parabolic curved floor having a constant hole density. The term 'hole density' may be interpreted as meaning the proportion of the floor which is open compared with the proportion which is closed.

The first and second cooling elements either side of the exposure area E may be switched on and off independently. This may apply to any of the embodiments depicted in FIGS. 44-46, or indeed in connection with other embodiments.

Features of the embodiments of FIGS. 44-46 may be combined with each other or with other features. For example, the reversed curvature as depicted in FIG. 45 may be combined with separation of the cooling chamber into an inner chamber and outer chambers as depicted in FIG. 44. In another example, the reversed curvature as depicted in FIG. 45 may be combined with independent switching of the first and second cooling elements. In another example, the curved floor (or modified holes density) may be combined with independent switching of the first and second cooling elements.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO. The radiation source may alternatively or additionally include a free electron laser.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. A lithographic apparatus comprising a projection system configured to project a patterned radiation beam to form an exposure area on a substrate held on a substrate table, the lithographic apparatus further comprising a cooling apparatus for cooling the substrate, wherein the cooling apparatus comprises: a cooling element located above the substrate table and adjacent to the exposure area, the cooling element being configured to remove heat from a substrate held on the substrate table.

2. The lithographic apparatus of clause 1, wherein the cooling element is configured to cool an area which lies within 3 cm or less from a line which bisects the exposure area.

3. The lithographic apparatus of clause 1 or clause 2, wherein the cooling element is configured to cool an area which lies within 2 cm or less from an edge of the exposure area.

4. The lithographic apparatus of any preceding clause, wherein the cooling element is separated from the exposure area in a direction which substantially corresponds with a scanning direction of the lithographic apparatus.

5. The lithographic apparatus of clause 4, wherein the cooling element is one of a pair of cooling elements provided either side of the exposure area.

6. The lithographic apparatus of any preceding clause, wherein the cooling element comprises a body, an open cavity being provided in a lowermost face of the body, and further comprises a gas delivery conduit configured to deliver gas to the cavity.

7. The lithographic apparatus of clause 6, wherein the cavity is configured to form, together with an upper surface of the substrate, a volume which receives gas delivered by the gas delivery conduit.

8. The lithographic apparatus of clause 6 or clause 7, wherein the extent of a cavity of the cooling element in a non-scanning direction of the lithographic apparatus is equal to or greater than the maximum exposure area length of the lithographic apparatus in the non-scanning direction.

9. The lithographic apparatus of any of clauses 6 to 8, wherein the cavity has a roof which is less than 1 mm from the upper surface of the substrate in use.

10. The lithographic apparatus of any of clauses 6 to 9, wherein the roof of the cavity is substantially parallel to a plane of the substrate table.

11. The lithographic apparatus of clause 9 or clause 10, wherein the combination of the pressure of gas delivered to the cavity and the separation between the cavity roof and the substrate surface is such that the accommodation coefficient of the substrate does not have a significant effect upon transfer of heat from the substrate to the cooling element body.

12. The lithographic apparatus of any of clauses 6 to 9, wherein the roof of the cavity is sloping, the roof being tilted about an axis which runs transverse to a scanning direction of the lithographic apparatus.

13. The lithographic apparatus of any of clauses 1 to 5, wherein the cooling element comprises a body containing a chamber connected to a gas delivery conduit, a floor of the chamber being provided with openings.

14. The lithographic apparatus of clause 13, wherein the openings in the floor of the chamber comprises a row of holes or an array of holes.

15. The lithographic apparatus of clause 13, wherein the floor of the chamber is formed from porous material, and wherein the openings are pores of the porous material.

16. The lithographic apparatus of any of clauses 13 to 15, wherein the cooling element further comprises at least one shutter which is moveable from a retracted position to a deployed position, and wherein moving the shutter from the retracted position to the deployed position closes some openings in the floor of the cooling element.

17. The lithographic apparatus of clause 16, wherein the at least one shutter is configured such that no openings are closed by the shutter when the shutter is in the retracted position.

18. The lithographic apparatus of clause 16 or clause 17, wherein the at least one shutter is moveable to an intermediate position which is between the retracted position and the deployed position.

19. The lithographic apparatus of any of clauses 13 to 15, wherein the cooling element comprises additional chambers provided either side of the chamber, the additional chambers being connected to a different gas delivery conduit or conduits.

20. The lithographic apparatus of clause 19, further comprising a valve configured to control delivery of gas to the chamber, and one or more valves configured to separately control delivery of gas to the additional chambers.

21. The lithographic apparatus of any of clauses 13 to 20, wherein the body of the cooling element has a thickness of 3 mm or less.

22. The lithographic apparatus of any of clauses 13 to 21, wherein the body of the cooling element is located 3 mm or less from an edge of the exposure area.

23. The lithographic apparatus of any of clauses 13 to 21, wherein the body of the cooling element has a lowermost surface which measures less than 5 mm in a scanning direction of the lithographic apparatus.

24. The lithographic apparatus of any of clauses 13 to 23, wherein the body of the cooling element has a sloping inner surface which faces towards the radiation beam.

25. The lithographic apparatus of any preceding clause, wherein the cooling element includes a heat removal system configured to remove heat from the cooling element.

26. The lithographic apparatus of clause 25, wherein the heat removal system is a fluid cooling system.

27. The lithographic apparatus of clause 25 or clause 26, wherein the heat removal system includes a Peltier cooler.

28. The lithographic apparatus of claim 26, wherein the fluid cooling system comprises a cooler configured to cool gas, the cooler being located remotely from the cooling element, an inlet conduit configured to deliver the cooled gas to the cooling element in order to cool the cooling element, and an outlet conduit configured to remove the gas from the cooling element.

29. The lithographic apparatus of clause 28, wherein the inlet conduit and the outlet conduit both include a flexible portion which accommodates movement of the cooling element.

30. The lithographic apparatus of clause 28 or clause 29, wherein a temperature sensor is provided on the inlet conduit and a temperature sensor is provided on the outlet conduit.

31. The lithographic apparatus of any of clauses 28 to 30, further comprising a gas source configured to provide the gas at a rate of more than 10 l/min.

32. The lithographic apparatus of any of clauses 28 to 30, further comprising a gas source configured to provide the gas at a rate of less than 2 l/min.

33. The lithographic apparatus of claim 25, wherein the heat removal system comprises a heat pipe connected to a cooler.

34. The lithographic apparatus of clause 33, wherein the heat pipe has a cross-sectional shape which is larger in a horizontal direction than in the vertical direction.

35. The lithographic apparatus of clause 33 or clause 34, wherein the heat pipe includes a flexible portion which accommodates movement of the cooling element.

36. The lithographic apparatus of any of clauses 33 to 35, wherein the heat pipe is a micro heat pipe.

37. The lithographic apparatus of claim 26, wherein the fluid cooling system is a two-phase cooling system which comprises a pump, a condenser and an accumulator.

38. The lithographic apparatus of clause 37, wherein the two-phase cooling system further comprises a temperature sensor provided on the cooling element.

39. The lithographic apparatus of claim 26, wherein the fluid cooling system includes a constriction provided in a heat exchanger, the constriction being configured to cool gas which is used to cool the cooling element.

40. The lithographic apparatus of any preceding clause, wherein the cooling element is provided with a heater.

41. The lithographic apparatus of any of clauses 6 to 40, wherein the lithographic apparatus further comprises a gas supply configured to deliver gas to the cooling element at a pressure of 200 Pascals or more.

42. The lithographic apparatus of any of clauses 6 to 41, wherein the cooling element is configured to have a separation of 20 microns or more from the substrate during use.

43. The lithographic apparatus of any of clauses 6 to 42, wherein the cooling element is configured to have a separation of 200 microns or less from the substrate during use.

44. The lithographic apparatus of any of clauses 6 to 43, wherein the cooling element is configured to provide an outward flow of gas from underneath the cooling element that acts as a cushion which prevents or inhibits contact occurring between the cooling element and the substrate.

45. The lithographic apparatus of any of clauses 6 to 44, wherein the cooling element is provided on a support which includes a retraction mechanism which is configured to pull the cooling element away from the substrate if unexpected movements are detected.

46. The lithographic apparatus of any of clauses 1 to 5, wherein the cooling element comprises an array of nozzles arranged to direct droplets of liquid onto the substrate.

47. The lithographic apparatus of clause 46, wherein the cooling element is configured to have a separation of 50 microns or more from the substrate during use.

48. The lithographic apparatus of clause 46 or clause 47, wherein the cooling element is configured to have a separation of 1 millimeter or more from the substrate during use.

49. The lithographic apparatus of any of clauses 46 to 48, wherein the extent of the array of nozzles of the cooling element in a non-scanning direction of the lithographic apparatus is equal to or greater than the maximum exposure area length of the lithographic apparatus in the non-scanning direction.

50. The lithographic apparatus of any of clauses 46 to 49, wherein the array of nozzles is a two dimensional array in which the nozzles are evenly distributed across a bottom surface of the cooling element.

51. The lithographic apparatus of any of clauses 46 to 50, wherein the nozzles are configured to provide liquid droplets with a diameter of the order of tens of microns or less.

52. A lithographic method comprising projecting a patterned radiation beam to form an exposure area on a substrate held on a substrate table, and using a cooling apparatus to cool the substrate, the cooling apparatus comprising a cooling element located above the substrate table and adjacent to the exposure area, the cooling element acting to remove heat from the substrate.

53. The lithographic method of clause 52, wherein the cooling element is configured to cool an area which lies within 3 cm or less from a line which bisects the exposure area.

54. The lithographic method of clause 52 or clause 53, wherein the cooling element is configured to cool an area which lies within 2 cm or less from an edge of the exposure area.

55. The lithographic method of any of clauses 52 to 54, wherein the cooling element comprises: a body; an open cavity provided in a lowermost face of the body, the open cavity and the upper surface of the substrate forming a volume; and a gas delivery conduit configured to deliver gas to the volume.

56. The lithographic method of clause 55, wherein the cavity has a roof which is less than 1 mm from the upper surface of the substrate.

57. The lithographic method of any of clauses 52 to 54, wherein the cooling element comprises a body containing a chamber connected to a gas delivery conduit, a floor of the chamber being provided with one or more openings.

58. The lithographic method of any of clauses 55 to 57, wherein the gas is delivered to the volume at a pressure of 200 Pascals or more.

59. The lithographic method of any of clauses 55 to 58, wherein the cooling element is separated from the substrate by 20 microns or more.

60. The lithographic method of any of clauses 55 to 59, wherein the cooling element is separated from the substrate by 200 microns or less.

61. The lithographic method of any of clauses 52 to 54, wherein the cooling element comprises an array of nozzles which direct droplets of liquid onto the substrate.

62. The lithographic method of clause 60, wherein the cooling element is separated from the substrate by 50 microns or more.

63. The lithographic method of clause 60 or clause 61, wherein the cooling element is separated from the substrate by 1 mm or more.

64. The lithographic method of any of clauses 61 to 63, wherein the extent of the array of nozzles of the cooling element in a non-scanning direction of the lithographic apparatus is equal to or greater than the maximum exposure area length of the lithographic apparatus in the non-scanning direction.

65. The lithographic method of any of clauses 61 to 64, wherein the array of nozzles is arranged to provide an even distribution of liquid droplets on the substrate.

66. The lithographic method of any of clauses 61 to 65 wherein the liquid is water.

67. A lithographic apparatus comprising a projection system configured to project a patterned radiation beam onto a substrate held on a substrate table, the lithographic apparatus further comprising a substrate temperature adjustment unit configured to adjust the temperature of the substrate to a temperature above the temperature of the substrate table before the substrate is placed on the substrate table.

68. The lithographic apparatus of clause 67, wherein the substrate temperature adjustment unit is configured to adjust the temperature of the substrate to a temperature which is up to around 0.5° C. above the temperature of the substrate table.

69. A method of conditioning a substrate prior to exposure of that substrate in a lithographic apparatus, the method comprising:
using a temperature adjustment unit to adjust the temperature of the substrate to a temperature which is above the temperature of a substrate table of the lithographic apparatus;
transferring the substrate to the substrate table and activating a clamp which clamps the substrate to the substrate table;
cooling the substrate to the temperature of the substrate table and thereby inducing a stress into the substrate.

70. A scanning lithographic apparatus comprising a projection system configured to project a patterned radiation beam to form an exposure area on a substrate held on a substrate table, the lithographic apparatus further comprising a heating apparatus for heating the substrate, wherein the heating apparatus comprises:
first and second heating elements configured to heat substrate areas located at opposite ends of the exposure area in a non-scanning direction of the lithographic apparatus.

71. The scanning lithographic apparatus of clause 70, wherein the first and second heating elements are located above the substrate table and located at opposite ends of the exposure area in a non-scanning direction of the lithographic apparatus.

72. The scanning lithographic apparatus of clause 71, wherein the first and second heating elements are adjacent to the exposure area in the non-scanning direction.

73. The scanning lithographic apparatus of any of clauses 70 to 72, wherein the first and second heating elements are configured to emit heat with some outward divergence such that areas which receive heat extend beyond the footprints of the heating elements.

74. The scanning lithographic apparatus of any of clauses 70 to 73, wherein the heating elements comprise arrays of LEDs.

75. The scanning lithographic apparatus of clause 74, wherein the LEDs are configured to emit infrared radiation.

76. The scanning lithographic apparatus of clause 74 or clause 75, wherein at least some of the LEDs are configured to emit radiation beams which diverge such that they overlap with the patterned radiation beam before they are incident upon the substrate.

77. The scanning lithographic apparatus of clause 70, wherein the first and second heating elements comprise one or more lasers configured to provide laser beams which heat the substrate areas located at opposite ends of the exposure area in the non-scanning direction of the lithographic apparatus.

78. The scanning lithographic apparatus of clause 77, wherein the one or more lasers and associated optics are configured such that the laser beams pass out of an opening located in a floor of a projection system housing of the lithographic apparatus before being incident upon the substrate.

79. The scanning lithographic apparatus of clause 77 or clause 78, wherein the one or more lasers are located outside of a projection system housing of the lithographic apparatus.

80. The scanning lithographic apparatus of clause 79, wherein projection system housing is provided with a window which allows the laser beams to pass into the projection system housing.

81. The scanning lithographic apparatus of any of clauses 77 to 80, further comprising mirrors mounted on actuators within the projection system housing, the mirrors being operable to change the directions of the laser beams and thereby move the substrate areas which are heated by the laser beams to different positions.

82. The scanning lithographic apparatus of any of clauses 70 to 81, wherein the first and second heating elements are configured to heat areas which overlap in the non-scanning direction with the exposure area.

83. The scanning lithographic apparatus of any of clauses 70 to 82, wherein the first and second heating elements are configured to heat areas which have a size in the scanning direction that generally corresponds with the size in the scanning direction of the exposure area.

84. The scanning lithographic apparatus of any of clauses 70 to 83, wherein the first and second heating elements are each configured to heat areas which have a size in the non-scanning direction that is less than the size in non-scanning direction of the exposure area.

85. The scanning lithographic apparatus of any of clause 84, wherein the first and second heating elements are configured to heat areas which have a size in the non-scanning direction that is less than half the size in non-scanning direction of the exposure area.

86. The scanning lithographic apparatus of any of clauses 70 to 85, wherein the scanning lithographic apparatus further comprises a cooling element located above the substrate table and located at one side of the exposure area in a scanning direction of the lithographic apparatus.

87. The scanning lithographic apparatus of clause 86, wherein the scanning lithographic apparatus further comprises an additional cooling element located above the substrate table and located at an opposite side of the exposure area in a scanning direction of the lithographic apparatus.

88. A method of exposing a substrate using a scanning lithographic apparatus, the method comprising:
projecting a patterned radiation beam to form an exposure area on a substrate held on a substrate table;
using a heating apparatus to heat areas on the substrate which are located at opposite ends of the exposure area in a non-scanning direction of the lithographic apparatus; and
moving the substrate relative to the exposure area and heated areas in a scanning movement in order to expose a target portion of the substrate using the patterned radiation beam.

89. The method of clause 88, wherein the next target portion which is exposed is not adjacent to the exposed target portion in the non-scanning direction, but instead is separated from the exposed target portion in the non-scanning direction by at least one interposed target portion.

90. The method of clause 88 or clause 89, wherein the method further comprises using a cooling apparatus to cool an area on the substrate which is located adjacent to at least one side of the exposure area in a scanning direction of the lithographic apparatus.

91. The lithographic apparatus of any clauses 1 to 51, wherein the cooling element comprises a first part arranged to be cooled to a first temperature selected to remove heat from the substrate and a second part arranged to operate at a higher temperature than the first part.

92. The lithographic apparatus of clause 91, wherein the second part is arranged to operate at an ambient temperature.

93. The lithographic apparatus of clause 91 or clause 92, wherein the second part is provided with actuators to increase and decrease a distance of the first part from the substrate so as to adjust a heat transfer coefficient of the cooling element.

94. The lithographic apparatus of any of clauses 91 to 93, wherein the first part is constructed from a ceramics material.

95. The lithographic apparatus of any of clauses 91 to 94, wherein the first part is formed from a plurality of layers.

96. The lithographic apparatus of any of clauses 91 to 95, wherein the first part comprises a plate having a slit through which the radiation beam passes.

97. The lithographic apparatus of any of clauses 1 to 51 or any one of clauses 91 to 96, further comprising a thermal shield located between a first portion of the cooling element and the substrate, so as to reduce an amount of heat that is removed from the substrate by the first portion.

98. The lithographic apparatus of clause 97, wherein the cooling element defines a cooling slit for receiving the radiation beam and the first portion surrounds the cooling slit.

99. The lithographic apparatus of clause 97 or 98, wherein the thermal shield comprises a temperature control mechanism.

100. The lithographic apparatus of any of clauses 97 to 99, wherein the temperature control mechanism comprises at least one of a fluid cooling and/or heating system, heating elements and temperature sensors.

101. The lithographic apparatus of any of clauses 97 to 100, wherein the lithographic apparatus further comprises a second thermal shield located such that the cooling element is between the second thermal shield and the substrate.

102. The lithographic apparatus of any of clauses 13 or 57 or any clause dependent thereon, wherein the floor comprises one or more temperature sensors arranged to determine a temperature of the floor.

103. The lithographic apparatus of clause 102, wherein the one or more temperature sensors comprise a resistance thermometer.

104. The lithographic apparatus of clause 102 or 103, wherein the one or more temperature sensors comprise a first temperature sensor for measuring a temperature at a first distance from the substrate and a second temperature sensor for measuring the temperature at a second distance from the substrate.

105. The lithographic apparatus of any one of clauses 102 to 104, wherein at least one of the one or more temperature sensors is suspended from the cooling element by a thermally isolating structure.

106. The lithographic apparatus of any of clauses 1 to 51 or any of clauses 91 to 105, further comprising:
a gas delivery conduit to deliver a gas to the cooling element for delivery from the cooling element to the substrate;
a valve for selectively restricting gas flow within the gas delivery conduit, the valve comprising a housing portion and a sliding member, the valve defining a conduit between a fluid ingress connected to the gas delivery conduit and a fluid egress;
wherein the sliding member is slidable between a first position in which the conduit is unrestricted and a second position in which the conduit is partially restricted; and
wherein the sliding member does not physically contact the housing.

107. The lithographic apparatus of any of clauses 1 to 51 or any of clauses 91 to 106, wherein a cooling surface of the cooling element comprises a non-flat, three dimensional structure.

108. The lithographic apparatus of any of clauses 1 to 51 or any of clauses 91 to 107, wherein a cooling body is bendable so as to control cooling provided by a gas present between the cooling element and the substrate.

109. The lithographic apparatus of clause 108, wherein the cooling body comprises one or more piezo-actuators arranged to bend the cooling body.

110. The lithographic apparatus of clause 108 or 109, wherein the cooling body is arranged to be bent such that more cooling is provided at edges of an exposure area than at a centre of the exposure area.

111. The lithographic apparatus of any one of clauses 108 to 110, wherein the cooling body is arranged to be bent so as to have a parabolic cooling profile.

112. The lithographic apparatus of any one of clauses 1 to 51, 67 to 68, 70 to 87 or 91 to 111, further comprising an optical sensor apparatus, the optical sensor apparatus comprising:
    an optical sensor; and
    a heater arranged to heat the optical sensor apparatus.

113. The lithographic apparatus of clause 112, wherein the optical sensor apparatus further comprises a temperature sensor arranged to determine a temperature of the optical sensor.

114. The lithographic apparatus of clause 112 or 113, wherein the optical sensor apparatus is provided on the substrate table.

115. The lithographic apparatus of any one of clauses 112 to 114, wherein the optical sensor apparatus forms part of an alignment sensor of the lithographic apparatus.

116. The method of any one of clauses 52 to 66, further comprising heating an optical sensor provided on the substrate table to counteract an effect of the cooling apparatus on the optical sensor.

117. The lithographic apparatus of any of clauses 1-51, 67-68 or 91-116, further comprising a remote temperature sensing system, wherein the remote temperature sensing system comprises a photodetector configured to detect thermal radiation emitted from a target area of the substrate.

118. The lithographic apparatus of clause 117, wherein the remote temperature sensing system further comprises shielding, the shielding being arranged with respect to the photodetector and the target area such that substantially all radiation that enters the photodetector has travelled from the target area.

119. The lithographic apparatus of clause 117 or clause 118, wherein the remote temperature sensing system further comprises a control surface, the control surface having a known temperature and being arranged with respect to the target area such that substantially all radiation reflecting from the target area toward the photodetector originates from the control surface.

120. The lithographic apparatus of any of clauses 117 to 119, wherein the photodetector is an upconversion photodetector.

121. The lithographic apparatus of any of clauses 117 to 120, wherein the photodetector is configured to detect radiation having a wavelength in the range of about 2 µm to about 5 µm.

122. The lithographic apparatus of any of clauses 117 to 121, wherein the photodetector is located on the projection system.

123. The lithographic apparatus of any of clauses 117 to 121, wherein the photodetector is located on the cooling apparatus.

124. The lithographic apparatus of any of clauses 117 to 123, wherein the photodetector comprises multiple pixels, different pixels being configured to detect radiation emitted from different parts of the target area.

125. The lithographic apparatus of any of clause 124, wherein the photodetector is arranged with respect to the target area such that a first group of pixels receives radiation emitted by a heated area of the substrate, a second group of pixels receives radiation emitted by a cooled area of the substrate and a third group of pixels receives radiation emitted by an ambient area of the substrate.

126. The lithographic apparatus of any of clauses 117 to 125, wherein the remote temperature sensing system comprises two or more photodetectors.

127. The lithographic apparatus of any of clauses 117 to 126, wherein a sample-rate of the photodetector is in the range of about 1 Hz to about 10 Hz.

128. The lithographic apparatus of any of clauses 118 to 127, wherein the shielding comprises an elongate hollow tube.

129. The lithographic apparatus of any of clauses 118 to 127, wherein the shielding comprises a plate having an aperture.

130. The lithographic apparatus of any of clauses 119 to 129, wherein the control surface comprises a cooling system configured to cool the control surface.

131. The lithographic apparatus of any of clauses 119 to 130, wherein the control surface has an emissivity of less than about 0.2.

132. The lithographic apparatus of any of clauses 117 to 131, wherein the remote temperature sensing system forms part of a control loop configured to control the cooling apparatus.

133. The method of any one of clauses 52-66 or 116, further comprising remotely measuring a temperature of a target area of the substrate and using the temperature measurement to control a cooling of the substrate provided by the cooling apparatus.

134. The method of clause 133, wherein the remote measuring comprises detecting thermal radiation emitted by the target area.

135. The method of any one of clause 134, wherein the detecting comprises upconverting the thermal radiation to radiation having a shorter wavelength than the thermal radiation and detecting the upconverted radiation.

136. The method of any of clauses 133 to 135, further comprising measuring the temperature of different target areas of the substrate and comparing the measurements to determine the relative temperatures of the target areas of the substrate.

137. The method of any one of clause 136, wherein the different target areas cover corresponding areas within different target portions of the substrate.

138. The method of any of clauses 134 to 135, further comprising determining emission properties of the target area.

139. The method of clause 138, wherein the emission properties are determined using Fourier Transform Infrared Spectroscopy.

140. The method of clause 138 or clause 139, further comprising using the determined emission properties of the target area and the measured thermal radiation emitted by the target area to determine an absolute temperature of the target area.

141. The method of any one of clauses 133 to 140, wherein the temperature of the target area is measured during projection of the patterned radiation beam.

142. The method of any one of clauses 133 to 140, further comprising measuring the temperature of the target area before projecting the patterned radiation beam and measuring the temperature of the target area after projecting the patterned radiation beam and comparing the results of the temperature measurements to control a cooling provided to the substrate.

143. A substrate table for a lithographic apparatus, the substrate table being provided with a thermal sensor comprising a semiconductor plate having an unsupported central portion, a temperature sensor being located on a lowermost surface of the semiconductor plate.

144. The substrate table of clause 143, wherein the semiconductor plate is held around its periphery by a support.

145. The substrate table of clause 143 or clause 144, wherein the semiconductor plate has a thickness of 300 microns or less.

146. The substrate table of any of clauses 143 to 145, wherein the semiconductor plate is a silicon plate.

147. The substrate table of any of clauses 143 to 146, wherein the temperature sensor is one of an array of temperature sensors located on the lowermost surface of the semiconductor plate.

148. The substrate table of clause 147, wherein the array of temperature sensors is a line of temperature sensors.

149. A substrate table comprising a substrate clamp provided with a hole, and a temperature sensor mounted on an arm which extends through the hole, wherein the substrate table further comprises an actuator configured to lengthen and shorten the arm such that in use the temperature sensor may be moved towards and away from a substrate held on the substrate table.

150. The substrate table of clause 149, wherein the arm is formed from a thermally insulating material.

151. A method of measuring a temperature offset using a substrate table comprising a substrate clamp provided with a hole, and a temperature sensor mounted on an arm which extends through the hole, the substrate table further comprises an actuator configured to lengthen and shorten the arm, wherein the method comprises receiving an output from the temperature sensor when no substrate is present on the substrate table, loading a substrate onto the substrate table, lengthening the arm to bring the temperature sensor into contact with the substrate, then receiving an output from the temperature sensor, and determining whether the output from the temperature sensor has changed.

152. The method of clause 151, wherein the method further comprises using the change of output from the temperature sensor to determine a temperature offset between the temperature of the substrate table and the temperature of the substrate.

153. The lithographic apparatus of clause 5, wherein the lithographic apparatus is a scanning lithographic apparatus and is configured to form a curved exposure area, and wherein the cooling elements are curved, a first cooling element having a concave leading edge, the first cooling element comprising an inner chamber configured to deliver cooling gas and outer chambers configured to deliver cooling gas, wherein the outer chambers are positioned either side of the inner chamber.

154. The lithographic apparatus of clause 153, further comprising valves configured to independently control delivery of cooling gas to the inner chamber and delivery of cooling gas to the outer chambers.

155. The lithographic apparatus of clause 154 or clause 155, wherein the second cooling element has a convex leading edge.

156. The lithographic apparatus of clause 155, wherein the second cooling chamber comprises a single chamber configured to deliver cooling gas.

157. A method of exposing a substrate using a scanning lithographic apparatus, the method comprising:
projecting a patterned radiation beam to form a curved exposure area on a substrate held on a substrate table; and
using a cooling apparatus comprising first and second cooling elements to cool curved areas on the substrate which are located either side of the exposure area;
wherein the first cooling element has a concave leading edge and comprises an inner chamber configured to deliver cooling gas and outer chambers configured to deliver cooling gas, the outer chambers being positioned either side of the inner chamber; and wherein
the method further comprises providing cooling gas to the outer chambers before cooling gas is provided to the inner chamber and/or providing stronger cooling from the outer chambers than is provided from the inner chamber.

158. The lithographic apparatus of clause 5, wherein the cooling elements are curved and the lithographic apparatus is a scanning lithographic apparatus configured to form a curved exposure area, wherein a cooling element of the cooling apparatus has a curve which is generally a reflection of the curved exposure area about an axis which extends transverse to the scanning direction.

159. The lithographic apparatus of clause 158, wherein another cooling element of the cooling apparatus has a curve which generally corresponds with the curved exposure area.

160. A method of exposing a substrate using a scanning lithographic apparatus, the method comprising:
projecting a patterned radiation beam to form a curved exposure area on a substrate held on a substrate table; and
using a cooling apparatus comprising cooling elements to cool curved areas on the substrate which are located either side of the exposure area;
wherein a cooling element of the cooling apparatus has a curve which is generally a reflection of the curved exposure area about an axis which extends transverse to the scanning direction; and wherein
the method further comprises, when that cooling element is leading the exposure area, postponing delivery of cooling gas to the cooling element until after a central point of a leading edge of the cooling element has passed over a start of a target area of the substrate.

161. The lithographic apparatus of clause 5, wherein the lithographic apparatus is a scanning lithographic apparatus and is configured to form a curved exposure area, and wherein a cooling element of the cooling apparatus has a floor member which is curved transverse to the scanning direction such that in use outer ends of the floor member are closer to the substrate W than a central portion of the floor member.

162. The lithographic apparatus of clause 161, wherein piezo-actuators are provided at ends of the floor member.

163. The lithographic apparatus of clause 5, wherein the lithographic apparatus is a scanning lithographic apparatus and is configured to form a curved exposure area, and wherein a cooling element of the cooling apparatus has a floor which is provided with a density of openings which varies along a direction transverse to the scanning direction, a higher density of openings being provided at outer ends of the floor than in a central portion of the floor.

The invention claimed is:

1. A lithographic apparatus, comprising:
a projection system configured to project a patterned radiation beam to form an exposure area on a substrate held on a substrate table, the lithographic apparatus further comprising a cooling apparatus to cool the substrate,
wherein the cooling apparatus comprises a cooling element located above the substrate table and adjacent to the exposure area, the cooling element being configured to remove heat from a substrate held on the substrate table;
wherein the cooling element comprises a body containing a chamber connected to a gas delivery conduit, a floor of the chamber being disposed adjacent the substrate table and being provided with openings.

2. The lithographic apparatus of claim 1, wherein the cooling element is configured to cool an area that lies within 3 cm or less from a line that bisects the exposure area.

3. The lithographic apparatus of claim 1, wherein the cooling element is configured to cool an area that lies within 2 cm or less from an edge of the exposure area.

4. The lithographic apparatus of claim 1, wherein the cooling element is separated from the exposure area in a direction that substantially corresponds with a scanning direction of the lithographic apparatus.

5. The lithographic apparatus of claim 4, wherein the cooling element is one of a pair of cooling elements provided at either side of the exposure area.

6. The lithographic apparatus of claim 1, wherein the cooling element comprises, an open cavity being provided in a lowermost face of the body, with respect to the substrate table, and further comprises a gas delivery conduit configured to deliver gas to the cavity.

7. The lithographic apparatus of claim 6, wherein the cavity is configured to form, together with an upper surface of the substrate, a volume that receives gas delivered by the gas delivery conduit.

8. The lithographic apparatus of claim 6, wherein the cavity has a roof that is less than 1 mm from the upper surface of the substrate.

9. The lithographic apparatus of claim 8, wherein a combination of a pressure of the gas delivered to the cavity and the separation between the cavity roof and the substrate surface is such that the accommodation coefficient of the substrate does not have a significant effect upon transfer of heat from the substrate to the cooling element body.

10. The lithographic apparatus of claim 1, wherein the openings in the floor of the chamber comprises a row of holes or an array of holes.

11. The lithographic apparatus of claim 1, wherein the cooling element comprises a first part arranged to be cooled to a first temperature selected to remove heat from the substrate and a second part arranged to operate at a higher temperature than the first part.

12. The lithographic apparatus of claim 1, further comprising a thermal shield located between a first portion of the cooling element and the substrate, so as to reduce an amount of heat that is removed from the substrate by the first portion.

13. The lithographic apparatus of claim 1, further comprising:
a gas delivery conduit to deliver a gas to the cooling element for delivery from the cooling element to the substrate;
a valve for selectively restricting gas flow within the gas delivery conduit, the valve comprising a housing portion and a sliding member, the valve defining a conduit between a fluid ingress connected to the gas delivery conduit and a fluid egress;
wherein the sliding member is slidable between a first position in that the conduit is unrestricted and a second position in that the conduit is partially restricted; and
wherein the sliding member does not physically contact the housing.

14. The lithographic apparatus of claim 1, wherein a cooling surface of the cooling element comprises a non-flat, three-dimensional structure.

15. The lithographic apparatus of claim 1, wherein a cooling body is bendable so as to control cooling provided by a gas present between the cooling element and the substrate.

16. The lithographic apparatus of claim 1, further comprising an optical sensor apparatus comprising an optical sensor and a heater arranged to heat the optical sensor apparatus.

17. The lithographic apparatus of claim 1, further comprising a remote temperature sensing system, wherein the remote temperature sensing system comprises a photodetector configured to detect thermal radiation emitted from a target area of the substrate.

18. The lithographic apparatus of claim 5, wherein the lithographic apparatus is a scanning lithographic apparatus and is configured to form a curved exposure area, and wherein the cooling elements are curved, a first cooling element having a concave leading edge, the first cooling element comprising an inner chamber configured to deliver cooling gas and outer chambers configured to deliver cooling gas, wherein the outer chambers are positioned either side of the inner chamber.

19. The lithographic apparatus of claim 5, wherein the cooling elements are curved and the lithographic apparatus is a scanning lithographic apparatus configured to form a curved exposure area, wherein a cooling element of the cooling apparatus has a curve that is generally a reflection of the curved exposure area about an axis that extends transverse to the scanning direction.

20. The lithographic apparatus of claim 1, wherein the lithographic apparatus is a scanning lithographic apparatus and is configured to form a curved exposure area, and wherein a cooling element of the cooling apparatus has a floor member that is curved transverse to a scanning direction such that in use outer ends of the floor member are closer to the substrate W than a central portion of the floor member.

21. The lithographic apparatus of claim 1, wherein the lithographic apparatus is a scanning lithographic apparatus and is configured to form a curved exposure area, and wherein a cooling element of the cooling apparatus has a floor that is provided with a density of openings that varies along a direction transverse to a scanning direction, a higher density of openings being provided at outer ends of the floor than in a central portion of the floor.

22. The lithographic apparatus of claim 1, further comprising a substrate temperature adjustment unit configured to adjust the temperature of the substrate to a temperature above the temperature of the substrate table before the substrate is placed on the substrate table.

23. The lithographic apparatus claim 1, further comprising a heating apparatus for heating the substrate, wherein the heating apparatus comprising:
first and second heating elements configured to heat substrate areas located at opposite ends of the exposure area in a non-scanning direction of the lithographic apparatus.

24. The lithographic apparatus of claim 10, wherein the body further includes at least one shutter that is movable to close at least a subset of the holes.

25. The lithographic apparatus of claim 1, wherein the cooling element is in thermal communication with the substrate.

26. A cooling apparatus for cooling a substrate, comprising:
a cooling element configured to remove heat from the substrate held on a substrate table,
wherein the cooling element is located above the substrate table and adjacent to an exposure area of the substrate that receives a patterned radiation beam, and wherein the cooling element comprises a body containing a chamber connected to a gas delivery conduit, a floor of the chamber being disposed adjacent the substrate table and being provided with openings.

* * * * *

UNITED STATES PATENT AND TRADEMARK OFFICE
CERTIFICATE OF CORRECTION

PATENT NO. : 10,747,127 B2
APPLICATION NO. : 16/326948
DATED : August 18, 2020
INVENTOR(S) : Van Der Meulen et al.

Page 1 of 1

It is certified that error appears in the above-identified patent and that said Letters Patent is hereby corrected as shown below:

On the Title Page

Item (56), please replace "Nampa" with – Namba –.

In the Specification

In Column 85, Line 15, please replace "comprises, an open cavity" with – comprises an open cavity –.

In Column 85, Line 34, please replace "openings in the floor of the chamber comprises" with – openings in the floor of the chamber comprise –.

In the Claims

In Column 86, Lines 18-19, please replace "are positioned either side" with – are positioned on either side –.

In Column 86, Line 50, please replace "heating apparatus comprising" with – heating apparatus comprises –.

Signed and Sealed this
Twenty-seventh Day of October, 2020

Andrei Iancu
*Director of the United States Patent and Trademark Office*